(12) United States Patent
Zhu et al.

(10) Patent No.: US 10,321,594 B2
(45) Date of Patent: Jun. 11, 2019

(54) ELECTRIC PROTECTIVE COVER AND RECEPTACLE

(71) Applicant: TYCO ELECTRONICS (SHANGHAI) CO. LTD., Shanghai (CN)

(72) Inventors: Fangyue Zhu, Shanghai (CN); Haomai Yin, Shanghai (CN)

(73) Assignee: TYCO ELECTRONICS (SHANGHAI) CO. LTD., Shanghai (CN)

( * ) Notice: Subject to any disclaimer, the term of this patent is extended or adjusted under 35 U.S.C. 154(b) by 0 days.

(21) Appl. No.: 15/978,776

(22) Filed: May 14, 2018

(65) Prior Publication Data

US 2018/0332726 A1 Nov. 15, 2018

(30) Foreign Application Priority Data

May 12, 2017 (CN) .......................... 2017 1 0335525

(51) Int. Cl.
*H05K 5/00* (2006.01)
*H05K 5/03* (2006.01)
(Continued)

(52) U.S. Cl.
CPC ........... *H05K 5/03* (2013.01); *H01R 12/7047* (2013.01); *H01R 12/716* (2013.01); *H01R 13/111* (2013.01); *H01R 13/4223* (2013.01); *H01R 13/447* (2013.01); *H01R 13/5202* (2013.01); *H01R 13/5213* (2013.01); *H01R 13/5227* (2013.01); *H01R 13/6658* (2013.01);
(Continued)

(58) Field of Classification Search
CPC .............. H01R 12/7047; H01R 12/716; H01R 13/111; H01R 13/4223; H01R 13/5202; H01R 13/5213; H01R 13/5227; H05K 5/0013; H05K 5/03; H05K 5/0052; H05K 5/0247
USPC .......................................... 361/728–730, 752
See application file for complete search history.

(56) References Cited

U.S. PATENT DOCUMENTS 6,371,768 B1 4/2002 Neblett et al.
6,704,815 B1 * 3/2004 Morikawa ............ H01R 9/2675
700/19

(Continued)

FOREIGN PATENT DOCUMENTS

DE 202008009929 U1 12/2009
DE 102012209907 A1 12/2012
DE 102014111185 A1 2/2016

*Primary Examiner* — Hung S. Bui
(74) *Attorney, Agent, or Firm* — Saxton & Stump, LLC

(57) ABSTRACT

The present disclosure discloses an electric protective cover for a receptacle and a receptacle. The electric protective cover comprises a cover body and a mounting portion. The cover body extends along a radial direction of the receptacle and is configured for covering a circuit board. An accommodating hole enclosed by an accommodating hole wall is disposed on the cover body to accommodate a connecting terminal. The mounting portion is disposed on the cover body to be mounted onto a receptacle housing. The electric protective cover according to the present disclosure may be readily and quickly assembled on the housing by means of the mounting portion and provide protection for the circuit board arranged on the housing and the elements on the circuit board by means of the cover body.

20 Claims, 52 Drawing Sheets

(51) Int. Cl.
        H01R 13/447    (2006.01)
        H01R 13/66     (2006.01)
        H01R 12/70     (2011.01)
        H01R 12/71     (2011.01)
        H01R 13/11     (2006.01)
        H01R 13/422    (2006.01)
        H01R 13/52     (2006.01)
        H05K 5/02      (2006.01)
        B60L 53/16     (2019.01)
(52) U.S. Cl.
        CPC ......... *H05K 5/0013* (2013.01); *H05K 5/0052* (2013.01); *H05K 5/0247* (2013.01); *B60L 53/16* (2019.02); *H01R 2201/26* (2013.01)

(56) References Cited

U.S. PATENT DOCUMENTS

| | | | |
|---|---|---|---|
| 6,883,874 B2 * | 4/2005 | McCurdy, Jr. | B60T 13/665 |
| | | | 303/15 |
| 2013/0201699 A1 * | 8/2013 | Kato | F21V 23/006 |
| | | | 362/382 |
| 2016/0058474 A1 * | 3/2016 | Peterson | A61B 5/14532 |
| | | | 600/347 |

* cited by examiner

ELECTRIC PROTECTIVE COVER AND RECEPTACLE

TECHNICAL FIELD

The present disclosure relates to an electric protective structure, and particularly to an electric protective cover and a receptacle.

BACKGROUND OF THE INVENTION

A receptacle is used for plugging a mating electronic device to implement an electrical connection therebetween. With more and more electric vehicles put into operation, it is necessary to consider how to improve the safety performance of charging the electric vehicles. An electric vehicle usually can be charged by plugging an external charging gun into a charging receptacle. In practice, a receptacle for charging an electric vehicle usually needs to use a circuit board. One question to be considered is how to protect an electronic device such as a circuit board or the like from external damages.

SUMMARY OF THE INVENTION

One of the objectives of the present disclosure is to provide an electric protective cover and a receptacle easy to assemble and capable of providing protection to overcome one or more drawbacks in the prior art.

According to a first aspect of the present disclosure, an electric protective cover for a receptacle is provided. The electric protective cover comprises a cover body and a mounting portion. The cover body extends along a radial direction of the receptacle and is configured for covering a circuit board. An accommodating hole enclosed by an accommodating hole wall is disposed on the cover body to accommodate a connecting terminal. The mounting portion is disposed on the cover body to be mounted onto a receptacle housing.

In some embodiments of the electric protective cover as described above, a wire retaining part is provided on the cover body. The wire retaining part is configured for retaining a wire. In one embodiment of the electric protective cover, the wire retaining part comprises a lead through-hole disposed on the cover body. The lead through-hole is configured for guiding the wire. In another embodiment of the electric protective cover, the wire retaining part comprises a retaining arm disposed on the cover body. The retaining arm is arranged above the lead through-hole and forms an arched shape to guide the wire. In yet another embodiment of the electric protective cover, the wire retaining part comprises a guide groove disposed on the cover body, and the guiding groove is configured for guiding the wire.

In one embodiment of the electric protective cover of the present disclosure, the mounting portion is arranged to protrude relative to the cover body along a mounting direction of the electric protective cover.

In another embodiment of the electric protective cover of the present disclosure, a limiting arm is provided on the cover body. The limiting arm is arranged to be contactable with a seal ring on the housing.

Some alternative embodiments of the electric protective cover of the present disclosure further comprise an isolating wall. The isolating wall protrudes and extends from the cover body along an axial direction of the accommodating hole and is arranged to surround the corresponding connecting terminal. In one embodiment of the electric protective cover, when the electric protective cover covers the circuit board, the isolating wall is at least partially disposed between the corresponding connecting terminal and the circuit board to isolate the corresponding connecting terminal from the circuit board, so as to prevent a current flowing through the connecting terminal from affecting an electronic element on the circuit board.

According a second aspect of the present disclosure, a receptacle is further provided. The receptacle comprises a housing, a circuit board and the electric protective cover as described in any of the above embodiments. The circuit board is disposed on the housing. The mounting portion of the electric protective cover is arranged on the housing. The cover body covers the circuit board.

Some embodiments of the receptacle described above further comprise a seal ring disposed on the housing to seal interstices between the housing and a mating housing. In one embodiment of the receptacle, a limiting arm is provided on the cover body. The limiting arm is arranged to be contactable with the seal ring along a mounting direction of the electric protective cover. In another embodiment of the receptacle, a limiting arm is provided on the cover body. A limiting plate is provided at a bottom end of the limiting arm. The limiting plate is arranged to protrude outwards relative to the limiting arm. The limiting plate is arranged to be contactable with the seal ring along a mounting direction of the electric protective cover. Also, in one embodiment of the receptacle, a boss is protrudingly arranged at a bottom face of the limiting plate. The boss is arranged to be abutable on the seal ring.

In one embodiment of the receptacle of the present disclosure, the mounting portion is a snap-fit joint. A snap-fitting hole or a snap-fitting cavity is disposed on the housing. The snap-fit joint is arranged to be snap-fitted with the snap-fitting hole or the snap-fitting cavity.

In another embodiment of the receptacle of the present disclosure, a support cantilever is provided on the cover body. The support cantilever is arranged to protrude and extend along the mounting direction of the electric protective cover. The mounting portion is provided on a bottom end of the support cantilever.

In yet another embodiment of the receptacle of the present disclosure, the cover body is arranged to be spaced apart from an upper surface of the circuit board.

In some other embodiments of the receptacle of the present disclosure, the accommodating hole is enclosed by a hole wall. An isolating wall is provided on the hole wall. The isolating wall is arranged to protrude along an axial direction of the accommodating hole. The isolating wall is at least partially arranged to face the circuit board along a transverse and/or longitudinal direction of the cover body. Additionally, in one of the embodiments, a lower surface of the circuit board is arranged on the housing. The isolating wall is protrudingly arranged relative to a lower surface of the circuit board along an axial direction of the accommodating hole.

Other embodiments of the receptacle of the present disclosure further comprises a connecting terminal. The connecting terminal is provided on the housing and may extend along a direction opposite to the mounting direction of the electric protective cover into the accommodating hole.

Compared with the prior art, the electric protective cover according to the present disclosure may be readily and quickly assembled on the housing by means of the mounting portion and provide protection for the circuit board arranged on the housing and the elements on the circuit board by means of the cover body. Preferably, the electric protective cover can prevent the seal ring on the housing from falling off by means of the limiting arm to facilitate assembly. Preferably, the electric protective cover can constrain, guide and prevent messy layout of the circuit and occurrence of waggling by means of a wire retaining part such as a through-hole, a guide groove, a limiting arm or the like. Preferably, an isolating wall is provided to protrude from the hole wall of the accommodating hole of the electric protective cover, thereby providing an electromagnetic isolation and avoiding electromagnetic interference generated between the circuit board and the connecting terminal when a relatively large current flows through, and thereby enhancing safety performance.

BRIEF DESCRIPTION OF THE DRAWINGS

FIG. 19 shows that the secondary lock is pre-assembled on the receptacle housing.

FIG. 20 shows that the secondary lock is lock-fitted with a receptacle housing and a connecting terminal final lock.

DETAILED DESCRIPTION OF EMBODIMENTS

Figure 1:
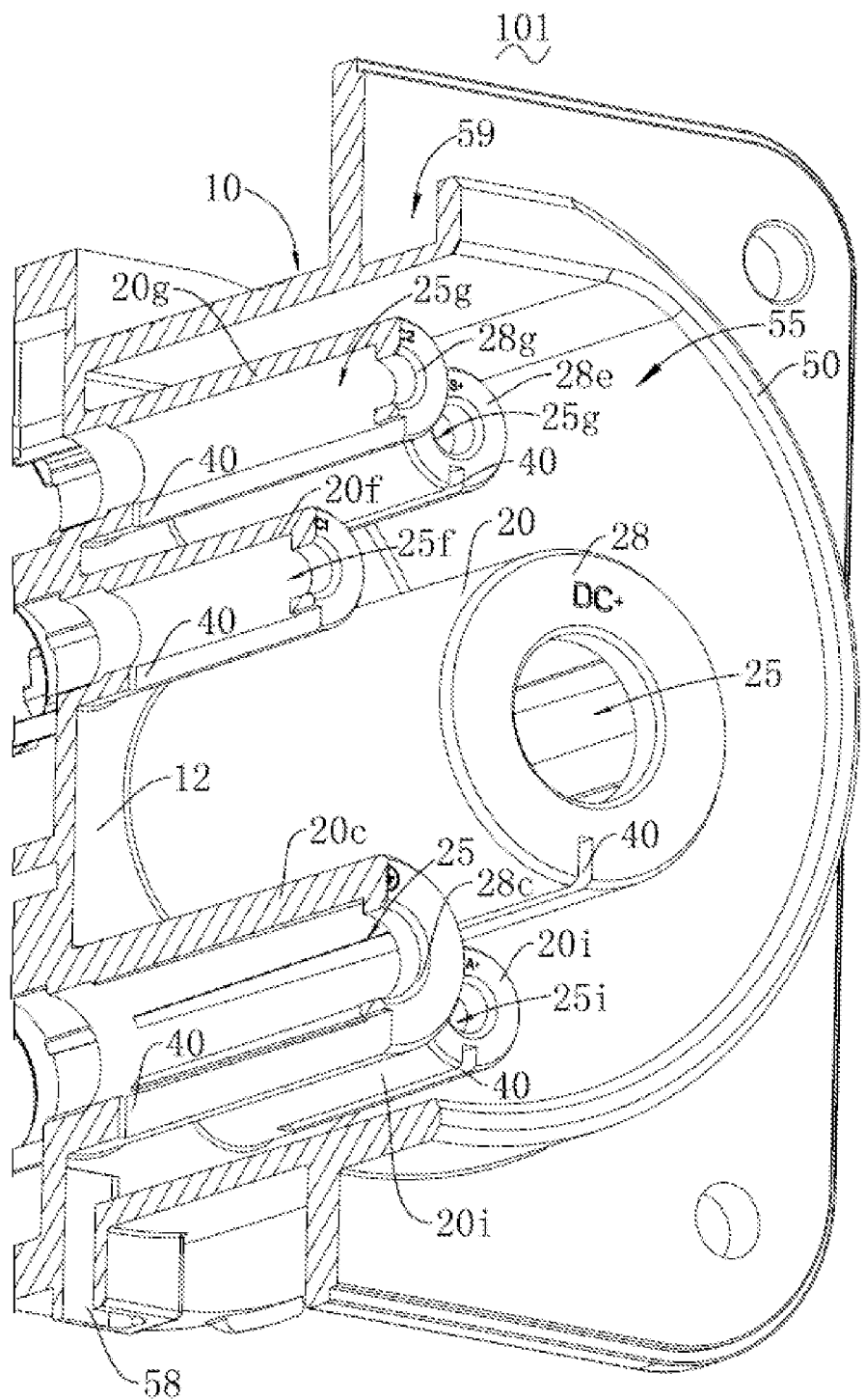
FIG. 1 is a stereoscopic sectional view of a receptacle housing provided according to the present disclosure.
Figure 2:
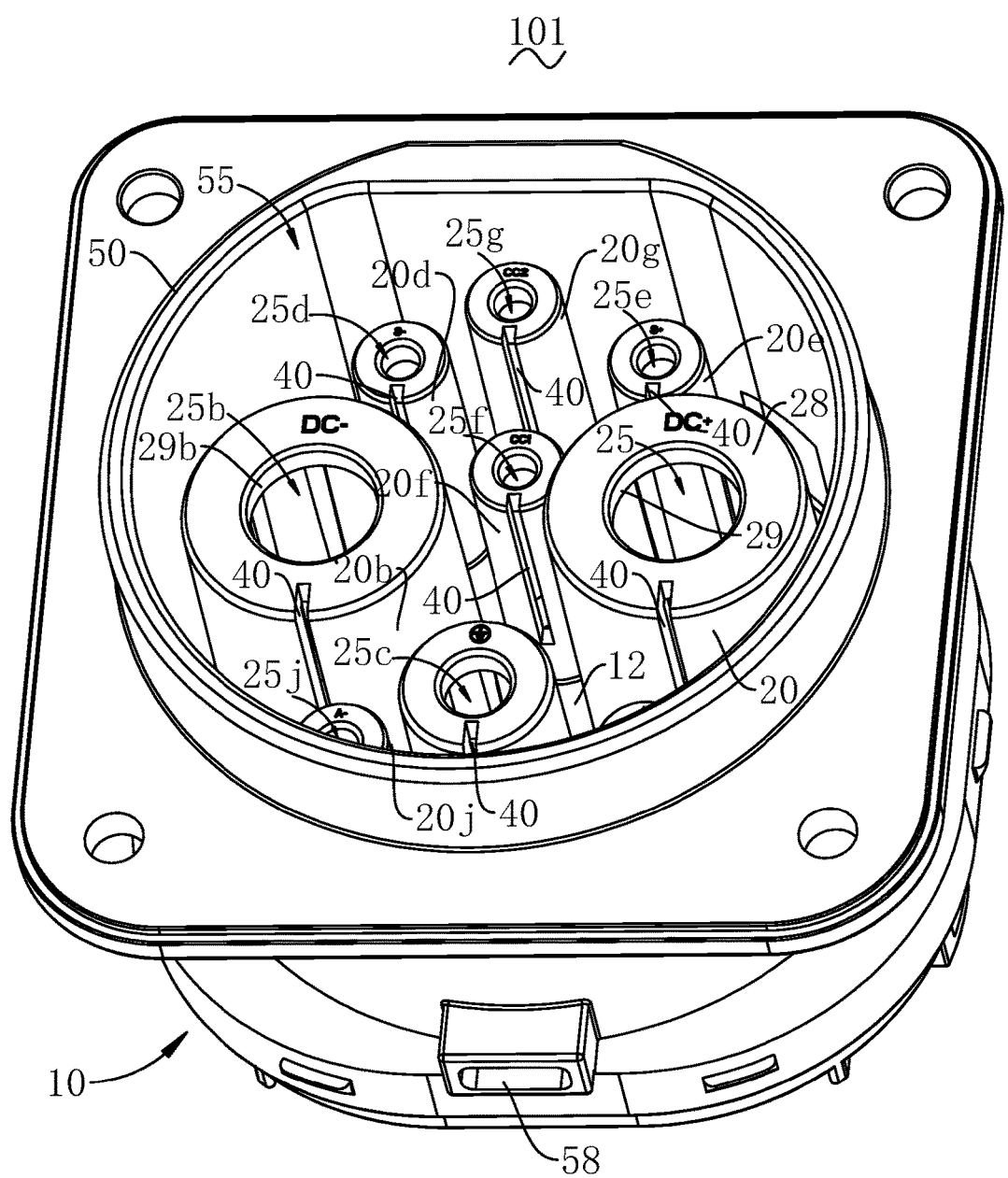
FIG. 2 is a stereoscopic structural schematic view of the receptacle housing of FIG. 1.
Figure 3:
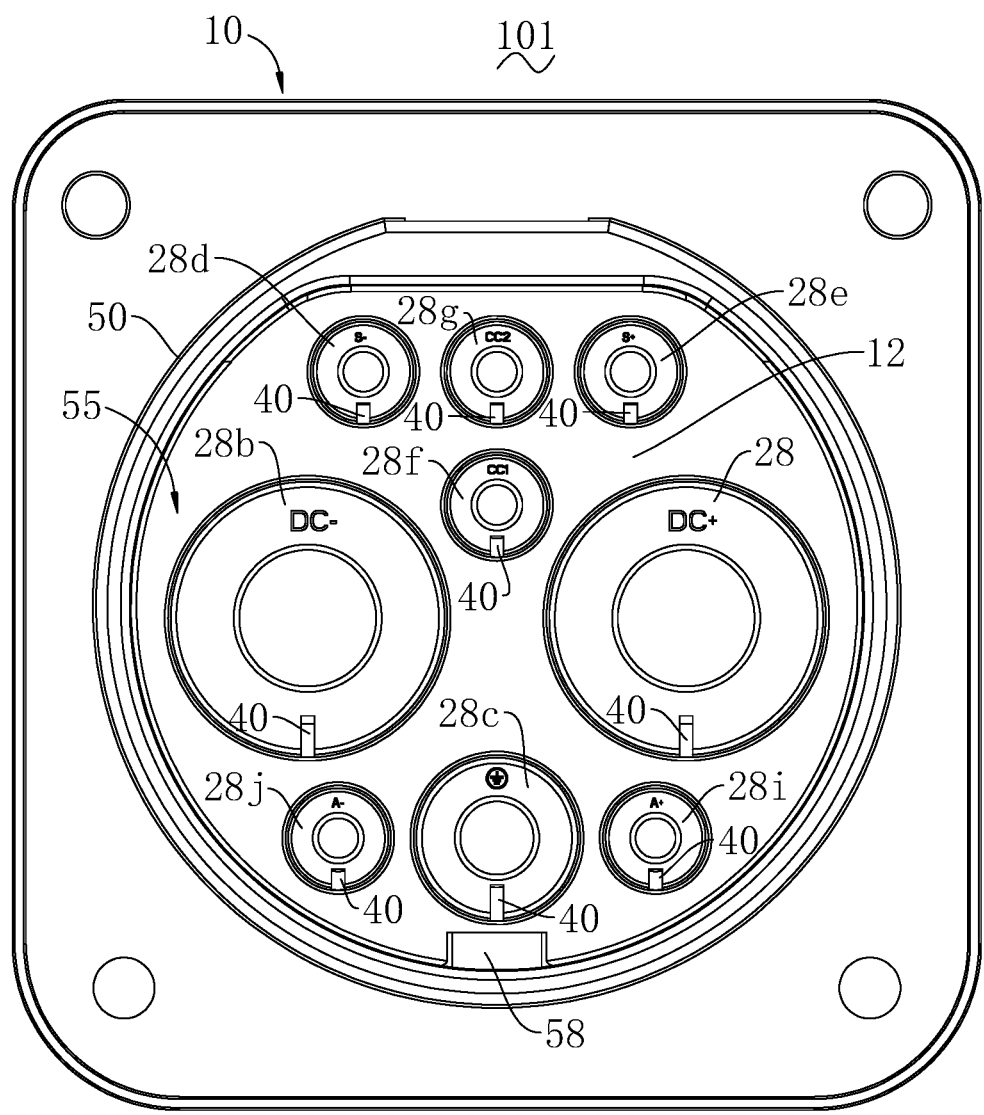
FIG. 3 is a projection diagram of the receptacle housing of FIG. 2 in a direction along which a mating terminal is plug-fitted.

Hereinafter, the present disclosure will be described in detail with reference to the accompanying drawings:

With reference to FIGS. 1 to 3, a receptacle housing 101 provided according to the present disclosure is shown. The receptacle housing 101 comprises a housing body 10 and a hole wall 20 continuously extending along an axial direction of the housing body 10. The hole wall 20 surrounds along a circumferential direction of the housing body 10 to form a mounting hole 25. The mounting hole 25 is configured for mounting a corresponding connecting terminal 80. A water draining through-hole 30 is provided on the hole wall 20.

The housing body 10 is configured for supporting other mechanical structures and bearing corresponding electronic components. The specific shape and configuration of the housing body 10 are only required to satisfy corresponding supporting performance. In this embodiment, the housing body 10 is substantially plate-shaped. Specifically, the housing body 10 has a support face 12. The support face 12 of the housing body 10 is configured for supporting the hole wall 20. To facilitate manufacturing and save space, the support face 12 is planar in this embodiment.

Continuously with reference to FIG. 2, the hole wall 20 is arranged to extend continuously along the axial direction of the housing body 10. The hole wall 20 is arranged on the support face 12. In this embodiment, an outer circumferential face of the hole wall 20 is a cylindrical face. To improve the efficiency of discharging the water drops accumulated within the mounting hole 25 out of the water draining through-hole 30, an inner circumferential face 22 of the hole wall 20 is a cylindrical face. The hole wall 20 encloses a corresponding mounting hole 25. The specific number, distribution, and size specifications of the mounting hole 25 are only required to satisfy the needs of mounting and retaining the connecting terminal 80. In this embodiment, the corresponding 9 mounting holes 25, 25b, 25c, 25d, 25e, 25f, 25g, 25h, 25i, 25j enclosed by the 9 hole walls 20, 20b, 20c, 20d, 20e, 20f, 20h, 20i, 20j are all arranged to extend along an axial direction of the housing body 10 and to be mated with an axially plugged mating terminal, thereby implementing a plugged electrical connection between the mating terminal and the connecting terminal 80. At least some of the mounting holes 25, 25b, 25c, 25d, 25e, 25f, 25g, 25h, 25i, 25j have different axial extension lengths and/or radial sizes. The inner circumferential face of the hole wall 20 is arranged to be a cylindrical face, i.e., a smooth surface, which facilitates water to accumulate and slide into the water draining through-hole 40.

Continuously with reference to FIG. 3, to enhance the performance of the mounting hole 25 to retain the corresponding connecting terminal 80, a free end 20b of the hole wall 20 is provided with a backstop wall 28. The backstop wall 28 is arranged to protrude along a radial direction of the housing body 10. The backstop wall 28 may be axially block-fitted to the connecting terminal 80, thereby preventing the connecting terminal 80 from sliding out of the mounting hole 25. The specific size and configuration of the backstop wall 28 are only required to implement axially blocking the corresponding connecting terminal 80. In this embodiment, to sufficiently guarantee the performance of the backstop wall 28 to retain the connecting terminal 80, the backstop wall 28 extends along the circumferential direction of the housing body 10 to form a closed-ring shape. Correspondingly, the backstop wall 28 is substantially annular plate-shaped. Specifically, 9 backstop wall holes 28, 28b, 28c, 28d, 28e, 28f, 28g, 28h, 28i, 28j are arranged in one-to-one correspondence within the 9 mounting holes 20, 20b, 20c, 20d, 20e, 20f, 20h, 20i, 20j of the hole wall. The backstop walls 28, 28b have continuous inner circumferential surfaces 29, 29b. In this embodiment, each backstop wall 28 has an inner circumferential surface 29.

The water draining through-hole 40 is arranged through the hole wall 20. The water draining through-hole 40 is arranged to extend along the radial direction of the housing body 10. The specific shape and size of the water draining through-hole 40 are only required to provide a channel for draining the water accumulated in the mounting hole 25. In this embodiment, to enhance the efficiency of water drainage and achieve the performance of automatically discharging the accumulated water, the mounting hole 25 is arranged to extend along a horizontal direction. Correspondingly, the water draining through-hole 40 is disposed at a bottom end of the hole wall 20. That is, the water draining through-hole 40 is disposed at a bottom end in a vertical direction, such that the accumulated water automatically slides off by its own gravity. To enhance water draining performance and maintain the mechanical strength of the hole wall 20, the water draining through-hole 40 is arranged to extend along the axial direction of the housing body 10. Correspondingly, an axial size of the water draining through-hole 40 is greater than its circumferential size. To further enhance the water draining performance, to facilitate manufacturing and maintain the waterproof performance of the housing body 10, the water draining through-hole 40 extends from the hole wall 20 onto the backstop wall 28 to form a substantially L-shaped through-groove, avoiding a decrease in the waterproof performance due to extension onto the housing body 10.

To improve the performance of firmly connecting with a corresponding plug during charging, a fencing wall 50 is provided on the housing body 10. The fencing wall 50 is protrudingly arranged on the housing body 10. The fencing wall 50 is arranged to continuously extend along an axial direction from the support face 12 of the housing body 10. The fencing wall 50 is arranged to extend along the circumferential direction of the housing body 10 and surround all of the hole walls 20 to form a retaining cavity 55. That is, the fencing wall 50 and the housing body 10 enclose a barrel-shaped structure for receiving the corresponding hole wall 20.

To further enhance the water draining performance and achieve the automatic water discharging function, a second water draining through-hole 58 is provided on the fencing wall 50. The second water draining through-hole 58 is configured for draining the water accumulated in the retaining cavity 55. To avoid difficulty in draining the water accumulated at a bottom end enclosed by the retaining cavity 55 and the surface of the housing body 10, the second water draining through-hole 58 is arranged to intersect or interface with the housing body 10. That is, the second water draining through-hole 58 is arranged at the bottom end of the fencing wall 50. The inner face of the fencing wall 50 is a cylindrical face, thereby facilitating water to accumulate and slide into the second water draining through-hole 58. In this embodiment, the second water draining through-hole 58 is substantially a rectangular through-hole. More specifically, the second water draining through-hole 58 may be a square through-hole.

Continuously referring to FIG. 1, during receiving a plug and charging, to improve the stable electrical connection with the plug, the fencing wall 50 is provided with a retaining groove 59. The retaining groove 59 is configured for maintaining integrated with the mechanical structure on the plug including the mating terminal. For example, the retaining groove 59 may be snap-fitted to a snap-joint (not shown) on the plug. The specific position, configuration and size of the retaining groove 59 may be selected as needed. In this embodiment, the retaining groove 59 is arranged on an outer surface of the fencing wall 50.

The housing body 10, the hole wall 20, and the fencing wall 50 may all be separate parts. In this embodiment, the receptacle housing 101 is an integrated unit. Specifically, the receptacle housing 101 is an injection-molded unit.

Figure 4:
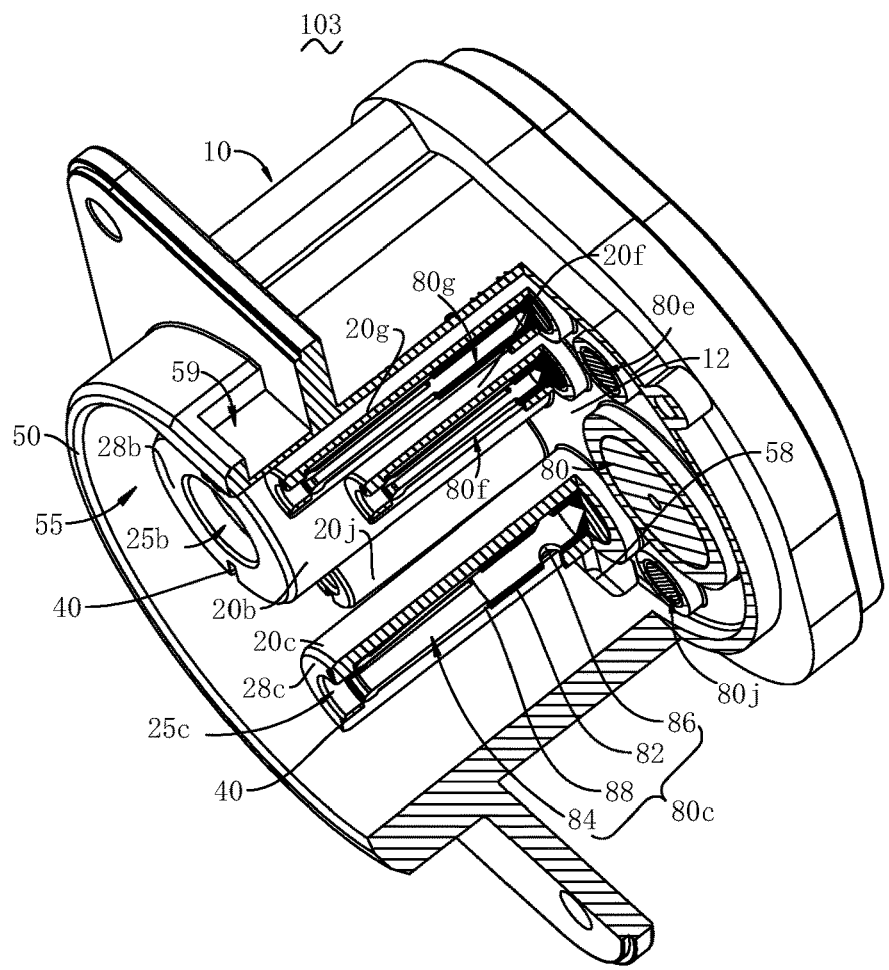
FIG. 4 is a layout stereoscopic sectional view of an embodiment of a receptacle provided according to the present disclosure.

Referring to FIG. 4, the present disclosure further provides a receptacle 103. The receptacle 103 comprises a connecting terminal 80 and the receptacle housing 101 disclosed in the foregoing embodiments. The connecting terminal 80 is accommodated in the corresponding mounting hole 25.

The connecting terminal 80 is configured for electrically connecting a vehicle battery pack and a mating terminal on a charging gun. The number and specification of the connecting terminal 80 may be selected as needed. FIG. 4 shows connecting terminals 80, 80e, 80f, 80g, 80j. Correspondingly, in this embodiment, 9 connecting terminals 80 of different specifications are plugged, in one-to-one correspondence, in the 9 corresponding mounting holes 25, 25b, 25c, 25d, 25e, 25f, 25g, 25h, 25i, and 25j, respectively. In this embodiment, the 9 connecting terminals 80 are configured for implementing the following 9 electrical connections, respectively: an electrical connection between a DC power supply anode and a corresponding mating terminal; an electrical connection between a DC power supply cathode and a corresponding mating terminal; an electrical connection between a grounded terminal and a corresponding mating terminal; an electrical connection between a charging communication anode and a corresponding mating terminal; an electrical connection between a charging communication cathode and a corresponding mating terminal; an electrical connection between a first charging connection confirming terminal and a corresponding mating terminal; an electrical connection between a second charging connection confirming terminal and a corresponding mating terminal; an electrical connection between a low-voltage auxiliary power supply anode and a corresponding mating terminal; and an electrical connection between a low-voltage auxiliary power supply cathode and a corresponding mating terminal.

In other words, the 9 connecting terminals 80 may meet the electrical connection requirements in relevant national standards of China regarding DC charging interfaces in a connecting device for charging an electric vehicle transmission.

Figure 5:
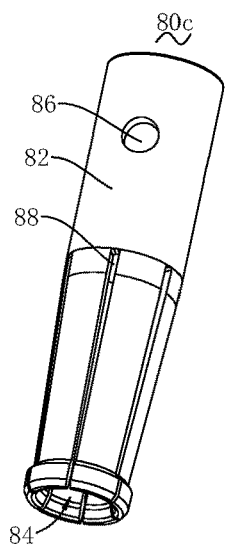
FIG. 5 is a stereoscopic structural schematic diagram of an embodiment of the connecting terminal in FIG. 4.

With reference to FIG. 5 together, the connecting terminal 80c has a contact wall 82. The contact wall 82 encloses an accommodating cavity 84. The accommodating cavity 84 is configured for accommodating a corresponding mating terminal. The contact wall 82 is arranged for a contact electrical connection with the mating terminal. The contact wall 82 has a position vacating through-hole 86. The position vacating through-hole 86 is arranged to be at least partially aligned with the water draining through-hole 40 to drain the water accumulated in the accommodating cavity 84 and on the corresponding mating terminal. In this embodiment, to enhance the water draining performance, a position vacating notch 88 is further provided on the contact wall 82. The position vacating notch 88 extends to an end portion of the contact wall 82. The end portion of the contact wall 82 is a portion that is first mated with the mating terminal.

Additionally, unless otherwise indicated, "bottom" and "top," "upper" and "lower," and "left" and "right" appearing in the contents regarding the receptacle housing 101 as described in the present disclosure are all relative concepts. Specifically, the upper, lower directions shown in FIG. 3 are corresponding top ends and bottom ends. In other words, the accumulated water naturally slides from the top down by its own gravity and is discharged. In this embodiment, an axial direction refers to the direction perpendicular to a horizontal plane in FIG. 3. A circumferential direction refers to the circumferential direction in FIG. 3.

Preferably, the receptacle housing 101 is an electric vehicle charging receptacle housing. Correspondingly, the receptacle 103 is an electric vehicle charging receptacle. The plug refers to a charging gun fitted with the electric vehicle charging receptacle. Correspondingly, the connecting terminal 80 is a female terminal. The mating terminal is a male terminal.

Compared with the prior art, by providing a water draining through-hole 40 in the hole wall 20, the receptacle housing 101 according to the present disclosure may drain water accumulated in the mounting hole in such a circumstance as water drops are brought therein upon plugging a mating female terminal, and provide water draining channels by means of such an ingenious structural design that safety performance may be enhanced. Preferably, when the mounting hole 25 is arranged at a bottom end in the vertical direction, the accumulated water may be automatically discharged by its own gravity, thereby enhancing the water drainage efficiency.

With reference to FIGS. 6 to 9, a receptacle housing 201 is provided according to the present disclosure. The receptacle housing 201 comprises a housing body 210, a mounting hole 225, and a non-return element 230. The mounting hole 225 is axially opened on the housing body 210 for receiving connecting terminals 280b, 280c, 280f, and 280g (as will be described infra). The non-return element 230 is disposed on the housing body 210 such that it may be block-fitted with the connecting terminals 280b, 280c, 280f, and 280g, thereby blocking the connecting terminals 280b, 280c, 280f, and 280g from retreating out of the mounting hole 225.

The housing body 210 is arranged for supporting other structures and electronic components such as the connecting terminals 280b, 280c, 280f, and 280g, etc. The specific shape and configuration of the housing body 210 are only required to fulfill corresponding supporting performance. The housing body 210 is substantially rectangular block-shaped. The housing body 210 has a front side 211 and a rear side 212 in an axial direction thereof. That is, when the receptacle housing 201 is plug-fitted with the mating terminal (not shown) along the axial direction of the housing body 210, the mating terminal is sequentially plugged from the front side 211 of the housing body 210 into the rear side 212 of the housing body 210.

Figure 8:
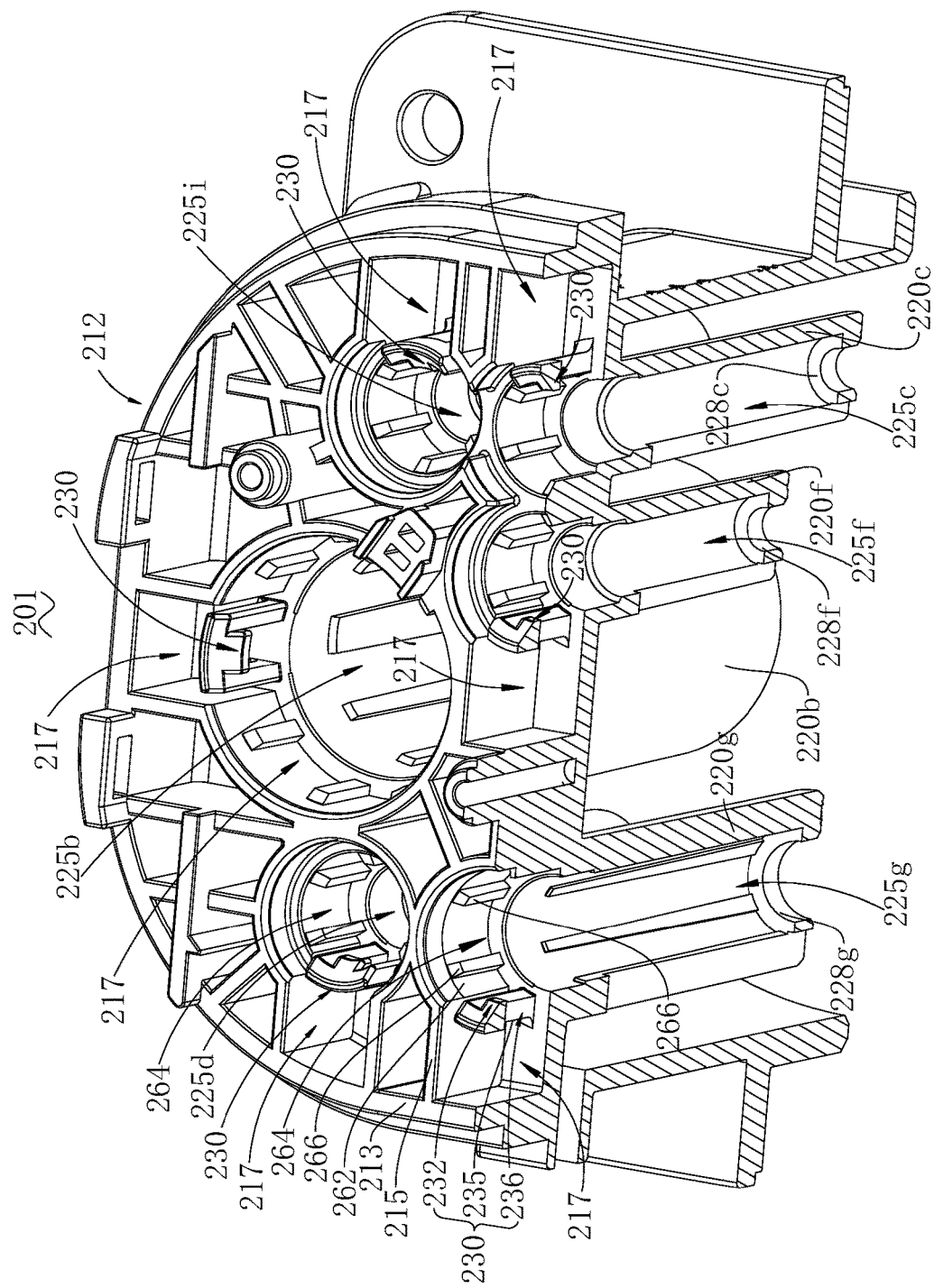
FIG. 8 is a partial stereoscopic sectional view of the receptacle housing of FIG. 6 showing multiple mounting holes.

The mounting hole 225 is disposed in the housing body 210 for mounting and receiving the corresponding connecting terminals 280b, 280c, 280f, and 280g. The mounting hole 225 is arranged to extend along the axial direction of the housing body 210 so that it can receive the corresponding connecting terminals 280b, 280c, 280f, and 280g axially extending and mounted. The specific specification, shape, number, and distribution of the mounting hole 225 are only required to satisfy the requirements to mount the corresponding connecting terminals 280b, 280c, 280f, and 280g. In this embodiment, 9 mounting holes 225, 225b, 225c, 225d, 225e, 225f, 225g, 225h, 225i, 225j are distributed on the housing body 210. FIG. 8 shows corresponding 9 mounting holes 225b, 225c, 225g, and 225f enclosed by hole walls 220b, 220c, 220g, and 220f. A small number of the mounting holes 225, 225b, 225c, 225d, 225e, 225f, 225h, 225i, 225j have different axial extension lengths and/or radial sizes.

To enhance the performance of the mounting hole 225 retaining the corresponding female terminal 280, free ends of the hole walls 220c, 220f, and 220g are provided with backstop walls 228c, 228f, and 228g. The backstop wall 228 is arranged to protrude along a radial direction of the housing body 210. The backstop wall 228 may be axially block-fitted to the female terminal 280, thereby blocking the female terminal 280 from sliding out of the mounting holes 225c, 225f, 225g. The specific size and configuration of the backstop walls 228c, 228f and 228g are only required to implement axially blocking of the corresponding female terminal 280. In this embodiment, to sufficiently guarantee the performance of the backstop walls 228c, 228f, 228g retaining the female terminal 280, the backstop walls 228c, 228f, 228g extend along the circumferential direction of the housing body 210 to form a closed-ring shape. Correspondingly, the backstop walls 228c, 228f, 228g are substantially annular plate-shaped. Specifically, 9 backstop walls 228, 228b, 228c, 228d, 228e, 228f, 228g, 228h, 228i, 228j are arranged in one-to-one correspondence in the 9 mounting holes 220, 220b, 220c, 220d, 220e, 220f, 220h, 220i, 220j of hole wall.

The non-return element 230 is disposed on the housing body 210 and arranged to be axially block-fitted with the connecting terminals 280b, 280c, 280f, and 280g. The non-return element 230 extends continuously from the housing body 210 towards the rear side 212 of the housing body 210. The non-return element 230 may be any protruding structure such as a crossbar, a convex rib or the like, which may be axially block-fitted with the connecting terminals 280b, 280c, 280f, and 280g. The non-return element 230 may also be snap-fitted with the connecting terminals 280b, 280c, 280f, and 280g through snap-joints. As can be seen, the structure of the non-return element 230 is only required to satisfy that when corresponding connecting terminals 280b, 280c, 280f, and 280g are mounted into the mounting holes 225, the mounting holes may be axially block-fitted with the connecting terminals 280b, 280c, 280f, and 280g to block the connecting terminals 280b, 280c, 280f, and 280g from retreating out of the mounting holes 225. In this embodiment, to facilitate demounting to thereby release the blockage of the connecting terminals 280b, 280c, 280f, and 280g and then to further facilitate replacing the connecting terminals 280b, 280c, 280f, and 280g, the non-return element 230 may be a boss 232. In this embodiment, the boss 232 is radially protrudingly arranged on a supporting leg 235 (as will be described infra). To further facilitate demounting, the boss 232 has a blocking face 232b. The blocking face 232b may contact with the connecting terminals 280b, 280c, 280f, and 280g for axially blocking to block the connecting terminal 280b from retreating from the rear side 212 of the housing body 210. To enhance the blocking performance, in this embodiment, the blocking face 232b is arranged to extend perpendicular to the axial direction of the housing body 210. To facilitate demounting, the boss 232 may further comprise a guide bevel 232a. The guide bevel 232a is arranged to be inclined with respect to the blocking face 232b, thereby facilitating guiding the connecting terminals 280b, 280c, 280f, and 280g, when being mounted, to be block-fitted with the blocking face 232b. To facilitate demounting, the non-return element 230 is a cantilever beam structure which is not connected with a connecting wall 215 but spaced therefrom.

In this embodiment, to enhance elastic deformation performance of the boss 232, the non-return element 230 comprises a supporting leg 235. The supporting leg 235 is configured for supporting the boss 232. The specific structure of the supporting leg 235 is only required to support the boss 232 and avoid direct disposition of the boss 232 onto the housing body 210, thereby increasing the performance for the boss 232 to generate an elastic deformation along a radial direction. To further enhance the elastic deformation performance of the supporting leg 235 and to ease manufacturing, the supporting leg 235 is radially provided with a through-hole 238. The through-hole 238 partitions the supporting leg 235 into two support columns 235a, 235b. In this embodiment, to achieve the balanced forced retaining performance, the two support columns 235a, 235b are sized and configured identically.

It may be understood that the two support columns 235a, 235b may simultaneously support the boss 232. In this embodiment, to ease manufacturing and to facilitate supporting the boss 232, the retaining element 230 further comprises a supporting cross arm 237. The supporting cross arm 237 is connected to the two support columns 235a, 235b. The supporting cross arm 237 is configured for supporting the boss 232. The supporting cross arm 237 is arranged to extend along a transverse or circumferential direction of the housing body 210. In this embodiment, the supporting cross arm 237 extends to form an arched plate.

Figure 6:
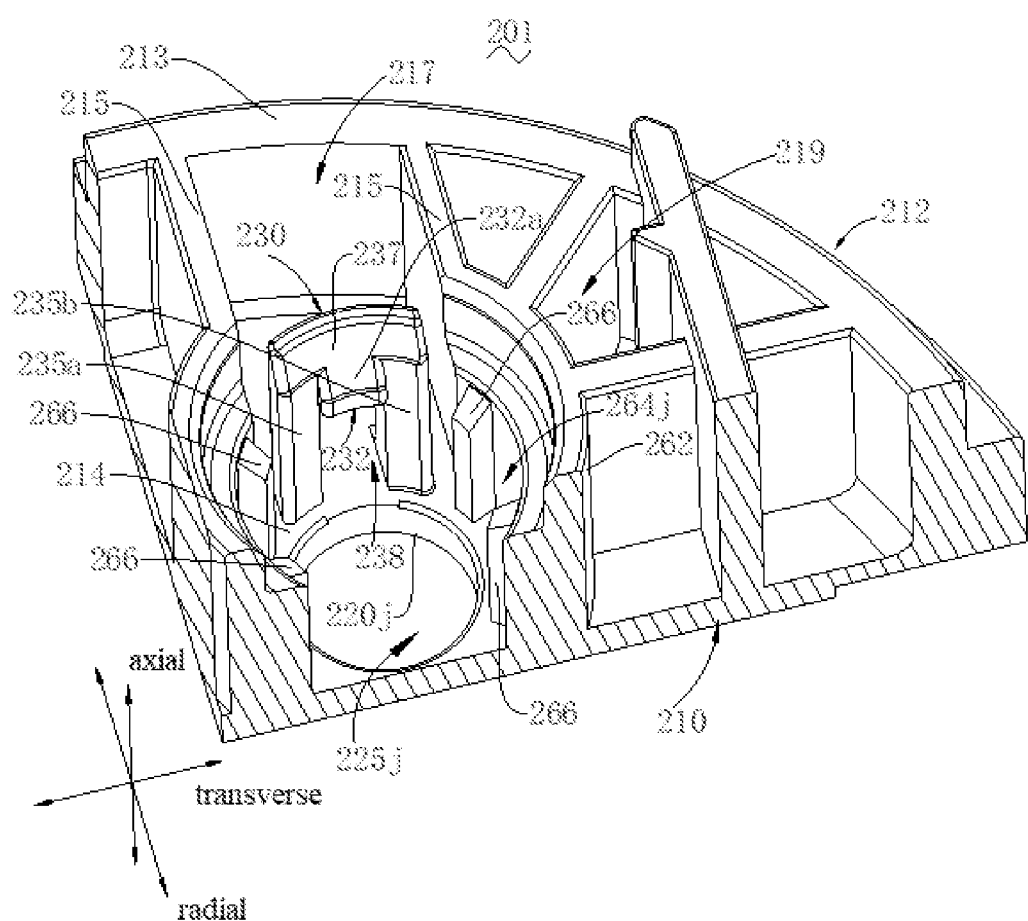
FIG. 6 is a partial stereoscopic sectional view of the receptacle housing provided according to the present disclosure showing one mounting hole.
Figure 7:
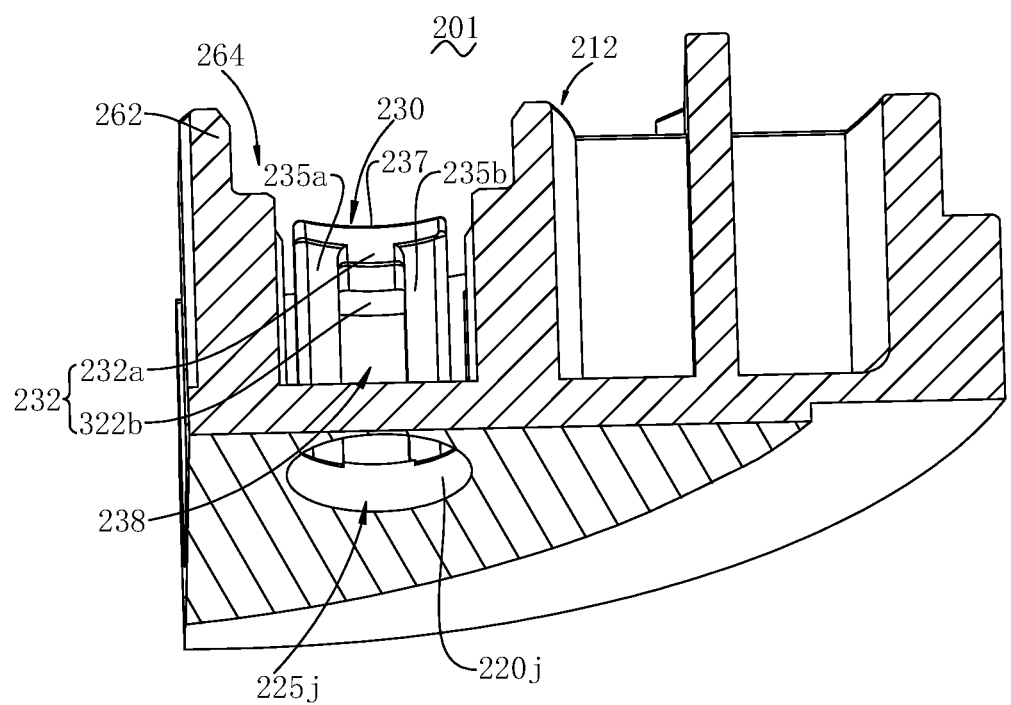
FIG. 7 is a schematic view of the receptacle housing of FIG. 6 from another visual angle.

As a variation, to achieve a larger elastic deformation space for the boss 232, only one of the supporting leg may be provided. Correspondingly, the boss 232 is radially and circumferentially protrudingly provided on the supporting leg 235. It may also be understood that one of the support columns 235a (or 235b) in FIG. 6 is removed, and only the other of the support column 235b (or 235a) is utilized to support the boss 232. The boss 232 may be an example of a snap jointing part to be snap-fittable with the connecting terminals 280b, 280c, 280f, and 280g.

To enhance the protection of the non-return element 230 and facilitate a firm connection with other parts, the receptacle housing 201 may further comprise a fencing wall 213. The fencing wall 213 is arranged on the housing body 210 to protrude along the axial direction of the housing body 210. The fencing wall 213 is arranged to extend along the circumferential direction of the housing body 210 to form an accommodating cavity 219. The accommodating cavity 219 is configured for accommodating the non-return element 230.

To facilitate manufacturing of the non-return element 230 and facilitate demounting the non-return element 230 from the connecting terminals 280b, 280c, 280f, and 280g, the receptacle housing 201 further comprises a connecting wall 215. The connecting wall 215 is connected to the fencing wall 213 and a retaining wall 262 (as will be described infra), respectively. The connecting wall 215, the fencing wall 213, and the retaining wall 262 (as will be described infra) enclose a position vacating groove 217.

To enhance the performance in protecting the non-return element 230, the receptacle housing 201 further comprises a retaining wall 262. The retaining wall 262 is arranged on the housing body 210 to protrude along the axial direction of the housing body 210. The retaining wall 262 is arranged to extend along the circumferential direction of the housing body 210 and to enclose, together with the non-return element 230, a retaining cavity 264. The retaining cavity 264 communicates with the mounting hole 225 to be capable of retaining the connecting terminals 280b, 280c, 280f, and 280g. The specific configurations of the retaining wall 262 and the retaining cavity 264 are only required to be capable of retaining tail parts of the corresponding connecting terminals 280b, 280c, 280f, and 280g. In this embodiment, the retaining wall 262 is substantially a partially circumferential wall and encloses, together with the non-return element 230, in a substantially circular tube shape. To improve the elastic deformation space of the non-return element 230 and facilitate dismantling the non-return element 230 from the corresponding connecting terminals 280b, 280c, 280f, and 280g, the retaining wall 262 is arranged to be transversely or circumferentially spaced apart from one or two side walls of the non-return element 230. In this embodiment, the retaining wall 262 and two side walls of the non-return element 230 are all arranged to be spaced apart along the circumferential direction of the housing body 210. The retaining cavity 264 is only required to be capable of communicating with the mounting hole 225 to accommodate and retain the corresponding connecting terminals 280b, 280c, 280f, and 280g. In this embodiment, the retaining cavity 264 and the mounting hole 225 share the same central axis.

To enhance the stable performance in retaining the connecting terminals 280b, 280c, 280f, and 280g and facilitate demounting, a retaining convex rib 266 is protrudingly arranged on the inner surface of the retaining wall 262. A plurality of the retaining convex ribs 266 are arranged along the circumferential direction of the housing body 210. The retaining convex rib 266 is arranged to be transversely and/or radially block-fittable with the connecting terminals 280b, 280c, 280f, and 280g (as will be described infra).

The specific material of the receptacle housing 201 may be selected according to needs. In this embodiment, to facilitate electrical insulation and to facilitate manufacturing a firm structure, the receptacle housing 201 is an injection-molded unit. In other words, the receptacle housing 201 is an integrated unit formed by injection-molding. Correspondingly, the structural configuration of the above-mentioned non-return element 230 greatly facilitates the formation of a waterproof structure and enhances the sealing and waterproof performance.

Figure 10:
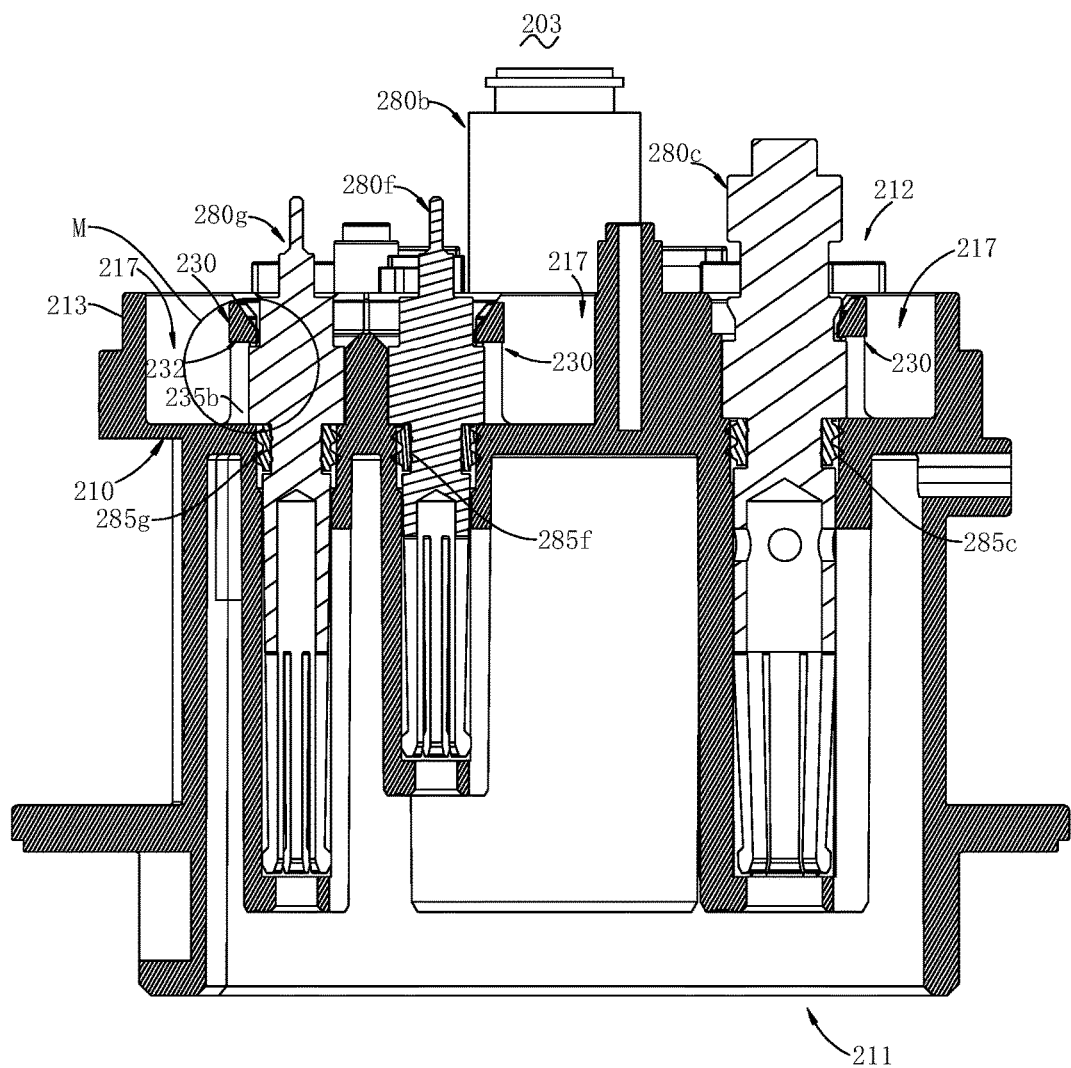
FIG. 10 is a sectional view of a receptacle provided according to the present disclosure.

With reference to FIG. 10, the present disclosure provides a receptacle 203. The receptacle 203 comprises the receptacle housing 201 and the connecting terminals 280b, 280c, 280f, and 280g as depicted in the foregoing embodiments. The connecting terminals 280b, 280c, 280f, and 280g are arranged on the receptacle housing 201 to enable an electrical connection with a mating terminal on the charging gun.

Figure 9:
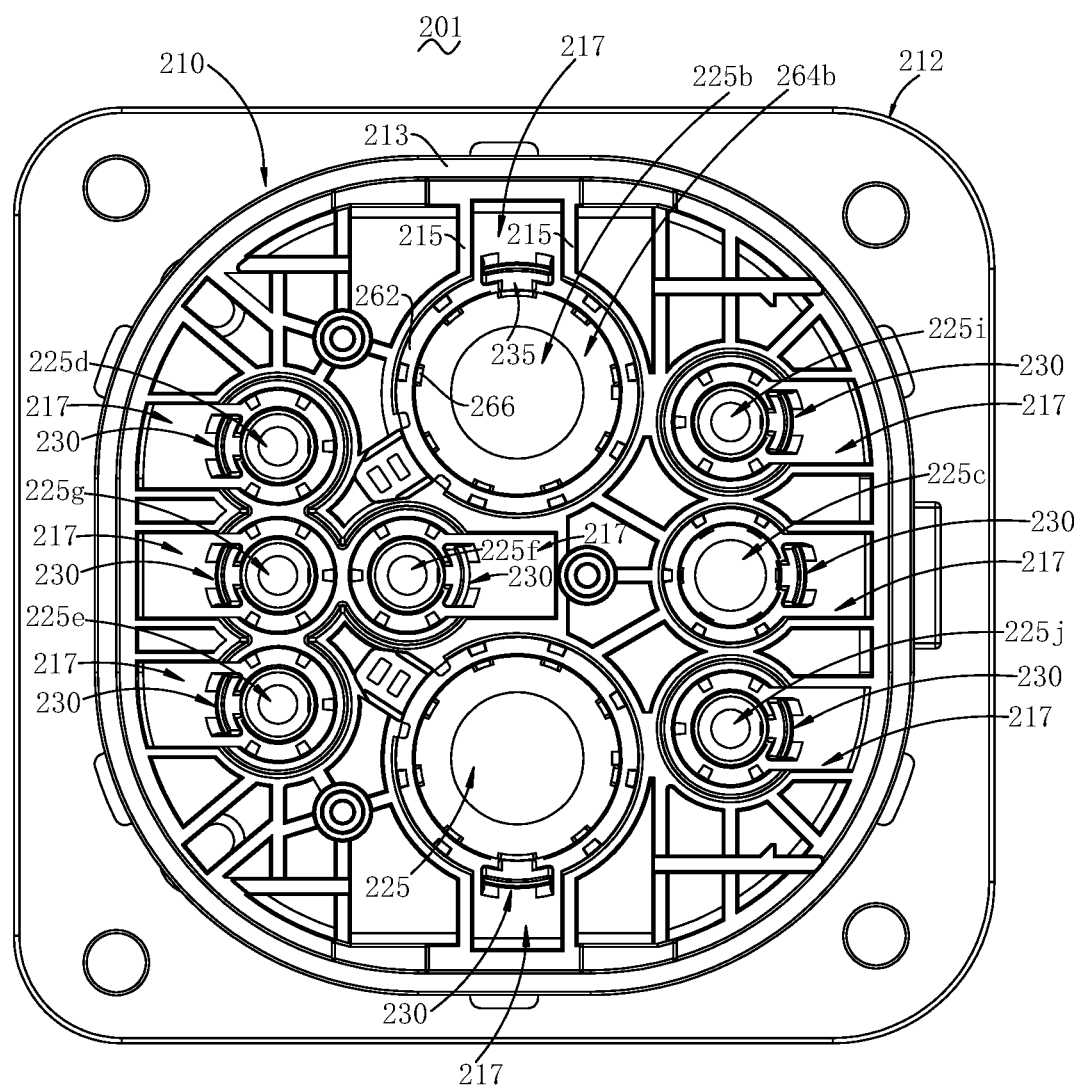
FIG. 9 is a projection schematic diagram of the receptacle housing of FIG. 6 along a mounting direction of the connecting terminal.

The connecting terminals 280b, 280c, 280f, and 280g are at least partially accommodated in the mounting hole 225 and may be arranged to be axially block-fitted with the non-return element 230, thereby being firmly retained in the mounting hole 225. That is, the structures on the connecting terminals 280b, 280c, 280f, and 280g are partially accommodated in the mounting hole 225. The specification, type and number of the connecting terminals 280b, 280c, 280f, and 280g may be selected according to needs. In this embodiment, the connecting terminals 280b, 280c, 280f, and 280g are female terminals to enable a plug-fittable electrical connection with the mating terminal on the charging gun. In this embodiment, 9 connecting terminals 280b, 280c, 280f, and 280g are separately and correspondingly mounted on the receptacle housing 201 to meet corresponding Chinese national standards. FIG. 9 shows four connecting terminals 280b, 280c, 280f, and 280g.

Figure 11:
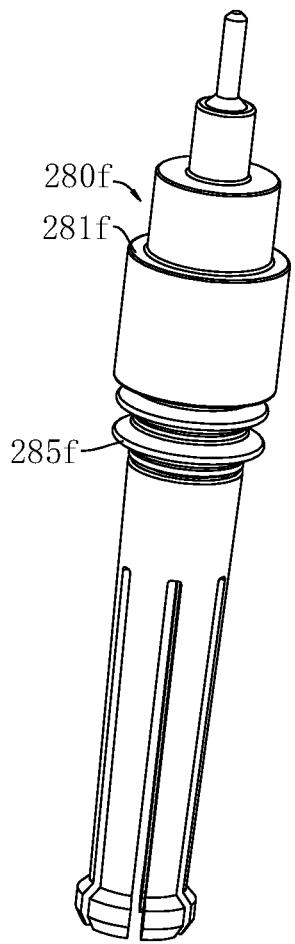
FIG. 11 is a structural schematic diagram of an embodiment of the connecting terminal with a sealing ring in FIG. 10.

With reference to FIG. 11, the connecting terminal 280f has a step portion 281f. The step portion 281f is arranged to protrude along the transverse and/or radial direction of the housing body 210 and may be arranged to be axially block-fitted with the non-return element 230. The step portion 281f may be a boss shape arranged to protrude along the radial direction of the connecting terminals 280b, 280c, 280f, and 280g. In this embodiment, to sufficiently guarantee that the step portion 281 may be axially block-fitted with the non-return element 230 at any circumferential angle, the step portion 281f extends along the circumferential direction of the housing body 210 to form a whole circle.

With continuous reference to FIG. 11, to enhance the sealing and waterproof performance between the connecting terminals 280b, 280c, 280f, and 280g and the housing body 210, the connecting terminals 280b, 280c, 280f, and 280g are sleeved with a seal ring 285 to thereby become sealed and waterproof. Specifically, the seal ring 285 is sleeved on the connecting terminals 280b, 280c, 280f, and 280g and is arranged to seal the gaps between the connecting terminals 280b, 280c, 280f, and 280g and the hole walls 220 of the mounting hole 225. That is, the seal ring 285 hermetically abuts against the hole wall 220 and the connecting terminals 280b, 280c, 280f, and 280g, respectively. In this embodiment, the seal rings 285c, 285f, 285g are arranged to axially contact with a second step portion 283 (as will be described infra).

Figure 12:
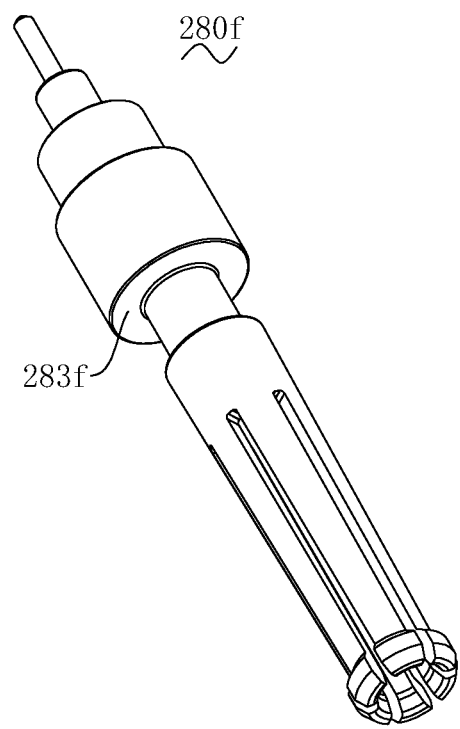
FIG. 12 is a structural schematic diagram of the connecting terminal in FIG. 11.

With reference to FIG. 12 together, to avoid excessive mounting the connecting terminals 280b, 280c, 280f, and 280g, the connecting terminal 280f has a second step portion 283. The second step portion 283 is arranged to protrude along the transverse and/or radial direction of the housing body 210 and may be arranged to be axially block-fitted with the housing body 210. The second step portion 283 and the step portion 281 are arranged back to back to axially define the connecting terminals 280b, 280c, 280f, and 280g between the non-return element 230 and the housing body 210. Specifically, the second step portions 283 of the connecting terminals 280b, 280c, 280f, 280g are block-fitted to the rear surface 214 of the housing body 210, thereby blocking the connecting terminals 280b, 280c, 280f, and 280g from further advancing when being plugged in place.

Figure 13:
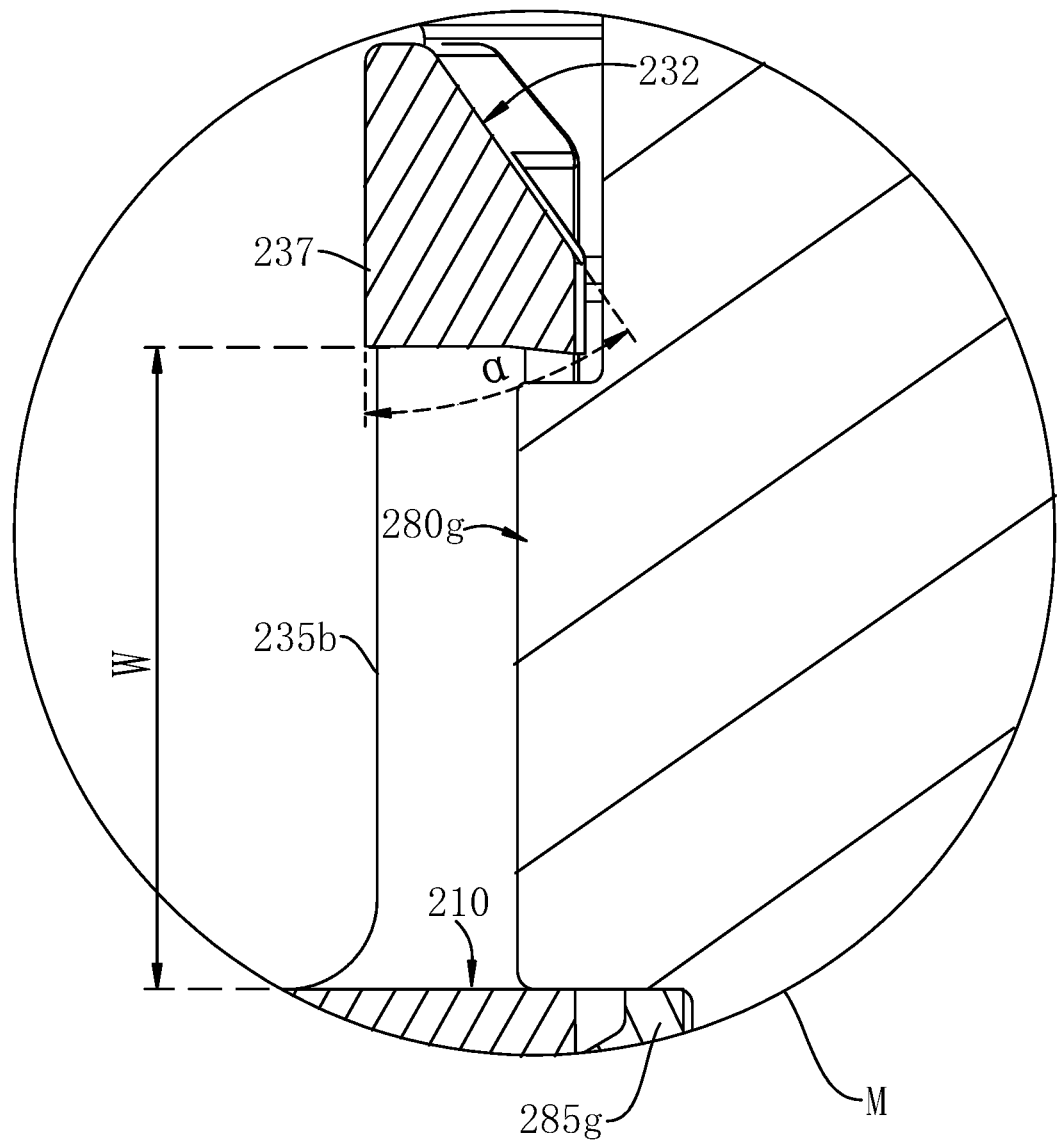
FIG. 13 is a partial enlarged schematic view of the receptacle of FIG. 10 at M.

FIG. 13 shows that an included angle between the guide bevel 232a of the non-return element 230 and the plugging direction of the connecting terminal 280f is an acute angle α. By means of the step portion 281f and the second step portion 283f, the connecting terminal 280f is limited within a height range W defined by the backstop face 232b of the non-return element 230 and the rear surface 214 of the housing body 210.

Preferably, the receptacle housing 201 is an electric vehicle charging receptacle housing. Correspondingly, the receptacle 203 is an electric vehicle charging receptacle. The plug refers to a charging gun fitted with the electric vehicle charging receptacle. Correspondingly, the connecting terminal 280 is a female terminal. The mating terminal is a male terminal.

To facilitate understanding relative positions of various parts as described in the present disclosure, the terms "upper" and "lower" appearing in the contents about the receptacle housing 201 and the receptacle 203 are relative concepts, and may be the top-down direction shown in FIG. 10. Moreover, the upper portion in FIG. 10 is the rear side 212 of the housing body 210, and the lower portion in FIG. 10 is the front side 211 of the housing body 210. In addition, "left" and "right" and "top" and "bottom" and the like are all relative concepts. FIG. 6 shows relative directions of "axial," "transverse," and "radial." It may be understood that the axial direction may be a top-down direction or the mounting direction of the connecting terminals 280b, 280c, 280f, and 280g. Correspondingly, the terms of "front" and "rear" are relative concepts, which may indicate that the mating terminal is plugged from the "front" towards the "rear." Specifically, the front side 211 of the housing body 210 is an outer portion fitted to the charging gun, while the rear side 212 of the housing body 210 is an inner portion of the housing mounted into an electric vehicle body.

Compared with the prior art, the receptacle housing 201 of the present disclosure may block, by means of the non-return element 230, the connecting terminal 280b from retreating from the mounting hole 225j on the housing body 210, thereby to ensure a stable electrical connection between the connecting terminal 280b and the mating terminal on the charging gun. The receptacle housing 201 is ingenious in structure and convenient to manufacture, and thus facilitates designing a configuration having better waterproof performance.

Figure 14:
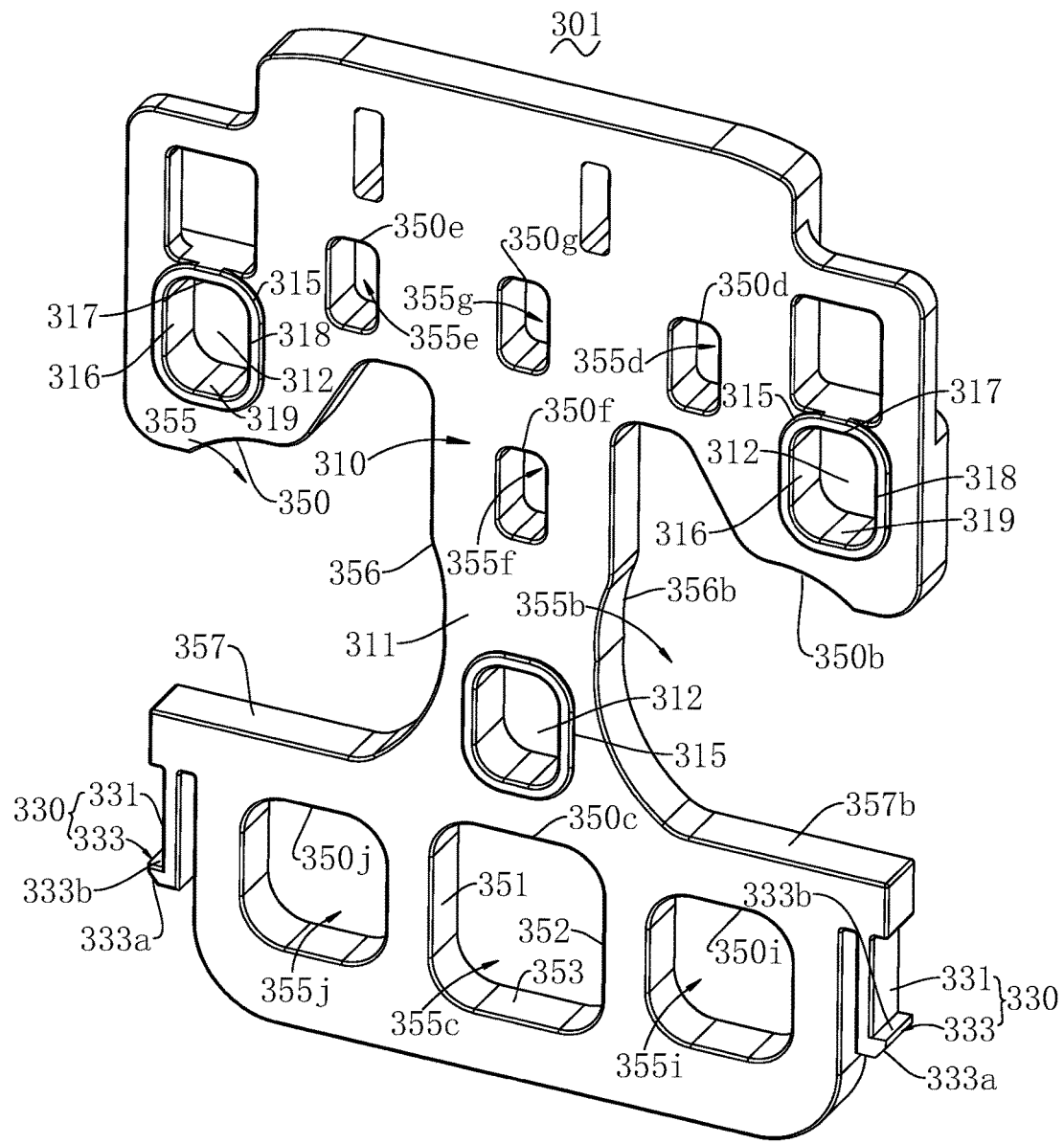
FIG. 14 is a stereoscopic structural schematic diagram showing an upper surface of a secondary lock provided according to the present disclosure.
Figure 15:
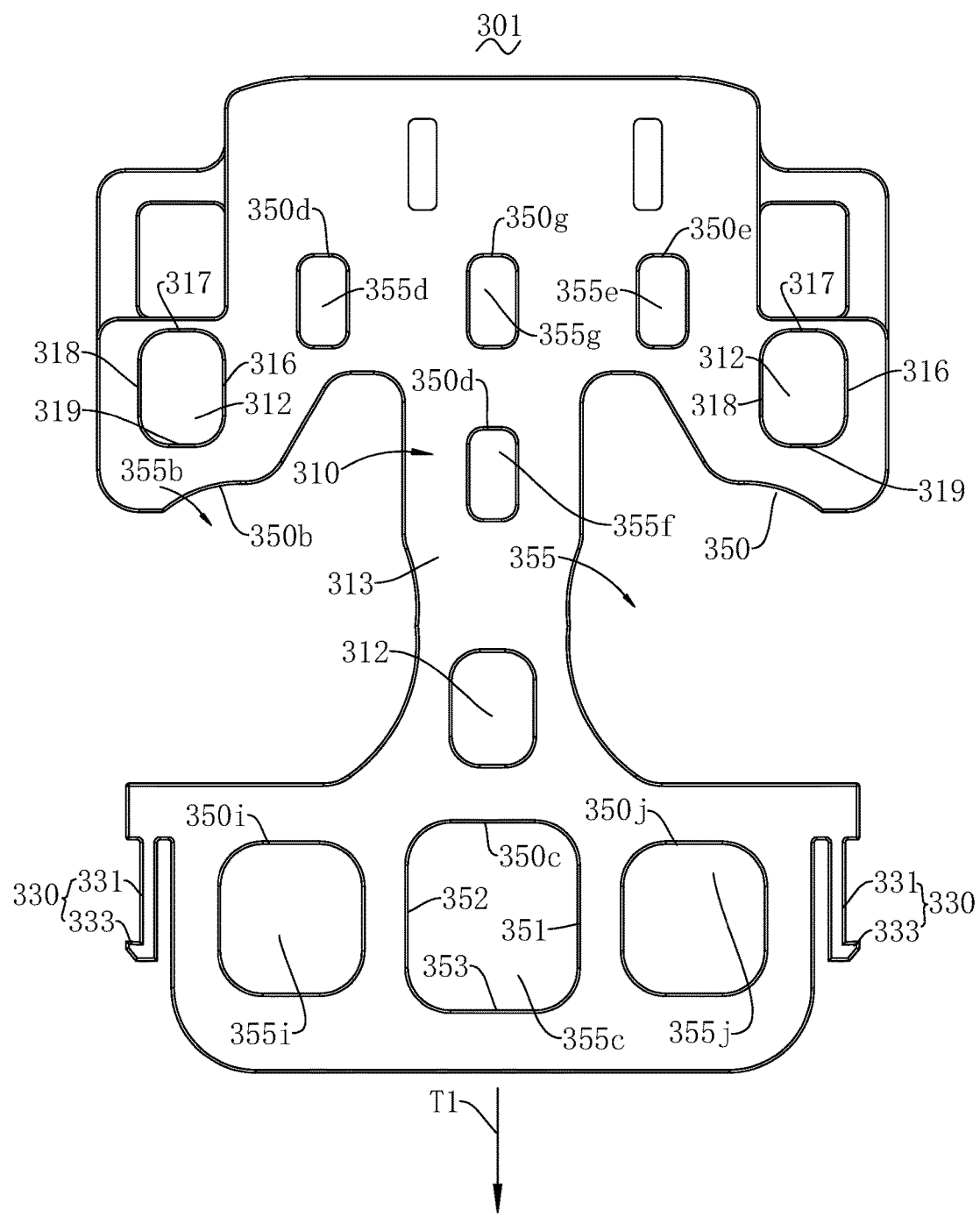
FIG. 15 is a projection schematic diagram showing a lower surface of the secondary lock of FIG. 14.

With reference to FIGS. 14 and 15, a secondary lock 301 provided according to the present disclosure is shown. The secondary lock 301 has a lock body 310 that may be mounted onto the receptacle housing 302, a locking portion 330 configured to be longitudinally block-fittable to the receptacle housing 302, and a terminal retaining portion 350 for retaining a connecting terminal 303.

The lock body 310 has a longitudinal insertion direction. That is, the lock body 310 is mounted onto a receptacle housing 302 (as will be described infra) by inserting along a longitudinal direction. In this embodiment, the lock body 310 extends along the longitudinal direction. The lock body 310 may be longitudinally movable relative to the receptacle housing 302, thereby successively implementing pre-assembly on the receptacle housing 302 and maintaining integrated with a final lock of the receptacle housing 302. The specific shape and configuration of the lock body 310 are only required to be capable of supporting the locking portion 330 and the terminal retaining portion 350. In this embodiment, to sufficiently simplify the structure and utilize the mounting space, the lock body 310 is substantially plate-shaped extending along a transverse direction and a longitudinal direction.

The locking portion 330 is protrudingly arranged on the lock body 10 to be longitudinally block-fittable with the receptacle housing 302 and to maintain integrated therewith. The specific configuration of the locking portion 330 is only required to enable the corresponding axial blocking. For example, the locking portion 303 may be a boss or a snap-joint. The number and distribution of the locking portion 330 may be selected according to needs. In this embodiment, a pair of locking portions 330 are arranged at two sidewalls of the lock body 330, respectively, thereby enhancing the performance in secure assembly onto the receptacle housing 302 and enhancing the performance in retaining and limiting transversely.

To facilitate manufacturing and providing a firm support, in this embodiment, the locking portion 330 comprises a supporting arm 331 and a latch 333. The supporting arm 331 is disposed on the lock body 310 and is arranged to continuously extend along a longitudinal direction of the lock body 310. Further, to facilitate demounting the locking portion 330 from the corresponding receptacle housing 302, the supporting arm 331 is arranged to be spaced apart from part of the sidewalls of the lock body 310 to form a cantilever, thereby improving the elastic deformation performance. The latch 333 is arranged on the supporting arm 331 to protrude outwardly along the transverse direction of the lock body 310. The specific configuration and size of the latch 333 are only required to enable a longitudinal block-fit with the receptacle housing 302. In this embodiment, to facilitate demounting and improve blocking performance, the latch 333 comprises a guide face (not shown) and a locking face. The guide face is arranged to extend and tilt relative to a longitudinal mounting direction of the secondary lock 301. That is, an included angle between the guide face and the longitudinal mounting direction of the secondary lock 301 is an acute angle. The locking face is perpendicular to the longitudinal mounting direction of the secondary lock 301. That is, the included angle between the locking face and the longitudinal mounting direction of the secondary lock 301 is a right angle. Further, the latch 333 comprises a front blocking face 333a. The front blocking face 333a may be block-fitted with the receptacle housing 302, thereby retaining the secondary lock 101 at a pre-locking position and preventing the secondary lock 101 from accidentally entering the locking position from the pre-locking position. The latch 333 comprises a rear blocking face 333b. The rear blocking face 333b may be longitudinally block-fitted with the receptacle housing 302, thereby retaining the secondary lock 101 at the locking position and preventing the secondary lock 101 from leaving the locking position. The front blocking face 333a and the rear blocking face 333b are arranged back to back. The terms of "front" and "rear" are relative concepts, i.e., front-rear along the longitudinal mounting direction of the secondary lock 101. It needs to be noted that the "locking position" is the "final locking position."

The terminal retaining portion 350 is arranged on the lock body 310 to be block-fitted with the connecting terminal 303. The specific shape and configuration of the terminal retaining portion 350 are only required to be capable of being block-fitted with the connecting terminal 303 along the axial direction of the connecting terminal 303 to enhance the firm retaining performance in mounting the connecting terminal 303 onto the receptacle housing 302. The terminal retaining portion 350 is arranged to continuously extend along the longitudinal direction of the lock body 310, so that when assembled longitudinally the secondary lock 301 is moved to partially overlap with the connecting terminal 303 to enable the axial blocking. The terminal retaining portion 350 may be a flange, a boss or a cantilever that extends along the transverse and/or longitudinal direction of the lock body 310.

As an embodiment, an accommodating notch 355 is arranged on the lock body 310 to further enhance the performance of the secondary lock 301 and the connecting terminal 303 in limiting and retaining each other. The accommodating notch 355 is arranged for accommodating and retaining the connecting terminal 303. Specifically, the accommodating notch 355 has through-hole side walls 351, 352, and a bottom end wall 353. The through-hole side walls 351, 352, the bottom end wall 353, and the terminal retaining portion 350c enclose a through-hole. That is, the terminal retaining portion 350c is a top end wall that is arranged to be opposite to and spaced from the bottom end wall 353. The accommodating notch 355 may be a chamfered rectangular through-hole. The through-hole sidewalls 351, 352 may enhance the performance in transversely limiting and retaining the connecting terminal 303. The bottom end wall 353 may block the secondary lock 301 from being excessively mounted along the longitudinal direction and retain the secondary lock 301 at the pre-assembling position. That is, the bottom end wall 353 may block the secondary lock 301 from moving along a direction opposite to the longitudinal mounting direction, but rather only moving along the longitudinal mounting direction to maintain integrated with the final lock. In this embodiment, 7 accommodating notches 355c, 355d, 355e, 355f, 355g, 355h, 355i may accommodate corresponding connecting terminals 303c, 303d, 303e, 303f, 303g, 203h, 303i, respectively, and enclose, together with corresponding 7 terminal retaining portions 350c, 350d, 350e, 350f, 350g, 350h, and 350i, a corresponding through-hole. Correspondingly, the terminal retaining portion 350c is plate-shaped extending transversely.

As another embodiment, accommodating notches 359, 359b are provided on the lock body 310 to further enhance the performance of the secondary lock 301 and the connecting terminal 303 in limiting and retaining each other and meanwhile save materials and facilitate demounting. The accommodating notch 359 is arranged for accommodating and retaining the connecting terminal 303. Specifically, the accommodating notch 359 are enclosed by the retaining sidewall 356 (or 356b), the retaining bottom wall 357 (or 357b), and the terminal retaining portion 350 (or 350b). One of the retaining sidewalls 356, 356b directly faces an opening, so that the connecting terminal 303 may be transversely blocked. The retaining bottom wall 357 is configured for blocking the secondary lock 301 from being excessively mounted along the longitudinal direction and retaining the secondary lock 301 at the pre-assembling position. The terminal retaining portion 350 as a retaining top wall is arranged to be longitudinally opposite to and spaced from the retaining bottom wall 357. In this embodiment, a pair of the accommodating notches 359, 359b are disposed at two sidewalls of the lock body 310, respectively, and may accommodate the corresponding connecting terminals 303, 303b.

The specific material of the secondary lock 301 is only required to satisfy corresponding requirements. In this embodiment, the secondary lock 301 is a plastic unit. To facilitate manufacturing and enhance the stable performance, the secondary lock 301 is an integrated unit. More specifically, the secondary lock 301 is an injection-molded unit.

To enhance the stable performance in retaining the secondary lock 301 along the axial direction of the connecting terminal 303 on the receptacle housing 302, when the secondary lock 301 is axially block-fitted with the connecting terminal 303 (i.e., the secondary lock 301 is in the final locking position), the secondary lock 301 is arranged to be secured on the receptacle housing 302 along the axial direction of the connecting terminal 303. The secondary lock 301 may be fastened on the receptacle housing 302 by a fastener. In this embodiment, the secondary lock 301 is limited by a circuit board 360 (as will be described infra) and fastened by a fastener 340 (as will be described infra) to be thereby axially retained within a preset axial space range.

To facilitate movability of the secondary lock 301, a position vacating through-hole 312 is provided on the lock body 310. The position vacating through-hole 312 is configured for providing a connection space for directly fastening the receptacle housing 302 and the circuit board 360 by the fastener 340. The position vacating through-hole 312 is enclosed by hole sidewalls 316, 318, hole front sidewall 319, and hole rear sidewall 317. The hole front sidewall 319 is arranged to be longitudinally block-fittable with a boss 377 on a receptacle housing 302 (as will be described infra) to prevent the secondary lock 301 from leaving the pre-locking position. The hole rear sidewall 319 is arranged to be longitudinally block-fittable with the boss 377 to prevent the secondary lock 101 from surpassing the locking position when inserting, thereby providing the blocking to retain the secondary lock 101 at the locking position when mounting the secondary lock 101.

To reduce possible friction between the lock body 310 and the circuit board 360, a support flange 315 is provided on the lock body 310. The support flange 315 is provided to surround the position vacating through-hole 312. The support flange 315 is arranged to protrude along the axial direction of the position vacating through-hole 312. To reduce stress for enhancing the anti-vibration performance of the secondary lock 101, the secondary lock 101 is interstice-fitted with the charging receptacle housing 302 and the circuit board 360 respectively in an axial direction of the connecting terminal 303 (as will be described infra), i.e., fitting without mutual contact.

Figure 16:
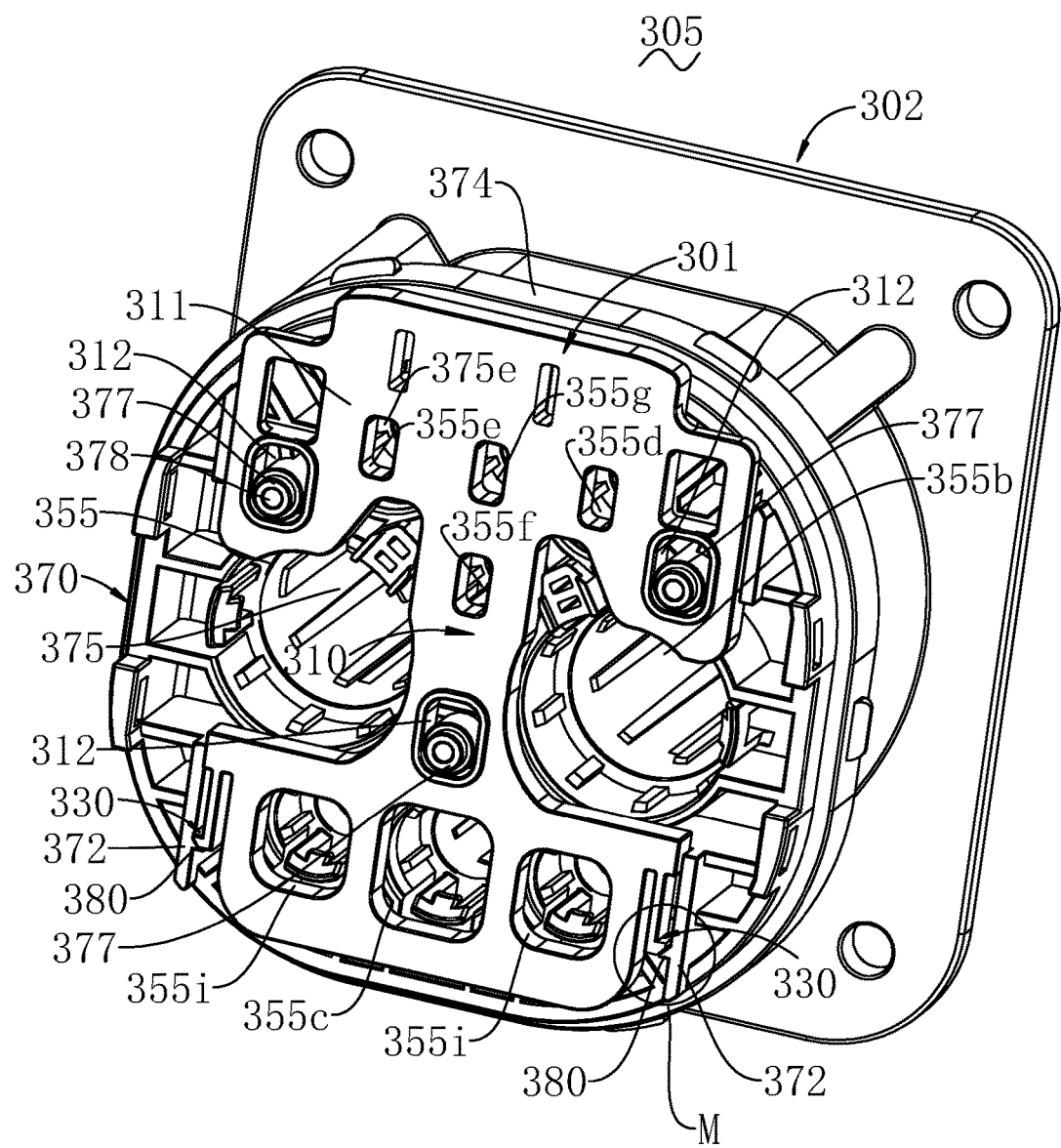
FIG. 16 is a stereoscopic structural diagram of an embodiment of a receptacle provided according to the present disclosure.

With reference to FIG. 16, the present disclosure provides a receptacle 305. The receptacle 305 comprises a receptacle housing 302 and the secondary lock 301 as described in the foregoing embodiments. The secondary lock 301 may be pre-assembled on the receptacle housing 302 and may longitudinally move to lock the final lock of the connecting terminal 303 onto the receptacle housing 302.

Figure 17:
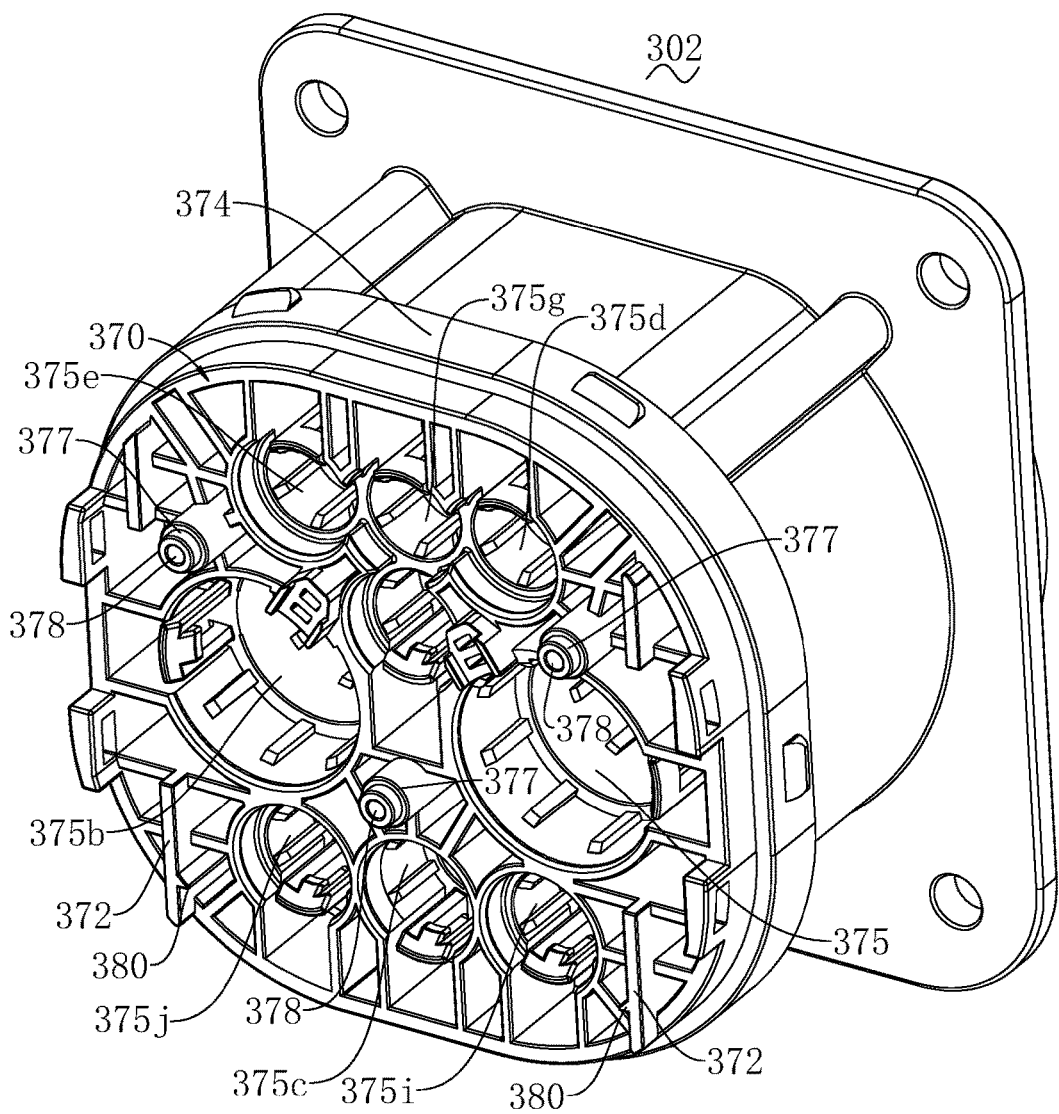
FIG. 17 is a structural schematic diagram of the receptacle housing shown in FIG. 16.
Figure 18:
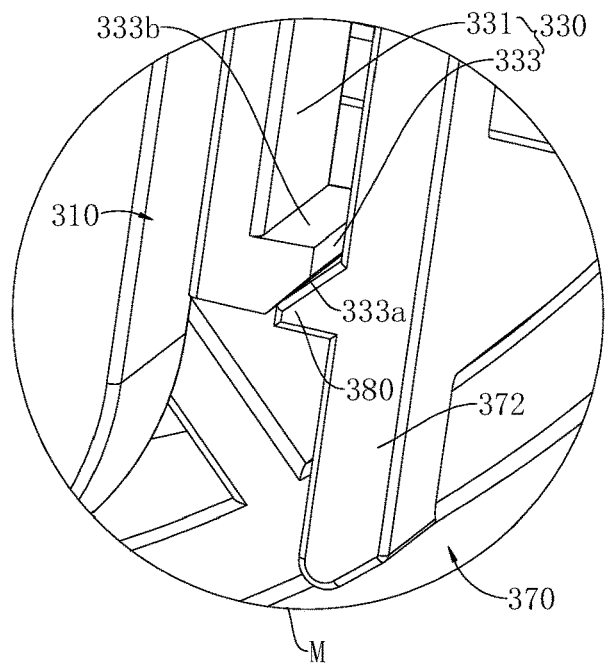
FIG. 18 is a partial enlarged schematic view of the receptacle of FIG. 16 at M.

With reference to FIG. 17 and FIG. 18 altogether, the receptacle housing 302 comprises a receptacle body 370 and a lock-fitting portion 380. The shape and configuration of the receptacle body 370 are only required to be capable of supporting the corresponding connecting terminal 303. In this embodiment, the receptacle body 370 is substantially block-shaped, extending axially and having a chamfered outer circumferential wall.

The lock-fitting portion 380 is provided on the receptacle body 370 and may be integrally assembled with the final lock of locking portion 330 of the secondary lock 301. The specific shape and configuration of the lock-fitting portion 380 are only required to be capable of lock-fitting with the locking portion 330, so that the secondary lock 301 can be longitudinally block-fitted with the receptacle housing 302. In this embodiment, the lock-fitting portion 380 is substantially a similar structure to the latch 333 of the locking portion 330. To enhance the performance in transversely limiting the secondary lock 301, a pair of lock-fitting portions 380 are arranged to be spaced transversely.

To enhance the performance in transversely limiting and retaining the secondary lock 301, in this embodiment, a limiting wall 372 is protrudingly arranged on the receptacle body 370. A pair of the limiting walls 372 are arranged to be transversely spaced to transversely retain the secondary lock 301. The lock-fitting portion 380 is provided on an inner sidewall of the limiting wall 372. The pair of limiting walls 372 are arranged to extend along a longitudinal direction of the lock body 310 to be capable of retaining the longitudinal mounting direction of the secondary lock 301.

To facilitate firmly supporting the connecting terminal 303, a mounting hole 375 extending axially is provided on the receptacle body 370. The mounting hole 375 is configured for accommodating a corresponding connecting terminal 303. In this embodiment, the mounting hole 375 is a through-hole. In this embodiment, 9 mounting holes 375, 375b, 375c, 375d, 375e, 375f, 375g, 375h, 375i are configured for accommodating, in one-to-one correspondence, 9 connecting terminals 303, 303b, 303c, 303d, 303e, 303f, 303g, 303h, 303i.

To facilitate being integrally fastened with the fastener 340 axially, a fastening hole 378 is provided on the receptacle body 370. To further facilitate assembling, a boss 377 that is arranged to protrude axially is provided on the receptacle body 370. The fastening hole 378 is provided on the boss 377. The boss 377 protrudes and extends into the position vacating through-hole 312 of the secondary lock 301. A circumferential wall of the boss 377 is arranged to be spaced from the hole wall of the position vacating through-hole 312. The boss 377 is provided with a step face 379. The step face 379 may abut against a circuit board 360 to thereby support the circuit board 360. In this embodiment, the step face 379 is an annular step face. A bottom end (i.e., free end) of the boss 377 extends through the position vacating through-hole 312 to the step face 379 out of the position vacating through-hole 312. That is, the step face 379 protrudes relative to the secondary lock 101 and extends to support the circuit board 360 (as will be described infra). Of course, the step face 379 may also be flush with the surface of the secondary lock 101, as long as it may have space for bearing the circuit board 360.

To reduce erroneous interference from the external force with the secondary lock 301, which would otherwise affect assembling, the outer circumferential wall 374 of the receptacle body 370 is arranged to protrude along the transverse and longitudinal directions of the lock body 310. Additionally, in this embodiment, the receptacle housing 302 is an integrated injection-molded unit.

Figure 19:
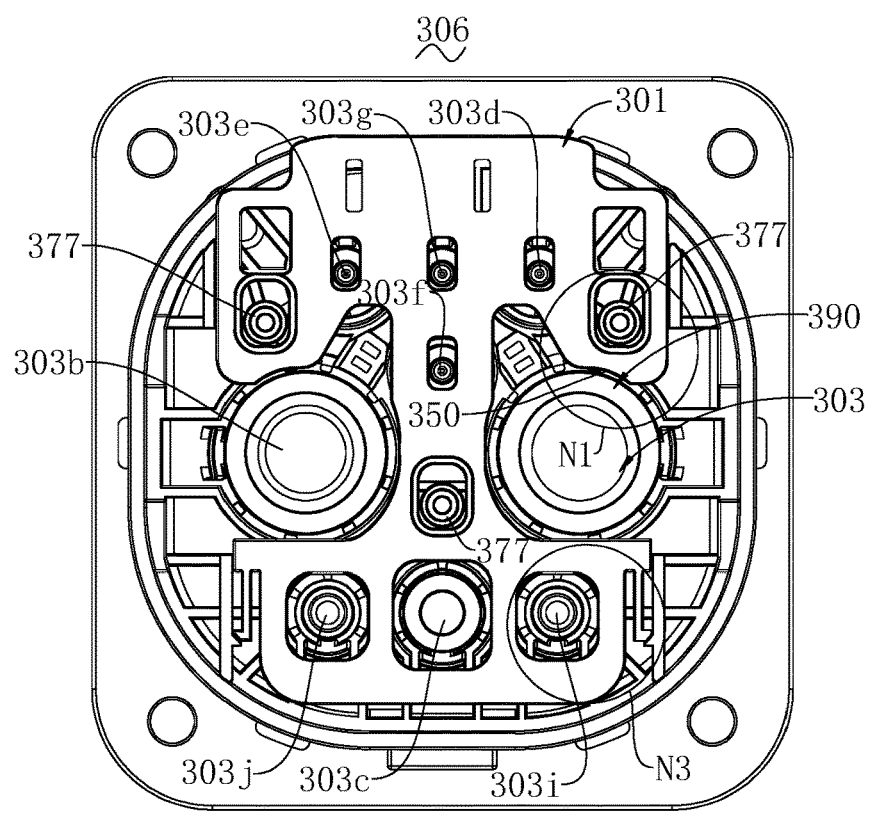
FIG. 19 is a projection schematic diagram of the receptacle of FIG. 16 provided with a connecting terminal taken along a mounting direction of the connecting terminal.
Figure 20:
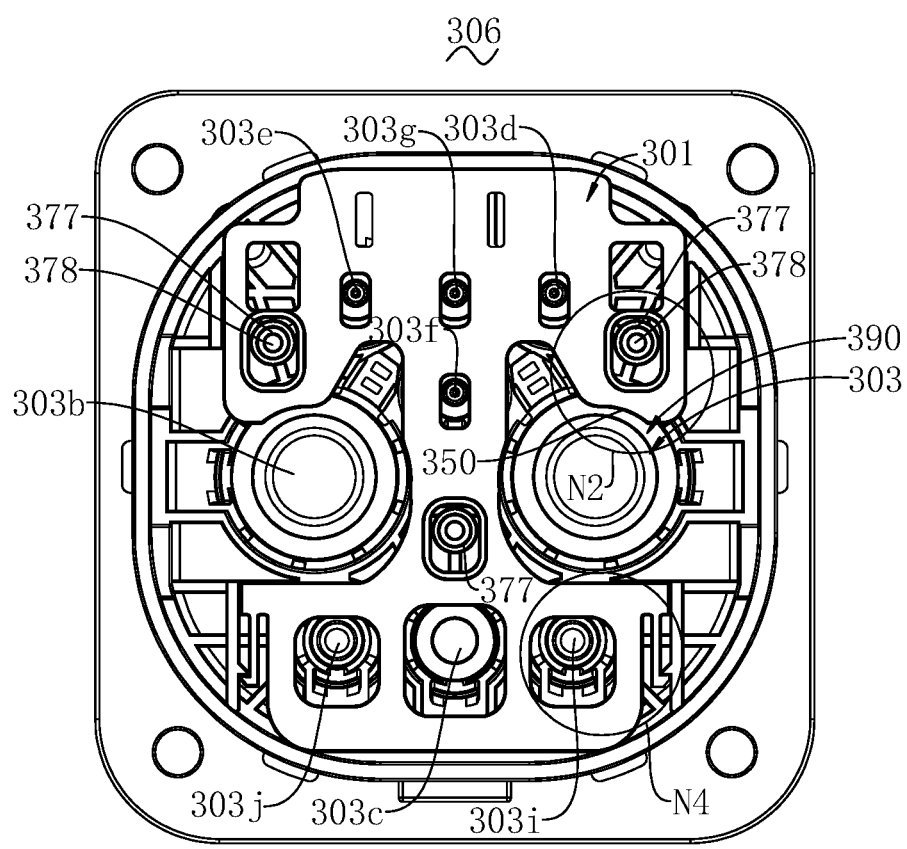
FIG. 20 is a projection schematic diagram of the receptacle of FIG. 19.

With reference to FIGS. 19 and 20, as an embodiment, a receptacle 306 is provided. The receptacle 306 further comprises a connecting terminal 303. The connecting terminal 303 is disposed on the receptacle housing 302 and is arranged to be block-fitted with the secondary lock 301 along the axial direction of the connecting terminal 303.

The connecting terminal 303 is configured for electrically connecting a mating terminal on a charging gun (not shown). The number and distribution of the connecting terminals 303 may be selected as needed. In this embodiment, 9 connecting terminals 303, 303b, 303c, 303d, 303e, 303f, 303g, 303h, 303i are correspondingly mounted on the receptacle housing 302, respectively, to meet corresponding Chinese national standards.

Figure 21:
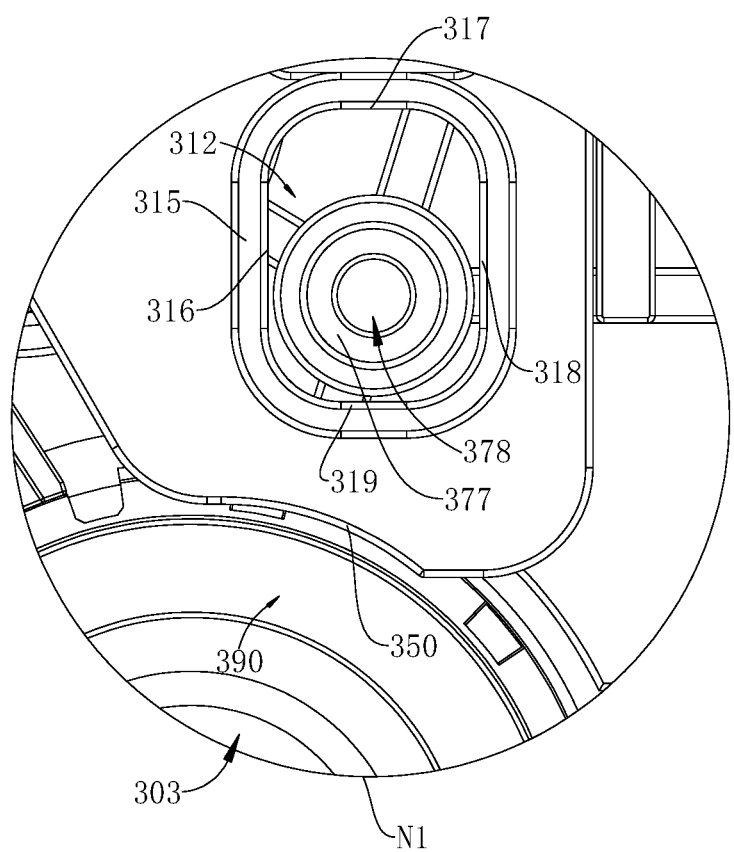
FIG. 21 is a partial enlarged schematic view of the receptacle of FIG. 19 at N1.
Figure 22:
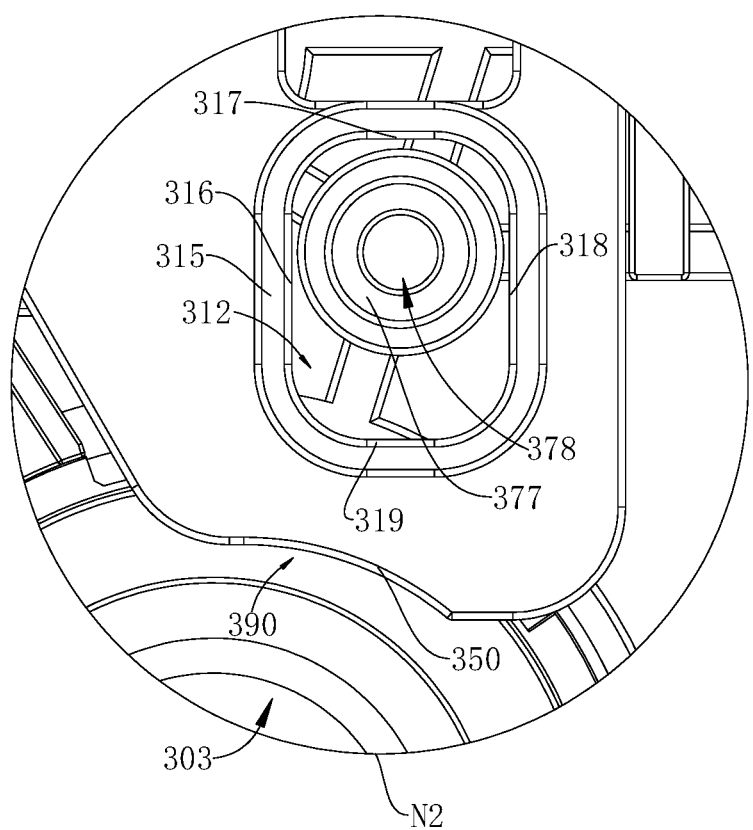
FIG. 22 is a partial enlarged schematic view of the receptacle of FIG. 20 at N2.

With reference to FIGS. 21 and 22 together, a circumferential wall of the connecting terminal 303 is provided with a retaining step 390. FIG. 21 shows that when the secondary lock 301 is in a final locking position relative to the receptacle housing 302, the retaining step 390 may be axially block-fitted with the terminal retaining portion 350.

Figure 23:
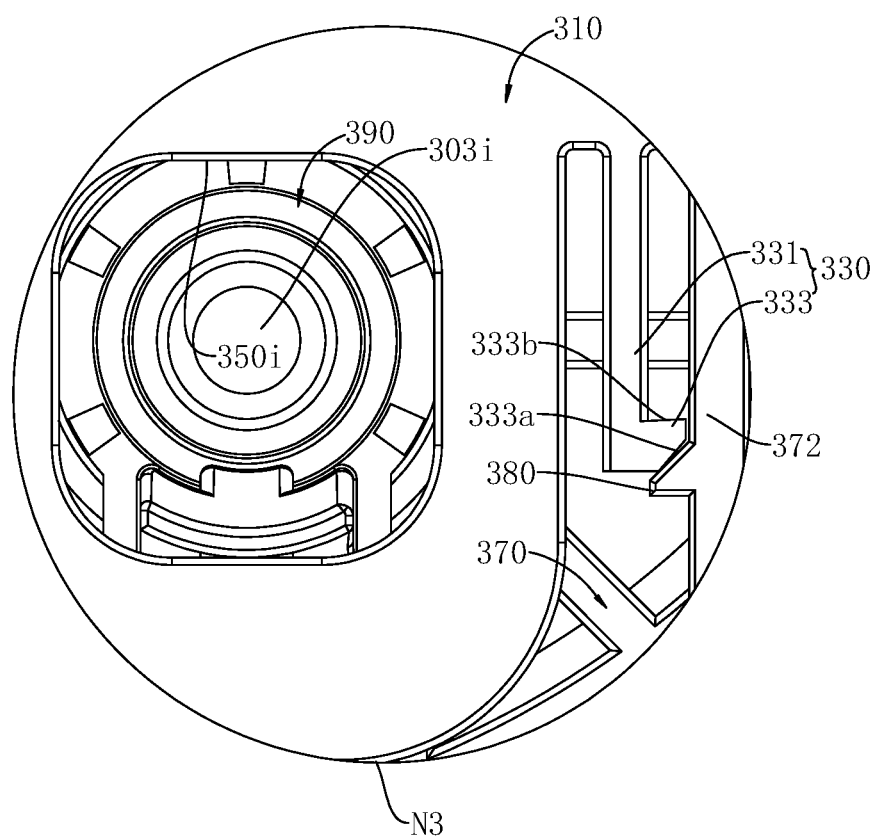
FIG. 23 is a partial enlarged schematic view of the receptacle of FIG. 19 at N3.
Figure 24:
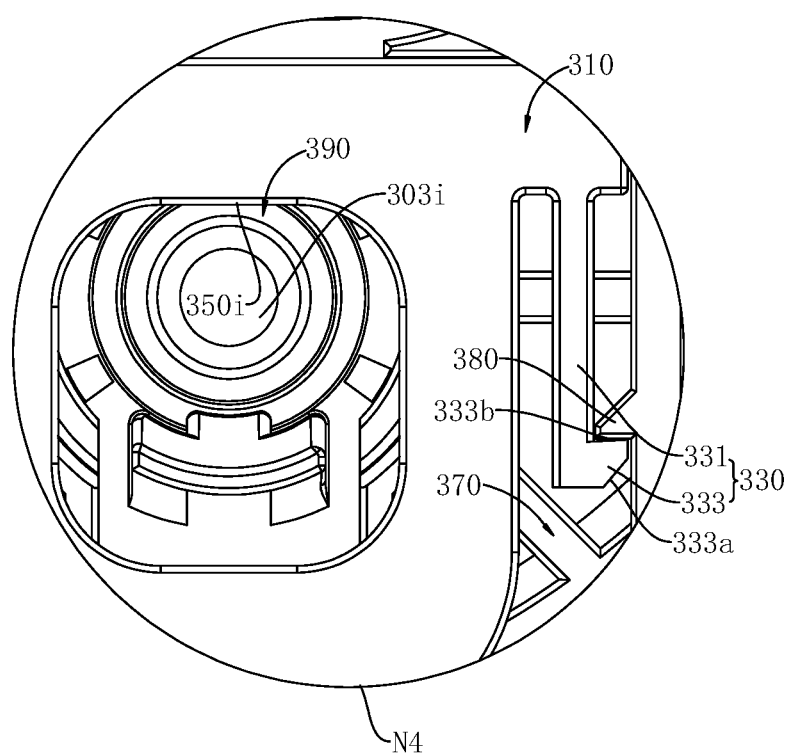
FIG. 24 is a partial enlarged schematic view of the receptacle of FIG. 20 at N4.

With reference to FIGS. 23 and 24 together, the secondary lock 301 moves from the pre-locking position to the final locking position. At this point, the terminal retaining portion 350i moves to at least partially overlap with the retaining step 390 of the connecting terminal 303i so that the connecting terminal 303i may be axially blocked. Correspondingly, the locking portion 330 of the secondary lock 301 is longitudinally block-fitted with the lock-fitting portion 380 of the receptacle housing 302.

Correspondingly, in FIG. 25 below, the connecting terminal 303 is arranged to protrude axially relative to the terminal retaining portion 350; i.e., the connecting terminal 303 is arranged to protrude relative to an upper surface 311 of the lock body 310. A lower surface 313 of the lock body 310 is arranged to face the receptacle housing 302. The connecting terminal 303 may be longitudinally block-fitted with the terminal retaining portion 350 to thereby prevent the secondary lock 301 from being excessively mounted along the mounting direction. Meanwhile, the locking portion 330 is block-fitted with the lock-fitting portion 380, to prevent the terminal retaining portion 350 from retreating longitudinally and thus being released from the block-fitting with the retaining step 390.

Figure 25:
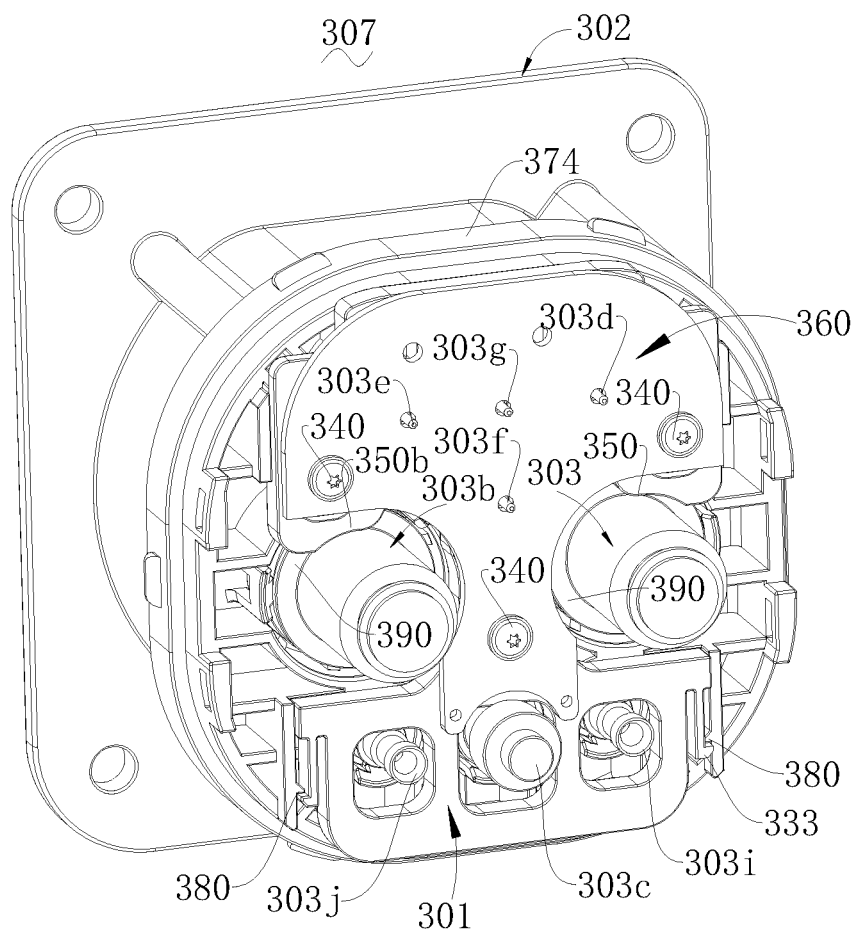
FIG. 25 is a stereoscopic structural schematic view of the receptacle of FIG. 19 provided with a circuit board.

With reference to FIG. 25, as another embodiment, a receptacle 307 is provided. The receptacle 307 further comprises a circuit board 360. The circuit board 360 is arranged on the receptacle housing 302 and may be electrically connected to the connecting terminal 303.

Figure 26:
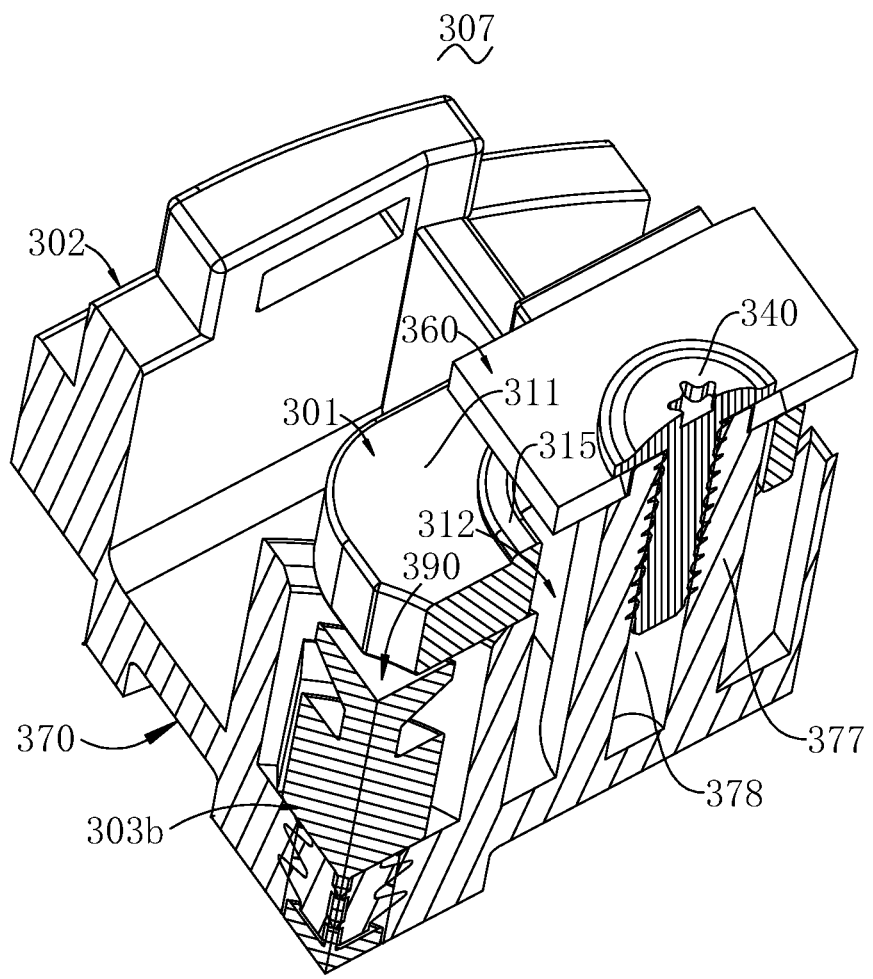
FIG. 26 is a partial stereoscopic sectional view of the receptacle of FIG. 25.
Figure 27:
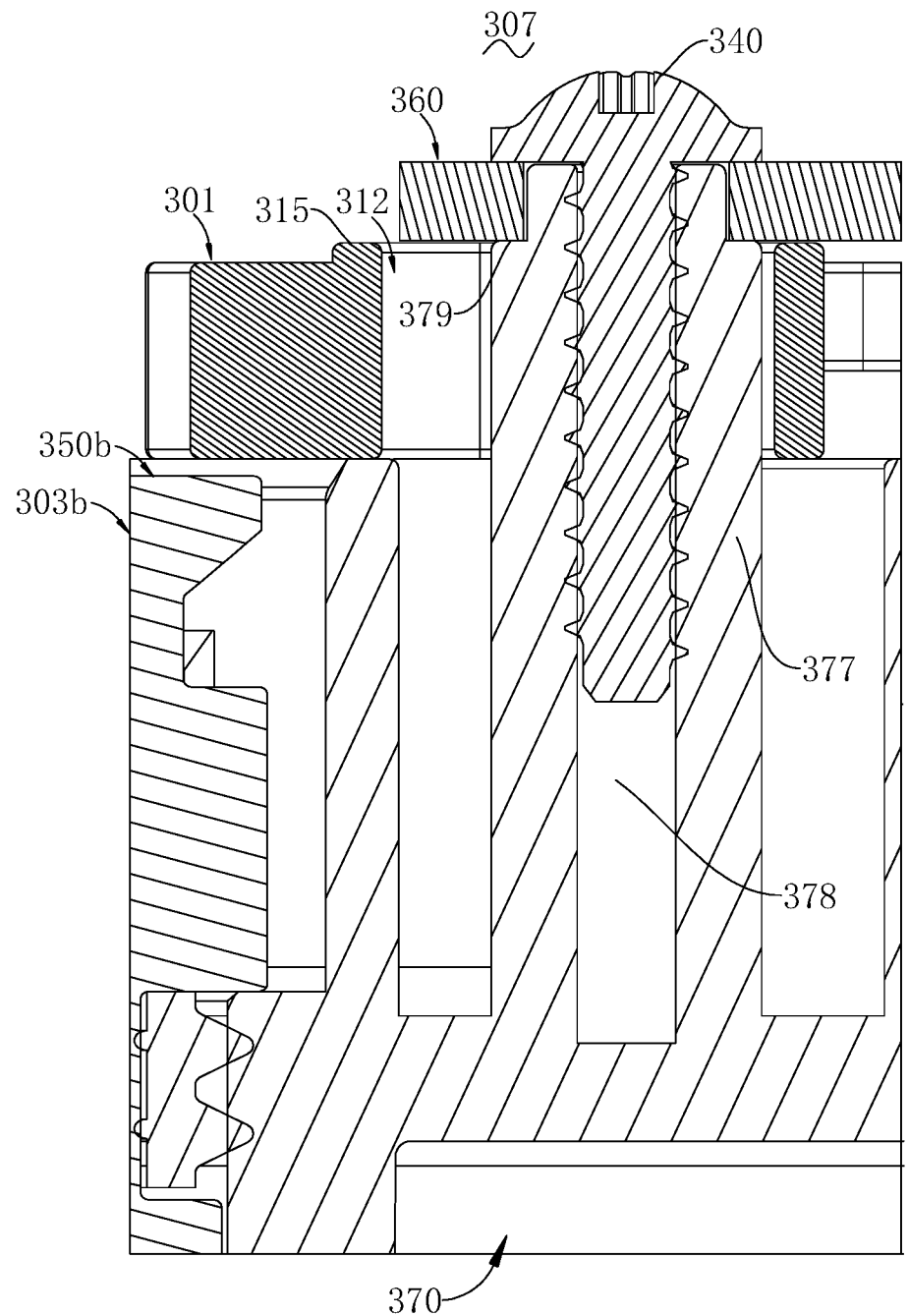
FIG. 27 is a projection schematic diagram of the receptacle of FIG. 25 along a transverse direction.
Figure 28:
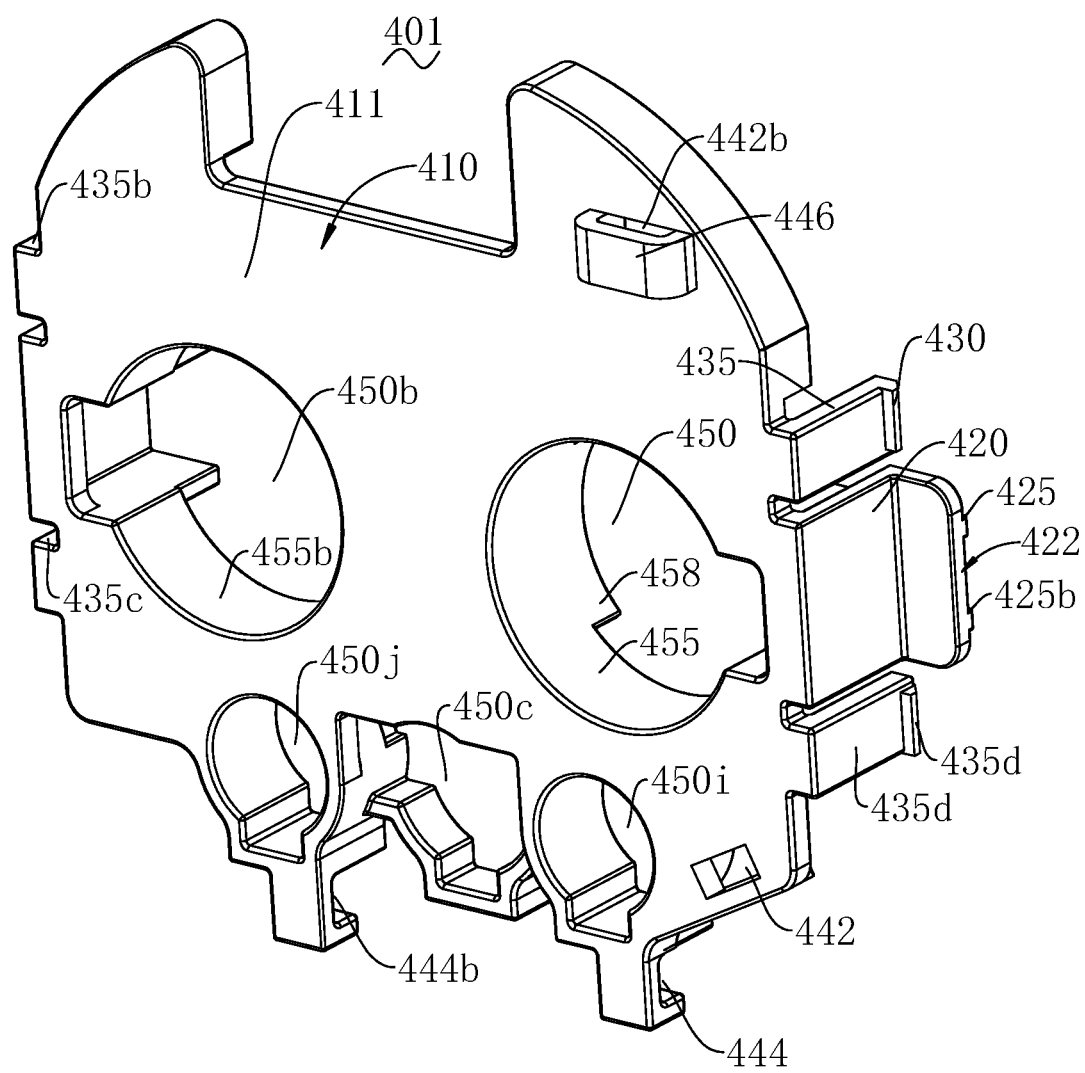
FIG. 28 is a stereoscopic structural schematic diagram of an electric protective cover provided according to the present disclosure.
Figure 29:
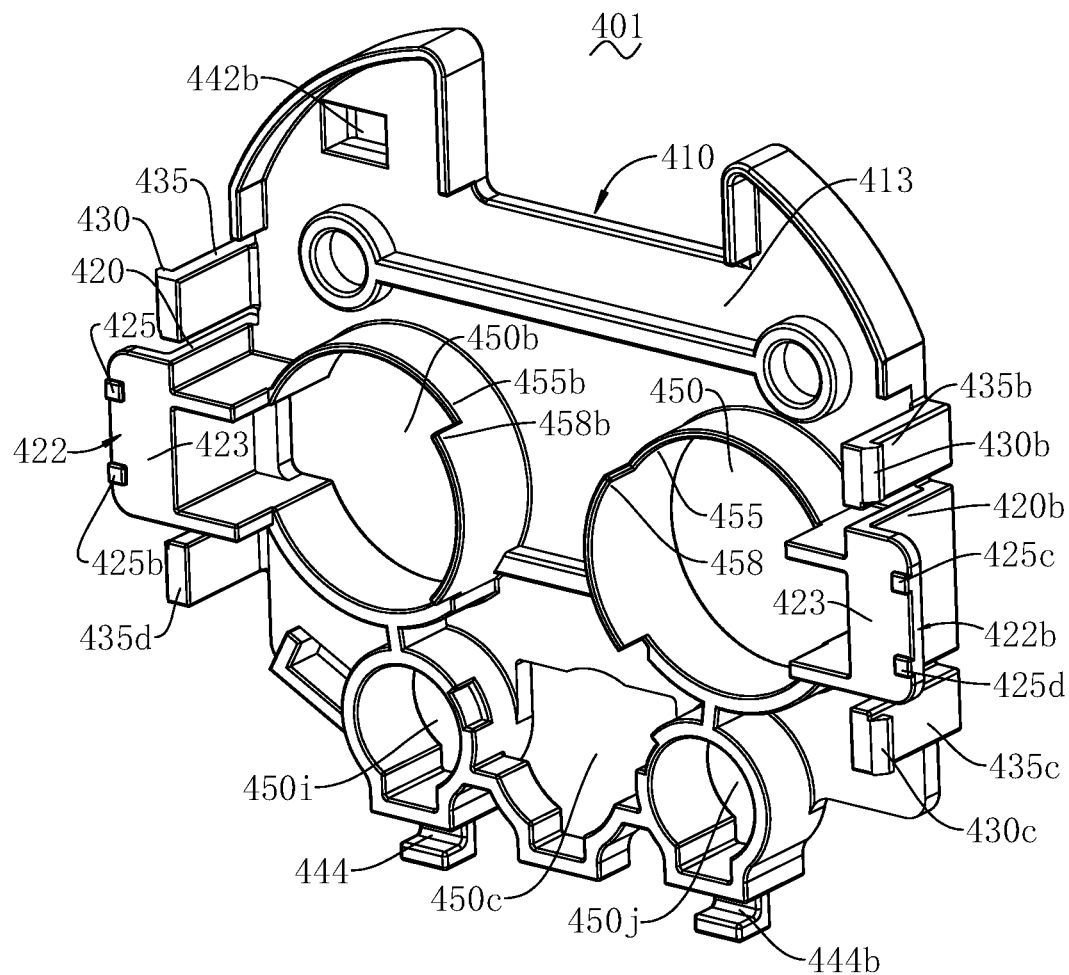
FIG. 29 is a structural schematic diagram of the electric protective cover of FIG. 28 showing a bottom face.
Figure 30:
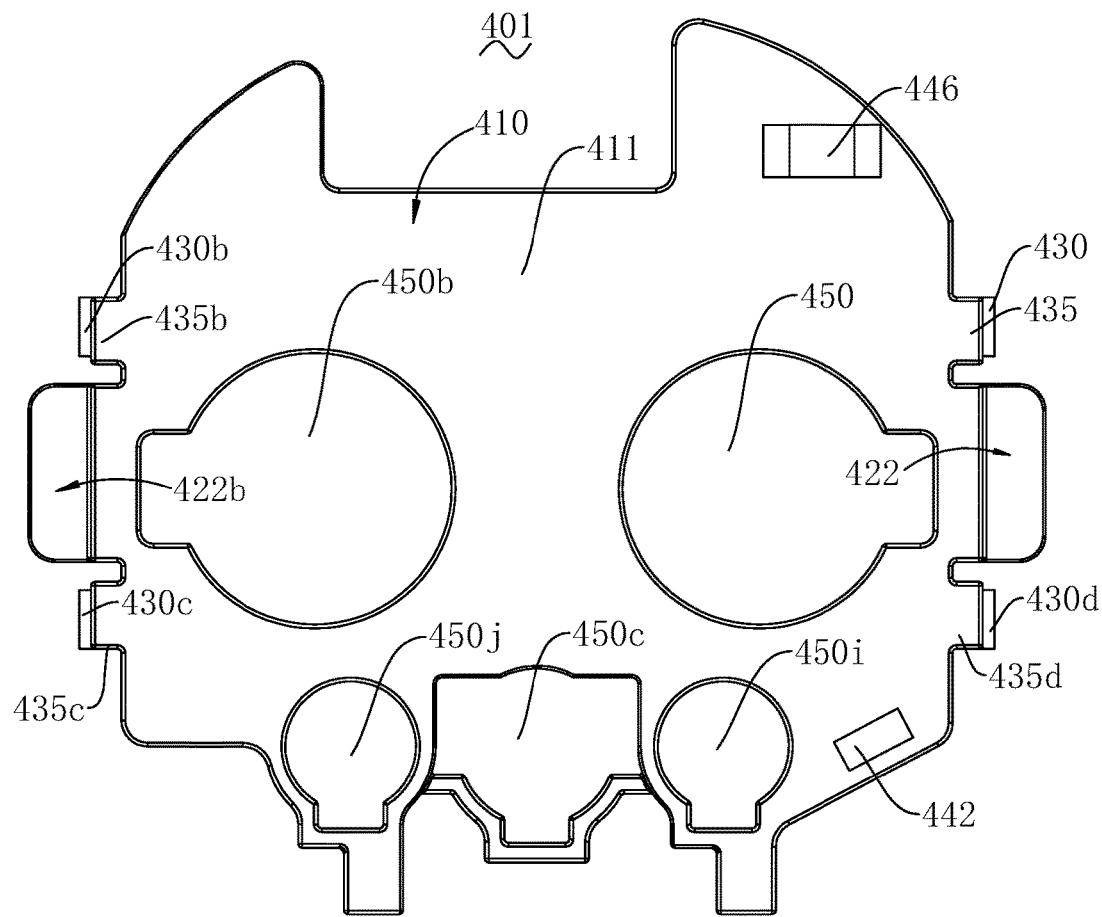
FIG. 30 is a projection schematic diagram of the electric protective cover of FIG. 28 showing a top face.

With reference to FIG. 26 and FIG. 27 together, the circuit board 360 (also referred to as PCB (Printed Circuit Board)) is shown. The circuit board 360 is configured for transmitting at least one of current, voltage, and an electric signal. To enhance the performance in axially limiting and retaining the secondary lock 301 firmly, the circuit board 360 and the receptacle housing 302 are configured to limit the secondary lock 301 in the axial direction of the connecting terminal 303. That is, the secondary lock 301 is disposed between the circuit board 360 and the receptacle housing 302. More specifically, to sufficiently utilize space and to facilitate a corresponding electric connection, the circuit board 360 has a welding face 362 and an element face 364. The welding face 362 is arranged to face an upper surface of the secondary lock 360. That is, the circuit board 360 and the secondary lock 301 are limit-blocked face to face.

To enhance the convenience in mounting the secondary lock 301, the circuit board 360 is arranged to be at least partially axially spaced from the secondary lock 301. Correspondingly, the circuit board 360 may be arranged to contact the support flange 315 of the secondary lock 301.

To further maintain firmly the circuit board 360 integrated with the receptacle housing 302, the fastener 340 is arranged to only integrally assemble the circuit board 360 and the receptacle housing 302. In this embodiment, the fastener 340 is a screw. Of course, the fastener 340 may also be a stud, etc. In this embodiment, the fastener 340 passes through the circuit board 360 successively and is fastened to the fastening hole 378 of the receptacle housing 302. The fastener 340 passes through the position vacating through-hole 312 on the lock body 310.

Preferably, the receptacle housing 302 is an electric vehicle charging receptacle housing. Correspondingly, the receptacles 305, 306, 307 are electric vehicle charging receptacles. The plug refers to a charging gun fitted with the electric vehicle charging receptacle. Correspondingly, the connecting terminal 303 is a female terminal. The mating terminal is a male terminal.

It needs to be noted that, unless otherwise indicated, the term "transverse" appearing in contents regarding the secondary lock 301 and the receptacles 305, 306, 307 refers to the left-right direction of the secondary lock 301 in FIG. 15. The term "longitudinal" refers to the top-down direction shown in FIG. 15. The direction in which the secondary lock 301 is mounted onto the receptacle housing 302 is the direction from the top down as shown in FIG. 15, i.e., the direction indicated by arrow T1. The term "axial direction" refers to the axial direction of the connecting terminal, and is the mounting direction of the connecting terminal 303, i.e., the direction perpendicular to the plane in FIG. 15. The terms "inner" and "outer" are relative concepts, and mean that the direction closer to the left and right sides is "inner." The above directional definitions mentioned herein are all relative concepts, and are only intended to facilitate understanding the relative positions of various parts in conjunction with the accompanying drawings.

Compared with the prior art, the secondary lock 301 of the present disclosure may be pre-assembled on the receptacle housing 302 to maintain integration and facilitate transportation. The secondary lock 301, when being mounted onto the receptacle housing 302 along a preset longitudinal direction, may be block-fitted with the receptacle housing 302 via the locking portion 330 to maintain integrated and to retain the terminal retaining portion 350 in a position to block and retain the connecting terminal 303, so that the terminal retaining portion 350 may be block-fitted with the connecting terminal 303 along the axial direction of the connecting terminal 303.

With reference to FIGS. 28 to 31, an electric protective cover 401 provided according to the present disclosure is shown. The electric protective cover 401 is configured for protecting corresponding components on the receptacle 409. The electric protective cover 401 comprises a cover body 410, a mounting portion 430 provided on the cover body 410 to be mountable onto the housing 402, and an accommodating hole 450 provided on the cover body 410 to be capable of accommodating the connecting terminal 403.

The cover body 410 is configured for covering the circuit board 460 to protect the circuit board 460 and the corresponding electronic components (not shown) provided on the circuit board 460. The specific shape, configuration, and disposition manner of the cover body 410 are only required to be capable of partially or completely protecting the circuit board 460. The cover body 410 extends along the radial direction of the receptacle 405 to cover the circuit board 460 disposed at an axial end of the housing 402. It may also be understood that the cover body 410 extends along the transverse and longitudinal directions of the housing 402. Any two of the axial direction, transverse direction, and longitudinal direction of the housing 402 are perpendicular to each other. In this embodiment, to sufficiently save space, the cover body 410 is substantially plate-shaped. To further enhance the protection of the circuit board 460 and to provide space for accommodating the electronic components, the cover body 410 is arranged to be spaced apart from an upper surface 461 of the circuit board 460 along the direction of the electric protective cover 401.

The mounting portion 430 is arranged on the cover body 410 to mount the electric protective cover 401 onto a housing 402 (as will be described infra). The specific shape and configuration of the mounting portion 430 are only required to implement the corresponding mounting. That is, the mounting portion 430 may be plugged, hinged or the like with the housing 402. In this embodiment, the mounting portion 430 is a snap-joint, which may be snap-fitted with the housing 402 and assembled integrally therewith. Specifically, the mounting portion 430 is provided on a support cantilever 435 (as will be described infra). In this embodiment, four of the mounting portions 430 are arranged to protrude outwards. The number and distribution of the mounting portions 430 may be selected according to needs of an application. In this embodiment, two of the mounting portions 430, 430d are provided on a sidewall of the cover body 410. The other two mounting portions 430b, 430c are provided on the other sidewall of the cover body 410.

To facilitate demounting the mounting portion 430, a support cantilever 435 is provided on the cover body 410. The support cantilever 435 is arranged to extend continuously along the mounting direction of the electric protective cover 401. The support cantilever 435 is provided on a sidewall of the cover body 410. Correspondingly, four support cantilevers 435, 435b, 435c, 435d are arranged for supporting corresponding mounting portions 430, 430b, 430c, 430d, respectively.

The accommodating hole 450 is provided on the cover body 410, and may be configured for accommodating the connecting terminal 403. The number and distribution of the accommodating holes 450 may be selected according to needs. In this embodiment, five accommodating holes 450, 450b, 450c, 450j, 450i are arranged for accommodating corresponding connecting terminals 403, 403b, 403c, 403j, 403i. In this embodiment, a through-hole of the accommodating hole 450 is arranged to run through along a mounting direction of the electric protective cover 401. The accommodating holes 450, 450b are enclosed by corresponding hole walls 455, 455b.

To enhance the performance of the accommodating holes 450, 450b in isolating and protecting the circuit board 460 from the connecting terminals 403, 403b, isolating walls 458, 458b are provided on the hole walls 455, 455b. The isolating walls 458, 458b are arranged to protrude along the mounting direction of the electric protective cover 401. The hole walls 455, 455b are arranged to extend along a circumferential direction of the connecting terminal 403, 403b.

To lay out the wires (not shown) orderly, a lead through-hole 442 is provided on the cover body 410. The lead through-hole 442 is arranged to run through along a mounting direction of the electric protective cover 401. The number and distribution of the lead through-holes 442 may be selected as needed, as long as they may facilitate corresponding wires to penetrate through the upper and lower sides of the cover body 410.

Further, a lead groove 444 is provided on the cover body 410. The lead groove 444 is arranged for retaining the wires. In this embodiment, the lead groove 444 is provided on a sidewall of the cover body 410. Further, an opening of the lead groove 444 faces towards the mounting direction of the electric protective cover 410.

Further, a lead through-hole 442b is provided on the cover body 410. A retaining arm 446 is provided on the cover body 410. The retaining arm 446 is disposed above the lead through-hole 442b and extends in an arched shape.

Therefore, the lead through-hole 442, the lead groove 444, and the retaining arm 446 disposed above the lead through-hole 442b are embodiments of the wire retaining part, respectively, for harnessing and guiding corresponding wires.

To be capable of firmly retaining a seal ring 404 (as will be described infra) on the housing 402, a limiting arm 420 is provided on the cover body 410. The limiting arm 420 is arranged to be contactable with the seal ring 404 on the charging receptacle housing 402. In this embodiment, the limiting arm 420 has a base plate 422. A boss 425 is provided on a bottom face of the base plate 422. In this embodiment, the boss 425 directly abuts against the real ring 404.

To enhance the stable performance, the electric protective cover 401 is an integrated unit. In this embodiment, to ease manufacturing and to facilitate electric insulation, the electric protective cover 401 is an injection-molded unit.

Figure 32:
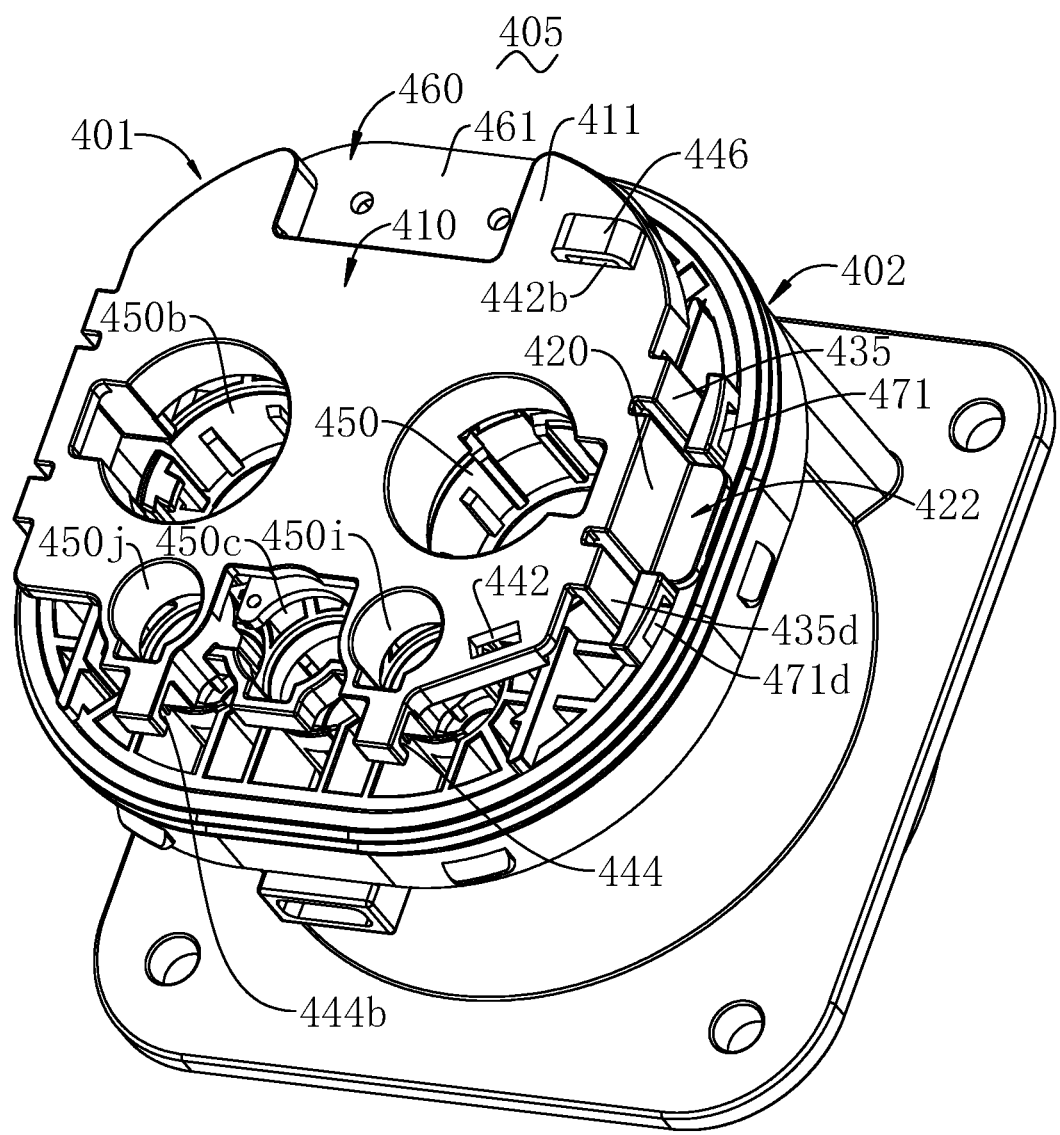
FIG. 32 is a stereoscopic structural schematic view of a receptacle provided according to the present disclosure.
Figure 33:
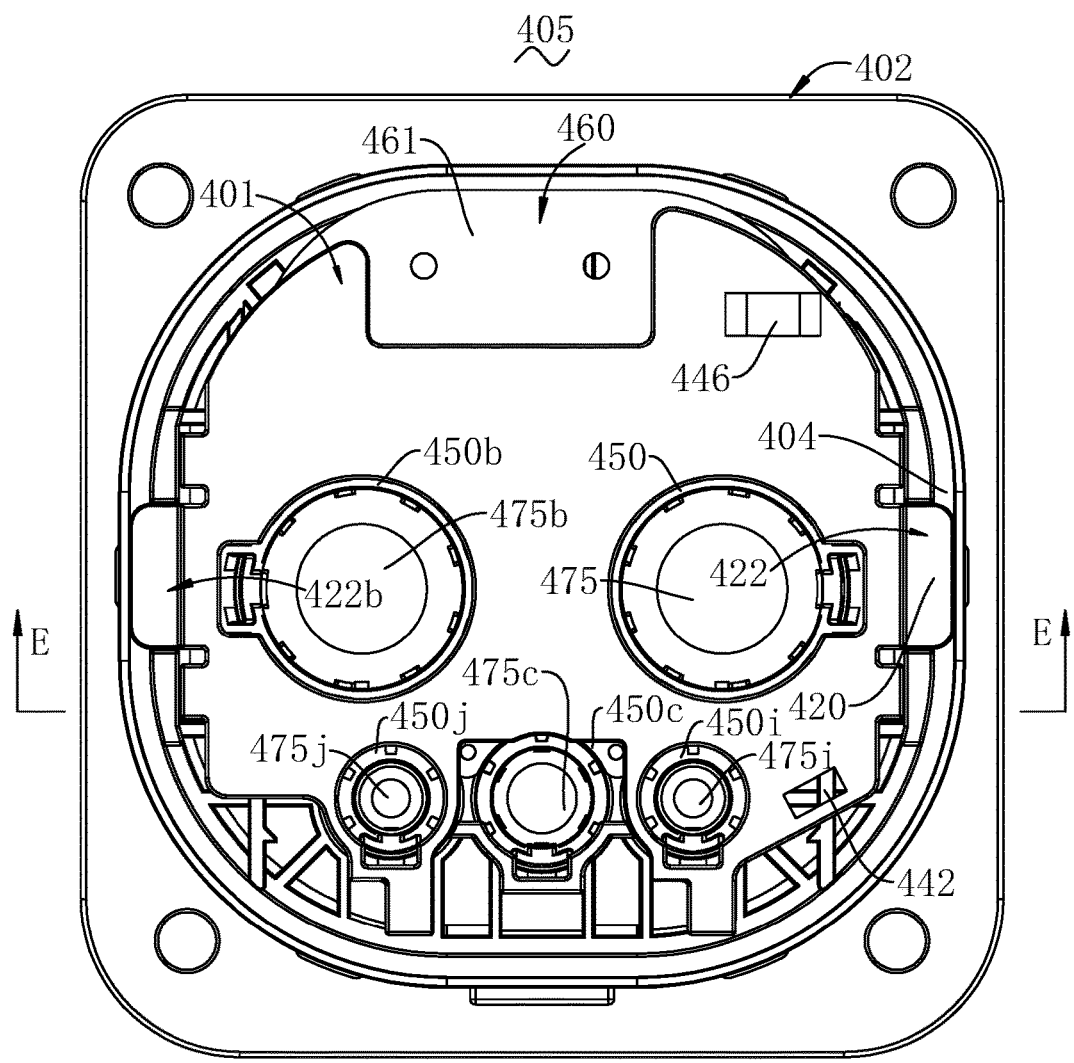
FIG. 33 is a projection schematic diagram of the receptacle of FIG. 32 along a mounting direction of the electric protective cover.
Figure 34:
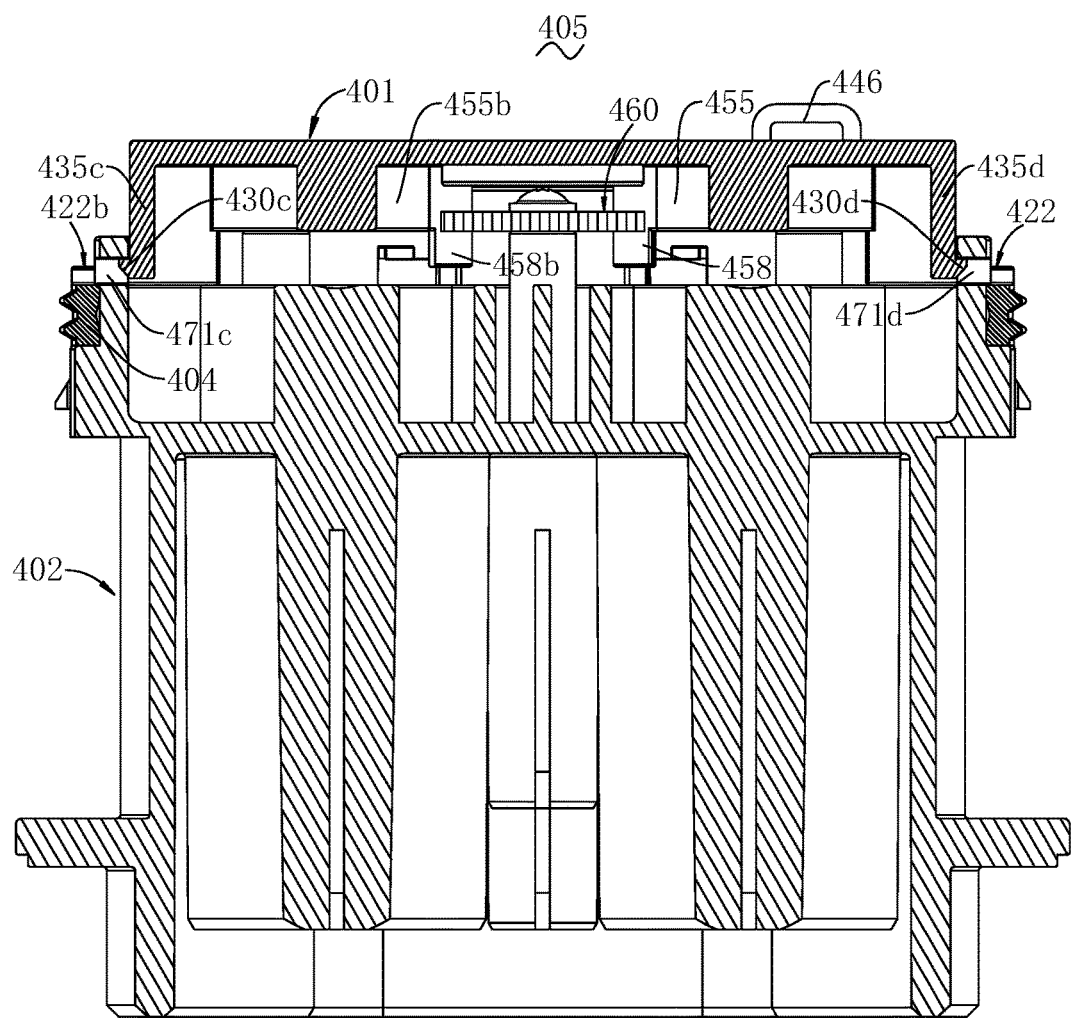
FIG. 34 is a sectional view of the receptacle of FIG. 33 along line E-E.

With reference to FIGS. 32 to 34, a receptacle 405 is provided according to the present disclosure. The receptacle 405 comprises a housing 402, a circuit board 460, and the electric protective cover 401 described in the foregoing embodiments. The circuit board 460 is disposed on the housing 402. The electric protective cover 401 covers the circuit board 460.

The specific shape and configuration of the housing 402 are only required to be capable of supporting the corresponding circuit board 460. In this embodiment, the housing 402 is substantially block-shaped. Further, to support the corresponding connecting terminal 403, a corresponding mounting hole 475 is provided on the housing 402. In this embodiment, the mounting hole 475 is a through-hole arranged to run through along a mounting direction of the electric protective cover 401. The mounting hole 475 and the accommodating hole 450 are only required to one-to-one correspond to and accommodate the corresponding connecting terminals 403; i.e., the mounting hole 475 is arranged to communicate with the accommodating hole 450. In this embodiment, the mounting hole 475 is arranged to be axially aligned with the accommodating hole 450. In this embodiment, FIG. 33 shows 5 mounting holes 475, 475b, 475c, 475i, 475j to correspondingly accommodate the connecting terminals 403, 403b, 403c, 403i, 403j (as will be described infra).

To facilitate snap-fit with the electric protective cover 401, a snap-fitting portion 471 is provided on the housing 402. The snap-fitting portion 471 may be snap-fitted with the mounting portion 430 which is a snap-joint. In this embodiment, the snap-fitting portion 471 is a snap-fitting hole. Of course, the snap-fitting portion 471 may also be a snap-fitting cavity.

To enhance the sealing and waterproof performance between the housing 402 and a mating housing 407 (as will be described infra), the receptacle 405 further comprises a seal ring 404. The seal ring 404 is disposed on the housing 402. Specifically, the seal ring 404 is attached onto an outer circumferential wall of a bottom end of the housing 402. The seal ring 404 may be a rubber ring. The seal ring 404 may abut against an outer circumferential wall of the top end of the housing 202, thereby enhancing the sealing and waterproof performance.

Figure 35:
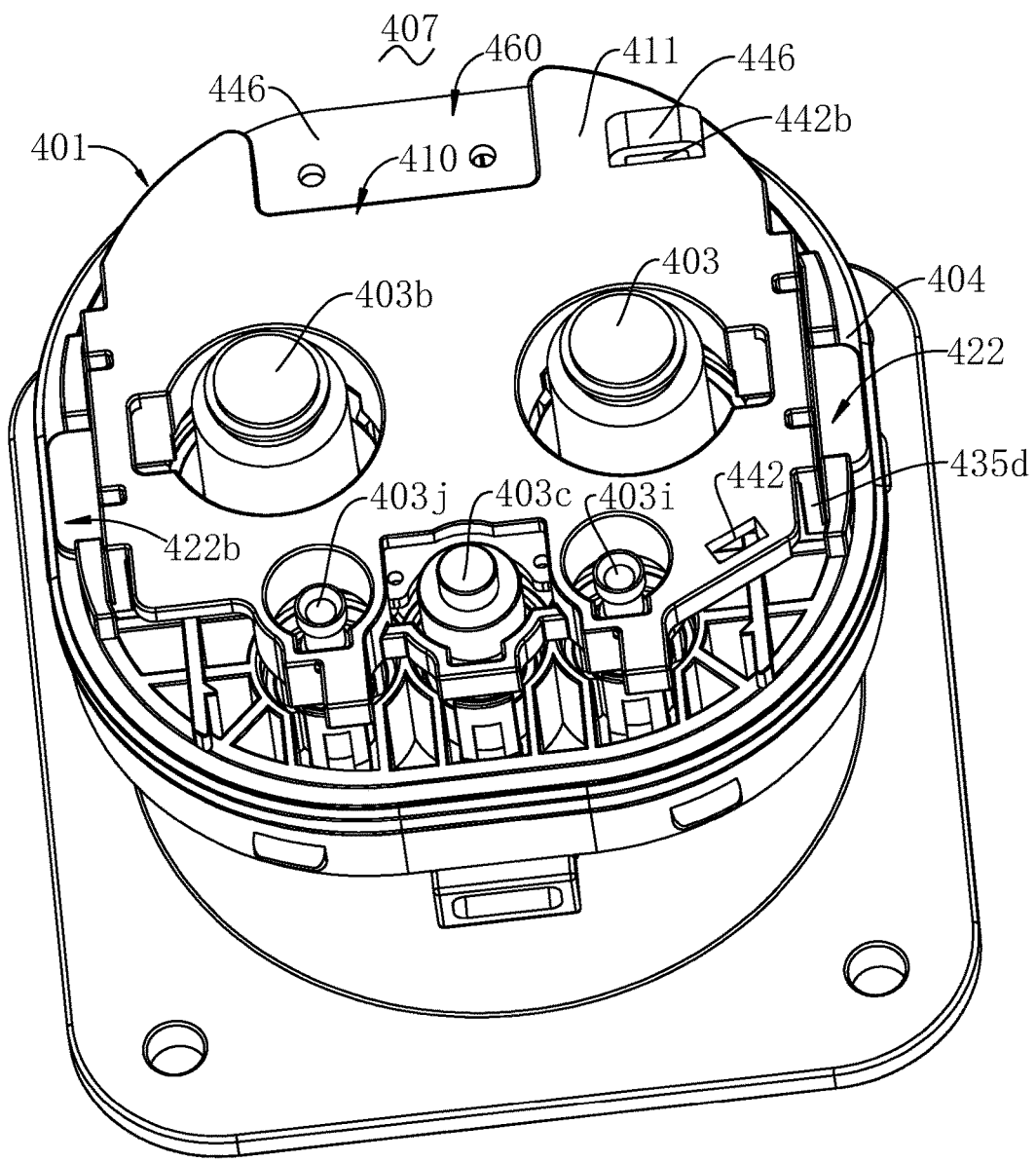
FIG. 35 is a stereoscopic structural schematic view of the receptacle of FIG. 32 provided with a connecting terminal.
Figure 36:
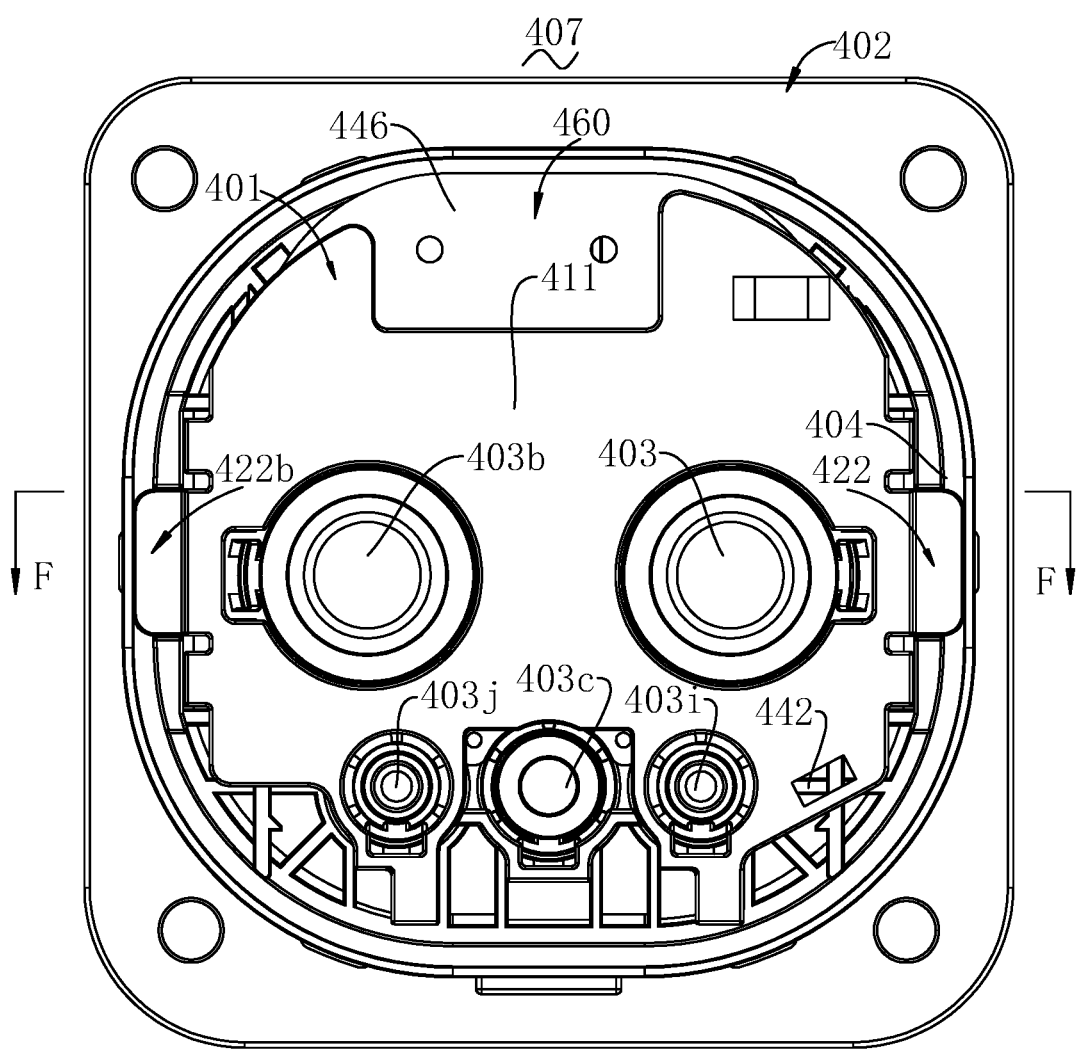
FIG. 36 is a projection schematic diagram of the receptacle of FIG. 35 along a mounting direction of the electric protective cover.
Figure 37:
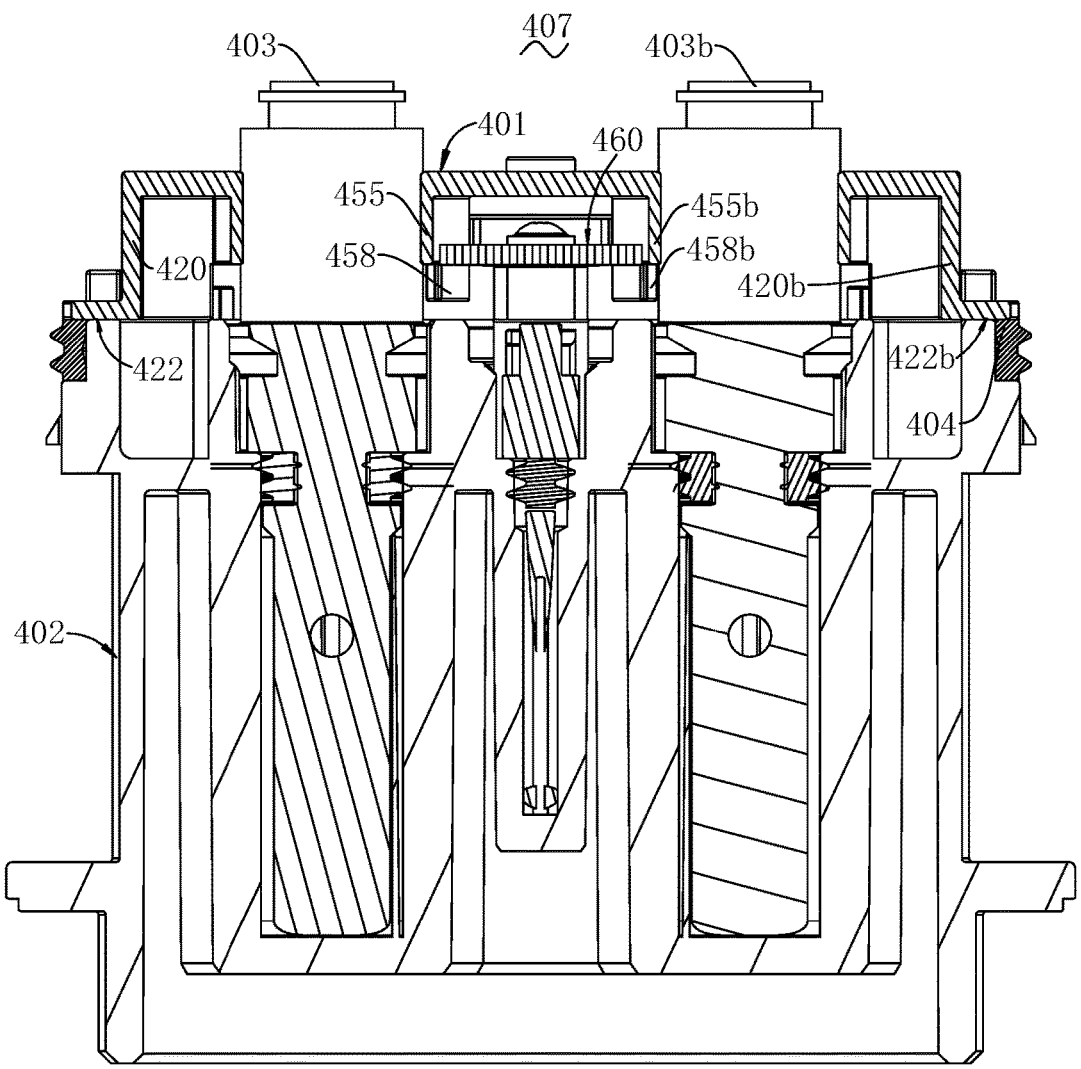
FIG. 37 is a sectional view of the receptacle of FIG. 36 along line F-F.

With reference to FIGS. 35 to 37, the receptacle 407 further comprises a connecting terminal 403 to facilitate a corresponding electrical connection. The connecting terminal 403 is provided on the housing 402 and may extend along a direction opposite to the mounting direction of the electric protective cover 401 into the accommodating hole 450. In this embodiment, at least part of the connecting terminal 403 is arranged in the mounting hole 475. Particularly, some of the connecting terminals 403 are isolated from the circuit board 460 by the isolating walls 458, 485b, thereby enhancing the safety performance. In this embodiment, 5 connecting terminals 403, 403b, 403c, 403i, 450j are accommodated, in one-to-one correspondence, in the mounting holes 475, 475b, 475c, 475i, 475j, respectively.

FIG. 37 shows that top ends of the connecting terminals 403, 403b extend into the accommodating holes 450, 450b. The isolating walls 458, 458b separately extend to surpass the bottom face of the circuit board 475 and are disposed at two transverse sides of the circuit board 475, thereby isolating the connecting terminals 403, 403b from the circuit board 460.

Figure 38:
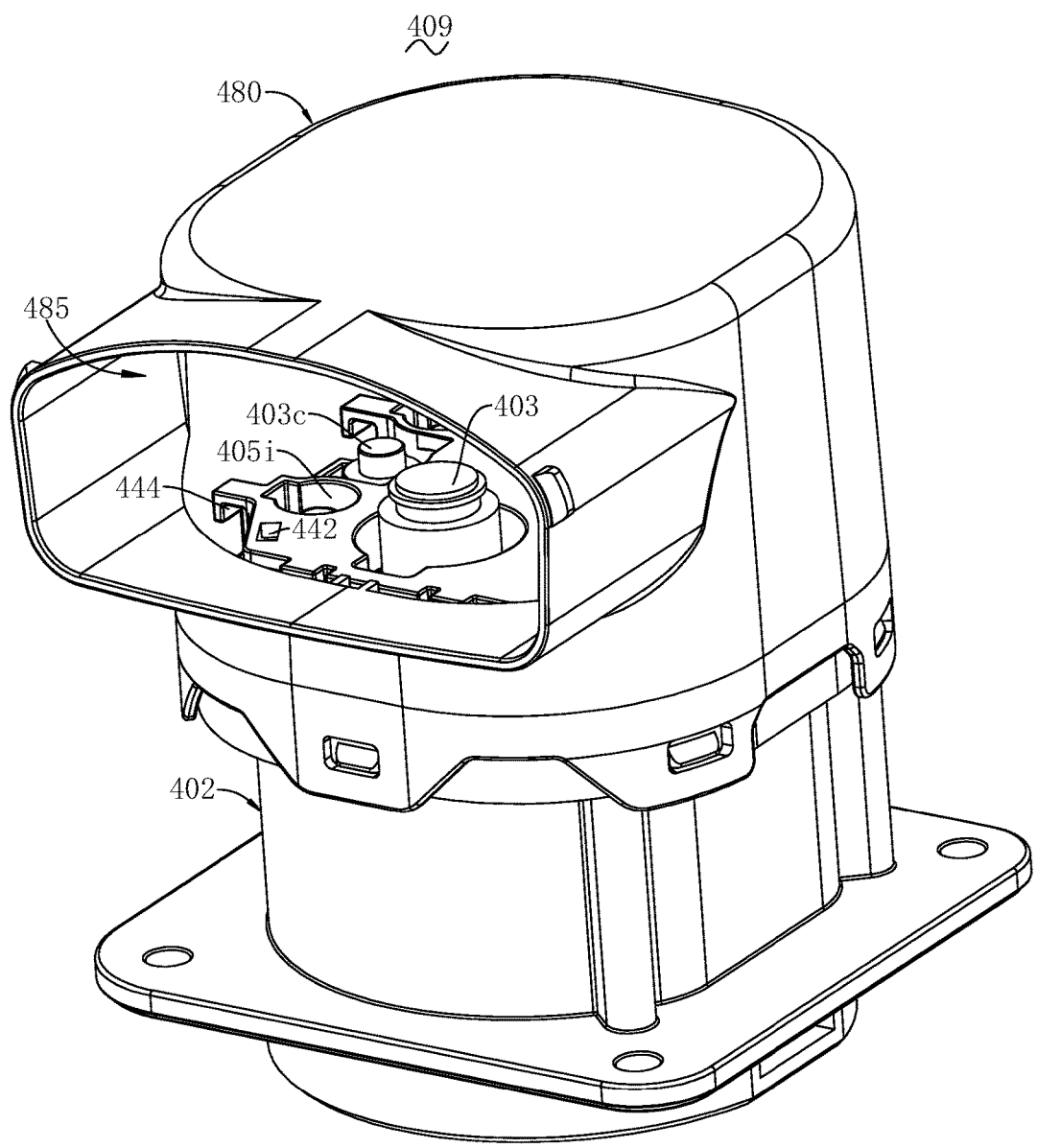
FIG. 38 is a stereoscopic structural schematic view of the receptacle of FIG. 35 provided with a mating housing.

With reference to FIG. 38, another type of receptacle 409 is provided according to the present disclosure. Different from the foregoing embodiments, the receptacle 409 further comprises a mating housing 480. The mating housing 480 is configured for providing protection and support for the mating terminal (not shown). The mating housing 480 is arranged on the housing 402. The mating housing 480 has an accommodating cavity 485. The accommodating cavity 485 is configured for accommodating the electric protective cover 401. That is, the mating housing 480 and the housing 402 are integrally assembled to provide protection and support for other components. An inner sidewall of the mating housing 480 is in sealing contact with the seal ring 404, thereby achieving the sealing and waterproof performance of the mating housing 480. To enhance the performance in the firmly and integrally assembling, the mating housing 480 is snap-fitted to the housing 402 through a snap-joint (not shown) to maintain integrated.

The above structural configurations of the receptacles 405, 407, and 409 are particularly suitable for charging electric vehicles, which then may be receptacles useful for charging electric vehicles, to be mated with a corresponding charging gun. Particularly, the isolating walls 458 and 458b may isolate electromagnetic interference with the circuit board 460 caused by connecting terminals 403, 403b which conduct a relatively large current.

Figure 31:
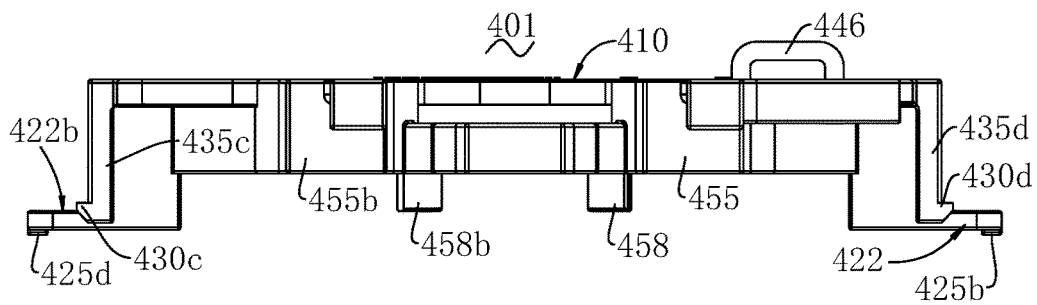
FIG. 31 is a bottom view of the electric protective cover of FIG. 30.

It needs to be noted that unless otherwise indicated, the mounting direction in which the electric protective cover 401 is mounted onto the housing 402, as mentioned in the contents regarding the electric protective cover 401 and the receptacle 405, etc. disclosed herein, refers to the axial direction of the connecting terminal 403, i.e., the direction from the top down shown in FIG. 31. The transverse direction refers to the left-right direction in FIG. 30; the longitudinal direction refers to the top-down direction in FIG. 30; and two sides refer to the left and right sides in FIG. 30. Additionally, "upper and lower," "left and right," and "top and bottom" are all relative concepts. The directional definitions mentioned above are only intended to facilitate understanding the relative positions of various parts in conjunction with the accompanying drawings.

Compared with the prior art, the electric protective cover 401 of the present disclosure may be conveniently and quickly mounted onto the housing 402 through the mounting portion 430, and the cover body 410 provide protection for the circuit board disposed on the housing 402 and the components on the circuit board. Preferably, by means of a limiting arm 420, the electric protective cover 401 may prevent the seal ring 404 on the housing 402 from falling off, thereby facilitating assembly. Preferably, the electric protective cover 401 enables the wires to be harnessed and guided by means of the wire retaining parts such as the through-hole 442, the guide groove 444, the limiting arm 420 and the like, thereby preventing messy layout of the circuit and occurrence of waggling. Preferably, an isolating wall 458 is provided to protrude from the hole wall of the accommodating hole of the electric protective cover, thereby providing an electromagnetic isolation and avoiding electromagnetic interference generated between the circuit board and the connecting terminal 403 when a relatively large current flows through, and thereby enhancing safety performance.

Figure 39:
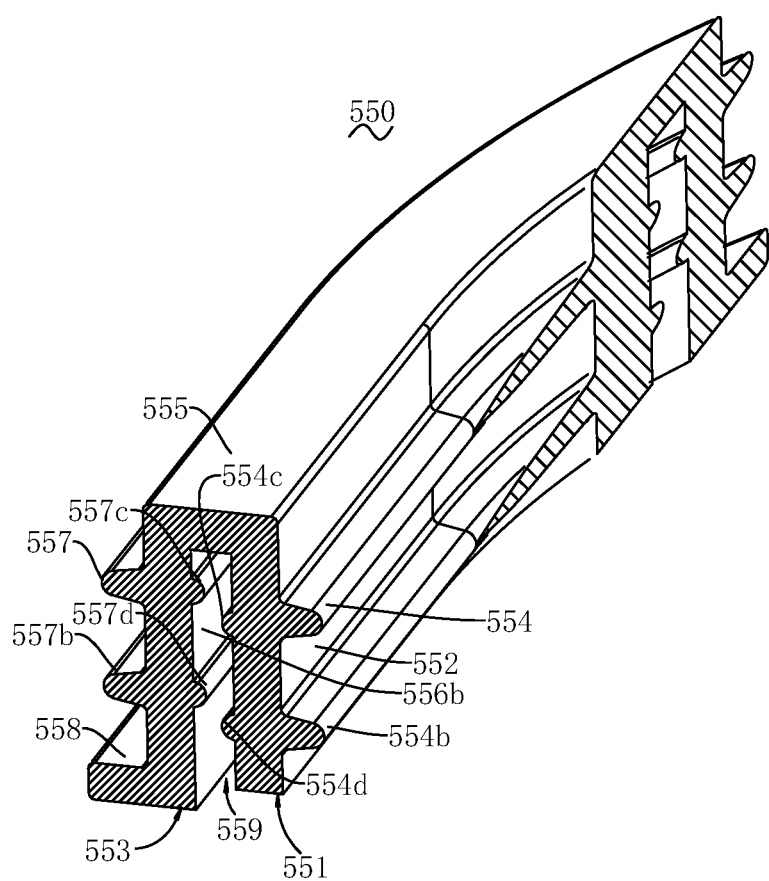
FIG. 39 is a stereoscopic local sectional view of a sealing ring provided according to the present disclosure.
Figure 40:
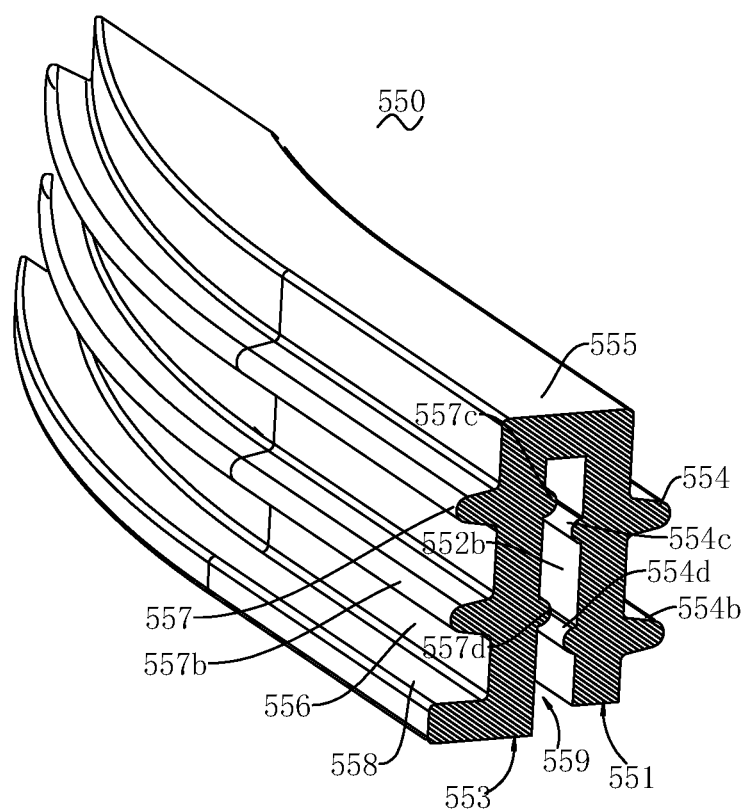
FIG. 40 is a stereoscopic partial sectional view of the sealing ring of FIG. 39 from another visual angle.
Figure 41:
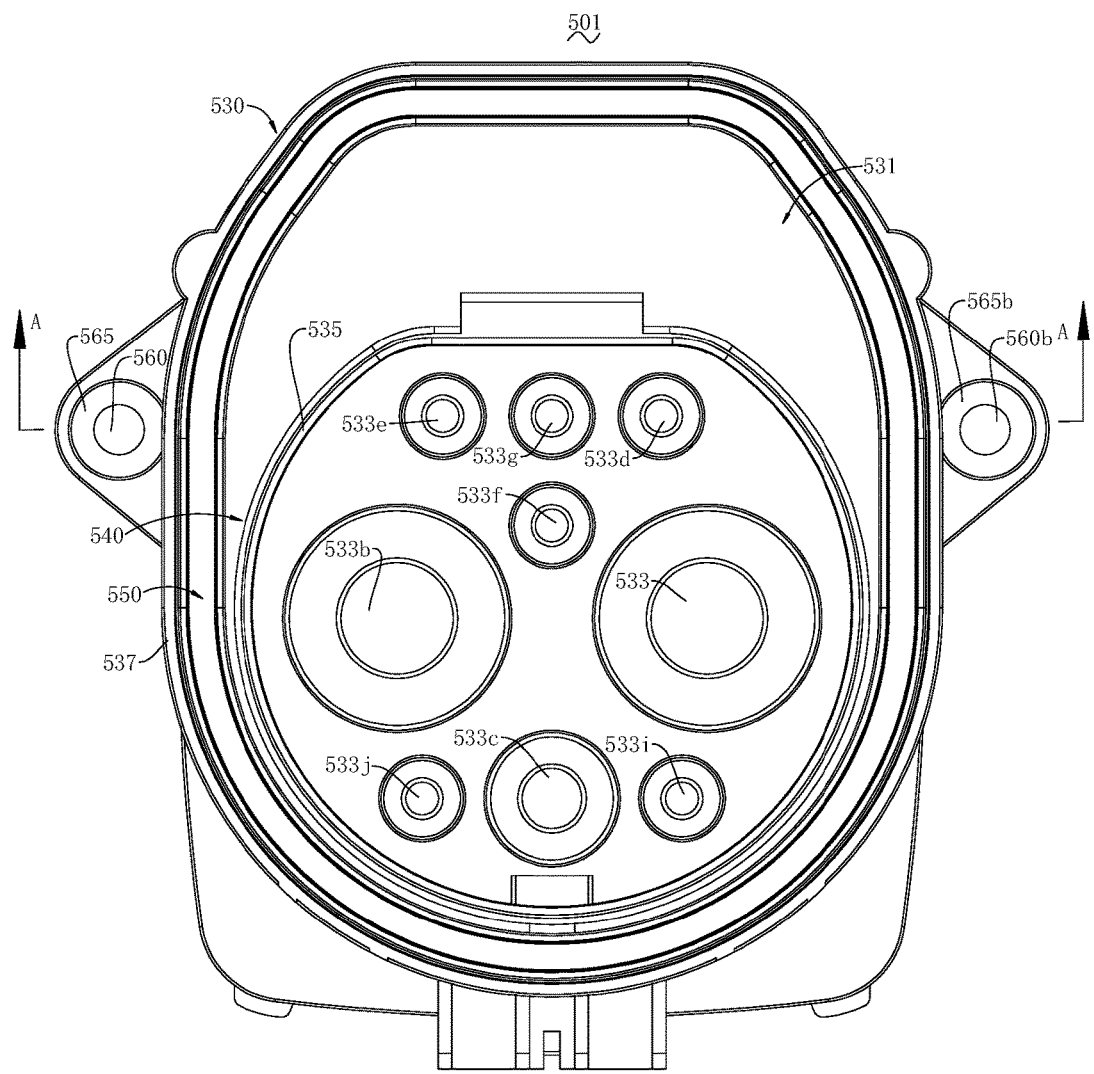
FIG. 41 is a projection schematic view of a sealing assembly provided according to the present disclosure from a direction opposite to the mounting direction of the connecting terminal.
Figure 42:
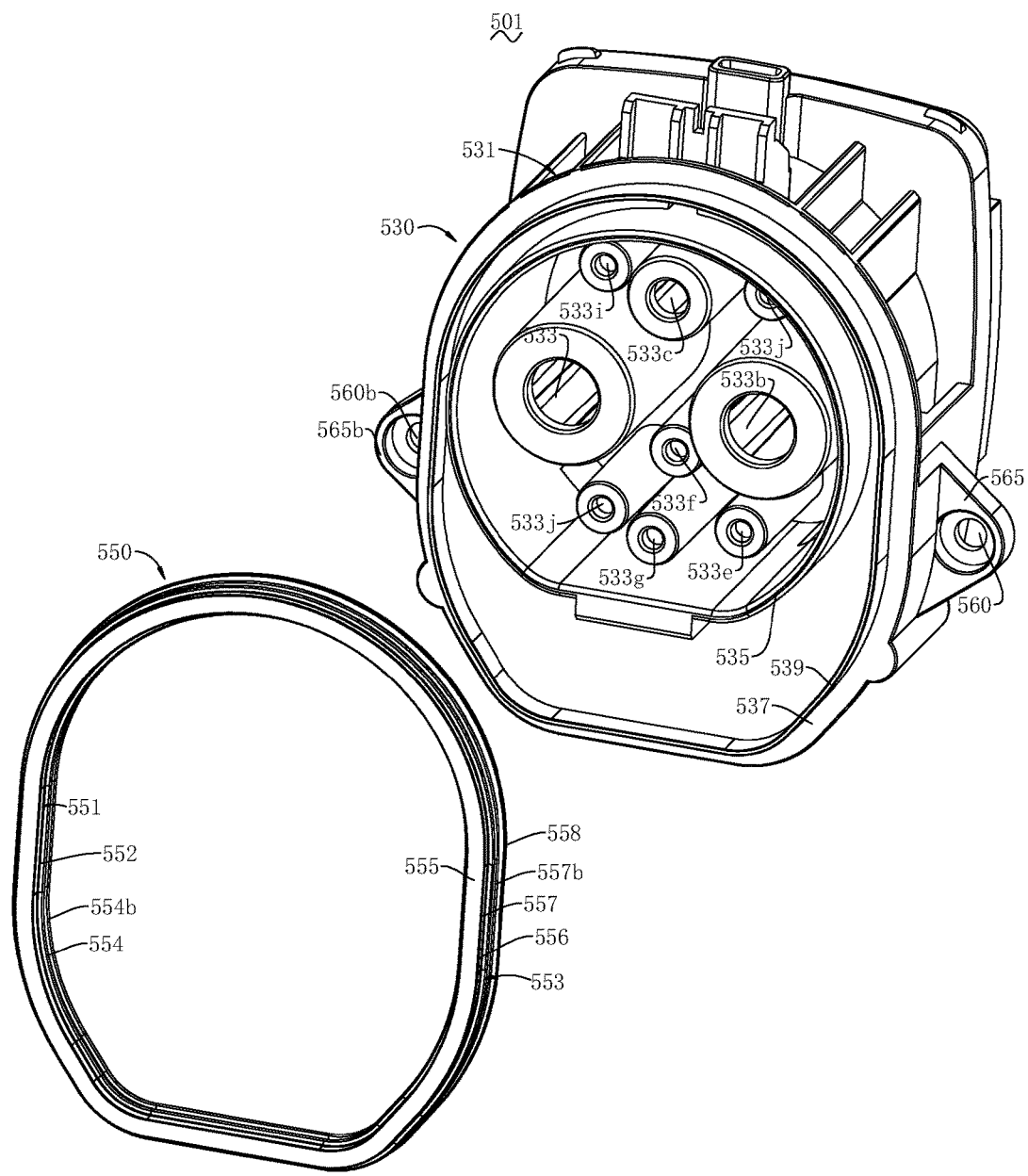
FIG. 42 is a stereoscopic exploded schematic view of the sealing assembly of FIG. 41.

With reference to FIGS. 39 to 40, a seal ring 550 is provided according to the present disclosure. The seal ring comprises a pair of seal sidewalls 551, 553, which are arranged to be spaced from each other, and a connecting top wall 555. Each of the seal sidewalls 551, 553 comprises paired seal surfaces 552, 552b, 556, 556b. The pair of seal sidewalls 551, 553 have oppositely arranged seal surfaces 552b, 556b. The connecting top wall 555 is disposed between the pair of seal sidewalls 551, 553 and connects them integrally. The seal ring 550 may be an integrated unit. The seal ring 550 may be a rubber ring. The pair of seal sidewalls 551, 553 and the connecting top wall 555 form a retaining groove (559). The seal sidewalls 551, 553 refer to a first seal sidewall 551 and a second seal sidewall 553, respectively, as will be described infra. The seal sidewall 551 has a pair of oppositely arranged seal surfaces 552, 552b. The seal sidewall 553 has a pair of oppositely arranged seal surfaces 556, 556b. The seal surfaces 552, 552b, 556, 556b extend along a circumferential direction and axial direction of the seal ring 550. Convex ribs 554, 554b, 554c, 554d, 557, 557b, 557c, 557d extending circumferentially are provided on the seal surfaces 552, 552b, 556, 556b. Convex ribs 554, 554b are provided on the seal surface 552. Convex ribs 554c, 554d are provided on the seal surface 552b. Convex ribs 557, 557b are provided on the seal surface 556. Convex ribs 557c, 557d are provided on the seal surface 556b.

With reference to FIGS. 41 to 44, a seal assembly 501 is provided according to the present disclosure. The seal assembly 501 comprises a mounting seat 530 and a seal ring 550. The seal ring 550 is disposed on the mounting seat 530, and may be seal-fitted with the mounting seat 530 and a first support 502 (as will be described infra) and may be seal-fitted with the mounting seat 530 and a second support 503 (as will be described infra).

The mounting seat 530 is configured for supporting an electronic element. In this embodiment, the mounting seat 530 is configured for supporting a connecting terminal 504 (as will be described infra). The mounting seat 530 has a seat body 531. The seat body 531 is configured for supporting the connecting terminal 504. In this embodiment, to firmly support the connecting terminal 504, a mounting hole 533 is provided on the seat body 531. The number and arrangement of the mounting holes 533 are only required to be capable of retaining the corresponding connecting terminal 504. It may be contemplated that the seat body 531 and the mounting hole 533 are only required to be capable of implementing corresponding supporting, and other structural forms may also be used to provide support for the connecting terminal 504.

The mounting seat 530 has an outer circumferential wall 535 and a support stage 537. The outer circumferential wall 535 may be a circumferential wall of the seat body 531. In this embodiment, the outer circumferential wall 535 is arranged to surround the seat body 531. The shape and size surrounded by the outer circumferential wall 535 may be selected as needed. In this embodiment, the outer circumferential wall 535 is substantially a chamfered rectangular shape. The support stage 537 is protrudingly arranged on the outer circumferential wall 535 and extends along the radial direction of the mounting seat 530. The support stage 537 is arranged to directly support the seal ring 550. The size and extending shape of the support stage 537 are only required to enable the corresponding seal ring 550 to be supported. In this embodiment, to enhance the firm supporting performance, the support stage 537 is arranged to protrude outwardly relative to the radial direction of the seal ring 550. Further, the support stage 537 extends along the circumferential direction of the outer circumferential wall 535 of the mounting seat 530 to form a closed-ring shape. Of course, the support stage 537 may also extend in an open-ring shape.

To further enhance the performance in firmly retaining the seal ring 550, the mounting seat 530 further comprises a retaining wall 539. The retaining wall 539 is arranged on the support stage 537 to protrude along the axial direction of the mounting seat 530. Specifically, the retaining wall 539 is protrudingly arranged on an upper surface of the support stage 537. In this embodiment, the retaining wall 539 extends along the circumferential direction of the mounting seat 530 to form a closed-ring shape. Of course, the retaining wall 539 may also be an open-ring shape. The retaining wall 539 is arranged to be radially spaced from the outer circumferential wall 535, and encloses an accommodating groove 540.

In this embodiment, the accommodating groove 540 is enclosed by the retaining wall 539, the support stage 537, and the outer circumferential wall 535 to form a U-shaped groove. The depth and width of the accommodating groove 540 are only required to be capable of implementing corresponding sealing.

The aforementioned various components on the mounting seat 530 may be independently formed. In this embodiment, to facilitate manufacturing and enhance the stable performance, the mounting seat 530 is an integrated unit. Specifically, the mounting seat 530 is an injection-molded unit.

The seal ring 550 is disposed on the support stage 537. The seal ring 550 may be arranged on the support stage 537 in any manner, as long as two sides of the seal ring 550 may form a waterproof seal with the first support 502 and the second support 503, respectively. For example, the seal ring 550 is directly disposed on the support stage 537 and thus achieve a waterproof seal by mutually abutting against the first support 502 and the sidewall 503. Of course, the seal ring 550 may also be securely provided on the support stage 537 by adhesives. In this embodiment, to facilitate demounting and achieve stable retaining performance, the seal ring 550 has a retaining groove 559. The retaining groove 559 is mate-plugged with the retaining wall 539, so that the seal ring 550 can be retained in a preset position relative to the mounting seat 530.

The seal ring 550 comprises a first seal sidewall 551 and a second seal sidewall 553 which are arranged opposite to each other. The first seal sidewall 551 faces the outer circumferential wall 535 of the mounting seat 530 and is arranged to be spaced therefrom. The accommodating groove 540 is enclosed by the first seal sidewall 551, the support stage 537, and the outer circumferential wall 535. The first seal sidewall 551 may be arranged in seal contact with the first support 502. The second seal sidewall 553 may be arranged in seal contact with the second support 503.

The seal ring 550 further comprises a connecting top wall 555. The connecting top wall 555 is connected to the first seal sidewall 551 and the second seal sidewall 553, respectively, to enclose the retaining wall 559. In this embodiment, the retaining wall 559 extends to form a closed-ring shape.

The first seal sidewall 551 has a first seal surface 552. The first seal surface 552 may be arranged in seal contact with the first support 502. Further, to enhance the sealing and waterproof performance and to facilitate assembly, in this embodiment, a convex rib 554 is protrudingly provided on the first seal surface 552. The convex rib 554 is arranged to protrude along the radial direction of the mounting seat 530 and may radially abut against the first support 502. Convex ribs 554c, 554d are provided on a side face of the first seal sidewall 551 facing the retaining wall 539. The two convex ribs 554c, 554d are arranged to abut against the retaining wall 539.

Correspondingly, the second seal sidewall 553 has a second seal surface 556. The second seal surface 556 may be arranged in seal contact with the second support 503. Further, to enhance the sealing and waterproof performance and to facilitate assembly, in this embodiment, a second convex rib 554b is protrudingly provided on the second seal surface. The second convex rib 554b is arranged to protrude outwardly along the radial direction of the mounting seat 530 and may radially abut against the second support 503.

To further enhance the sealing and waterproof performance, a seal end 558 is provided at a bottom end of the second seal surface 556. The seal end 558 is arranged to protrude outwardly along the radial direction of the seat body 530. That is, the seal end 558 and the second seal sidewall 553 enclose a step. To provide a firm support for the seal end 558, the support stage 537 is arranged to protrude radially relative to the seal end 558. Of course, the support stage 537 may also be arranged to be flush with the seal end 536.

To enhance the sealing and waterproof performance, the seal ring 550 may be an elastic deformation structure. Correspondingly, the first seal sidewall 551 may be arranged to be close to or distant from the second seal sidewall 553. Specifically, the seal ring 550 is a rubber ring. The seal ring 550 as a sealing element extends in a closed-ring shape.

Figure 45:
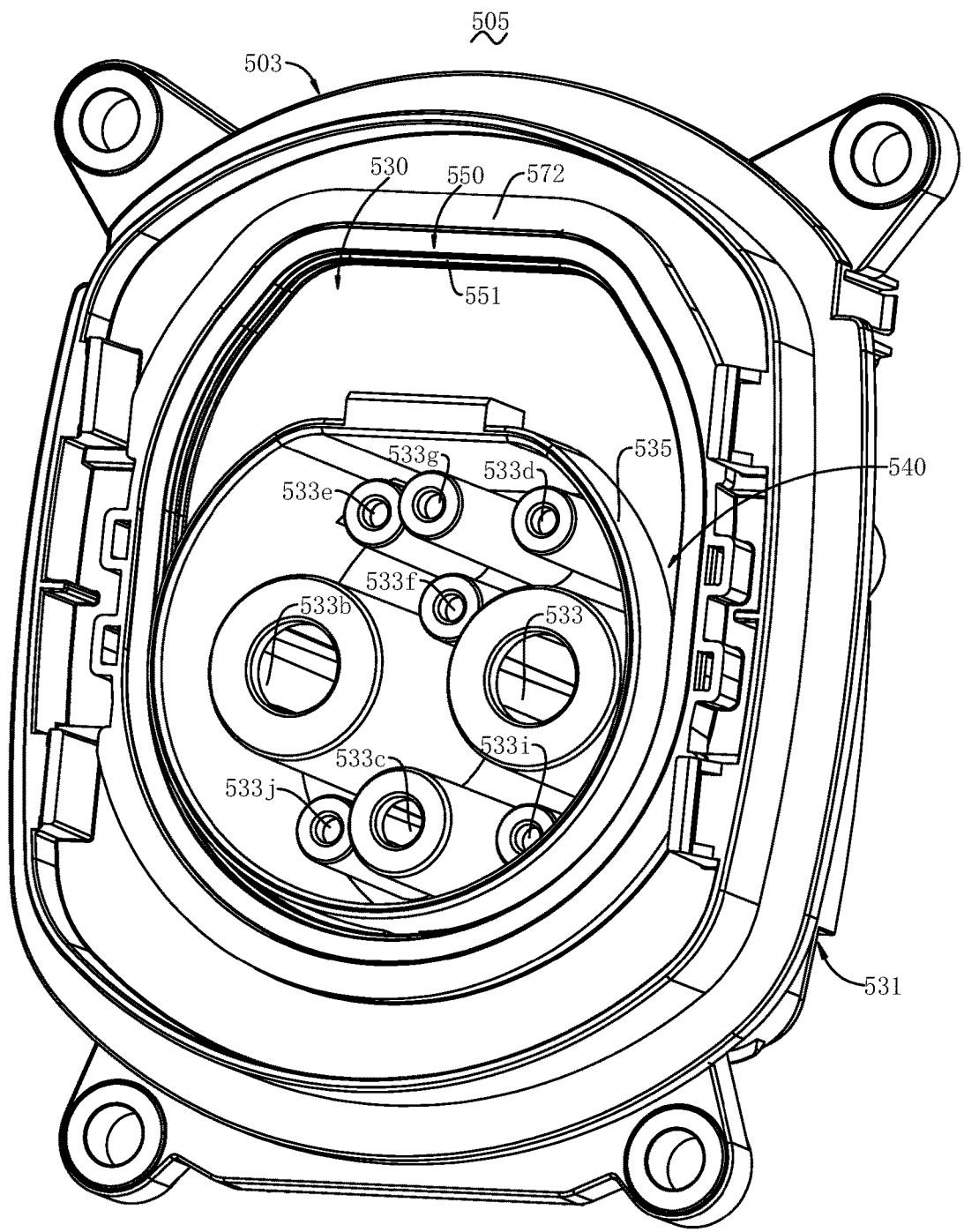
FIG. 45 is a stereoscopic structural schematic view of the sealing assembly of FIG. 41 provided with a second support.

With reference to FIG. 45, a seal assembly 505 is further provided according to the present disclosure. Different from the foregoing embodiments, the seal assembly 505 comprises a second support 503. The second support 503 is provided on the mounting seat 530 and is arranged to be seal-fitted with the mounting seat 530 via the seal ring 550.

The second support 503 is configured for supporting a corresponding component (not shown). The shape and configuration of the second support 503 are only required to be capable of implementing the corresponding seal-fitting. The specific shape and configuration of the second support 503 are only required to satisfy corresponding supporting needs. The second support 503 has a mating seal wall 572. The mating seal wall 572 is arranged in seal contact with the seal ring 550. Further, the mating seal wall 572 is arranged in seal contact with the second seal surface 556 of the second seal sidewall 553. In this embodiment, the mating seal wall 572 is arranged to radially abut against two convex ribs 557, 557b. Further, a step 577 (see FIG. 50 below for details) is provided at a bottom end of the mating seal wall 572. The step 577 abuts against the seal end 558, thereby enhancing the sealing and waterproof performance. The bottom end of the mating seal wall 572 may be arranged to abut on the support stage 537. Convex ribs 557c, 557d are provided on a side face of the second seal sidewall 553 facing the retaining wall 539. The two convex ribs 557c, 557d are arranged to abut against a side face of the retaining wall 539.

Figure 46:
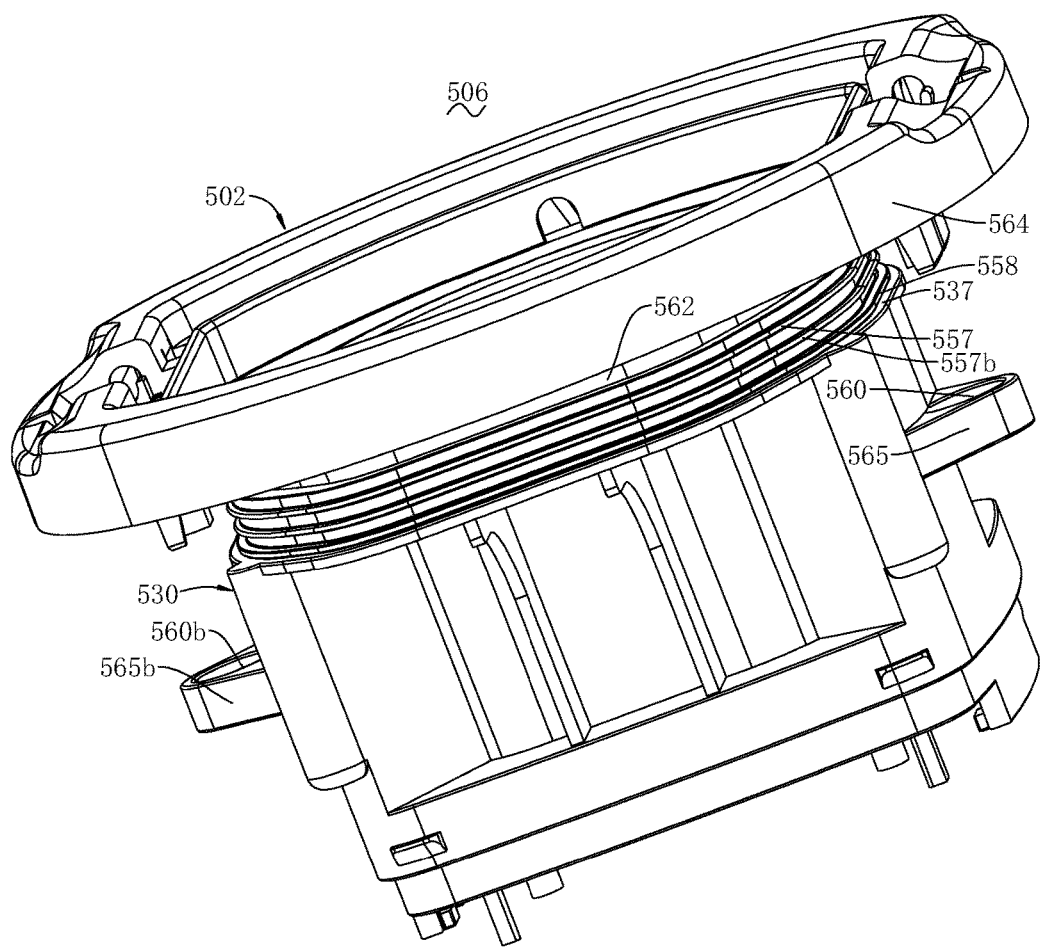
FIG. 46 is a stereoscopic structural schematic view of the sealing assembly of FIG. 41 provided with a first support.

With reference to FIG. 46, yet another seal assembly 506 is provided according to the present disclosure. Different from the foregoing embodiments, the seal assembly 56 further comprises a first support 502. The first support 502 is disposed on the mounting seat 530.

The first support 502 is configured for supporting other components (not shown). The first support 502 is arranged in seal contact with the mounting seat 530, respectively. In this embodiment, the first support 502 has a mounting pin 562. The mounting pin 562 is accommodated in the accommodating groove 540 and is arranged to be seal-fitted with the seal ring 550 and the outer circumferential wall 535, respectively. The mounting pin 562 is arranged to extend along the axial direction of the seat body 530. The mounting pin 562 may be arranged to be in direct seal contact with the first seal surface 552 of the first seal sidewall 551. In this embodiment, the mounting pin 562 is arranged to abut against the two convex ribs 554 and 554b.

The first support 502 further comprises an ear plate 564. The ear plate 564 is arranged on a top end of the mounting pin 562. The ear plate 564 is arranged to protrude along the radial direction of the mounting seat 530. The ear plate 564 may support other components. To enhance the sealing and waterproof performance, the ear plate 564 extends outwardly to protrude from the seal ring 550. The ear plate 564 may be arranged to be axially spaced from the top end of the seal ring 550, thereby providing corresponding movement space.

The specific shape of the first support 502 may be selected according to needs. In this embodiment, to facilitate mounting the connecting terminal 504, the first support 502 is substantially a closed-ring shape. Correspondingly, the first support 502 is an injection-molded unit.

Figure 47:
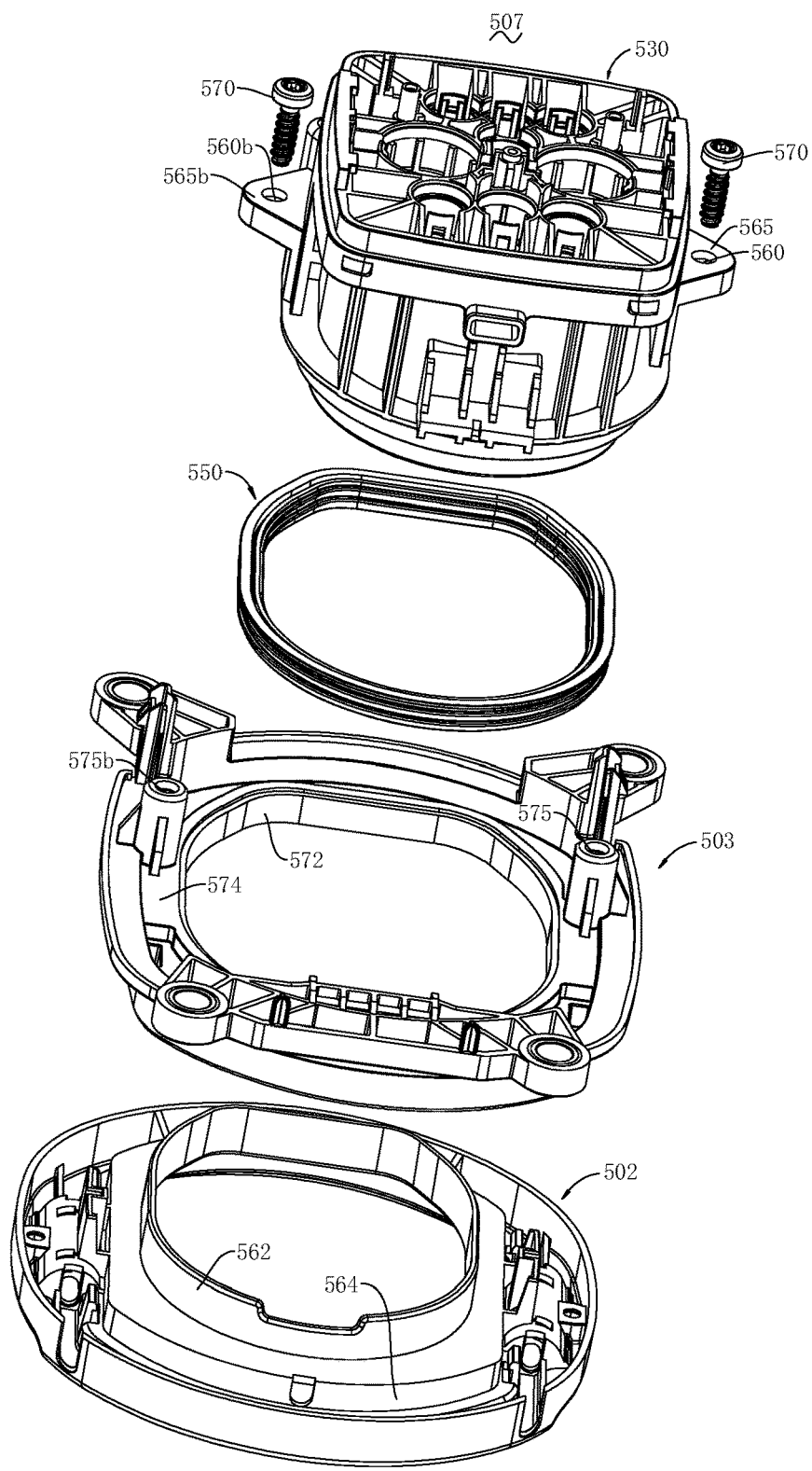
FIG. 47 is a stereoscopic exploded schematic view of the sealing assembly of FIG. 41 provided with the second support and the first support.

With reference to FIG. 47, yet another seal assembly 507 is provided according to the present disclosure. The seal assembly 507 comprises the seal assembly 506, the first support 502, and the second support 503 as disclosed in the foregoing embodiments.

Specifically, the second support 503 further comprises a second support body 576. The second support body 576 is configured for supporting the mating seal wall 572. Meanwhile, the second support body 576 may also be configured for supporting other components (not shown).

To enhance the sealing and waterproof performance, the second support 503 is assembled integrally with the mounting seat 530. In this embodiment, fastening holes 560, 560b are arranged on the seat body 531. Specifically, supporting portions 565, 565b are protrudingly arranged on an outer sidewall of the seat body 531. The fastening holes 560, 560b are arranged to run axially through the supporting portions 565, 565b. Correspondingly, the second support body 574 is provided with mating fastening holes 575, 575b. The seal assembly 507 further comprises fasteners 570, 570b. The fasteners 570, 570b extend, in one-to-one correspondence, into the fastening holes 560, 560b and the mating fastening holes 575, 575b, so that the mounting seat 530 may be integrally fastened to and assembled with the second support 503.

Figure 48:
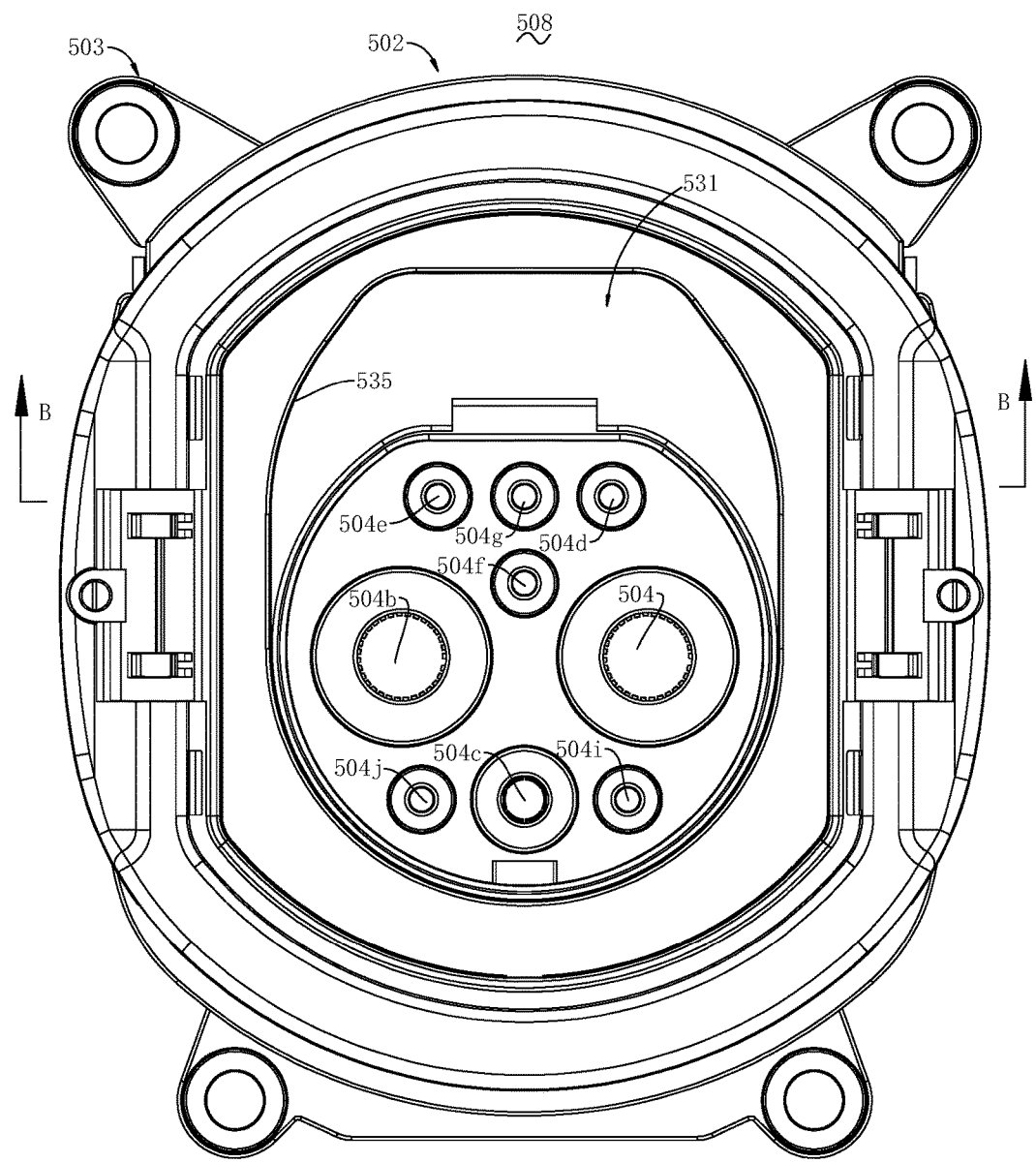
FIG. 48 is a projection schematic view of a receptacle provided according to the present disclosure.
Figure 49:
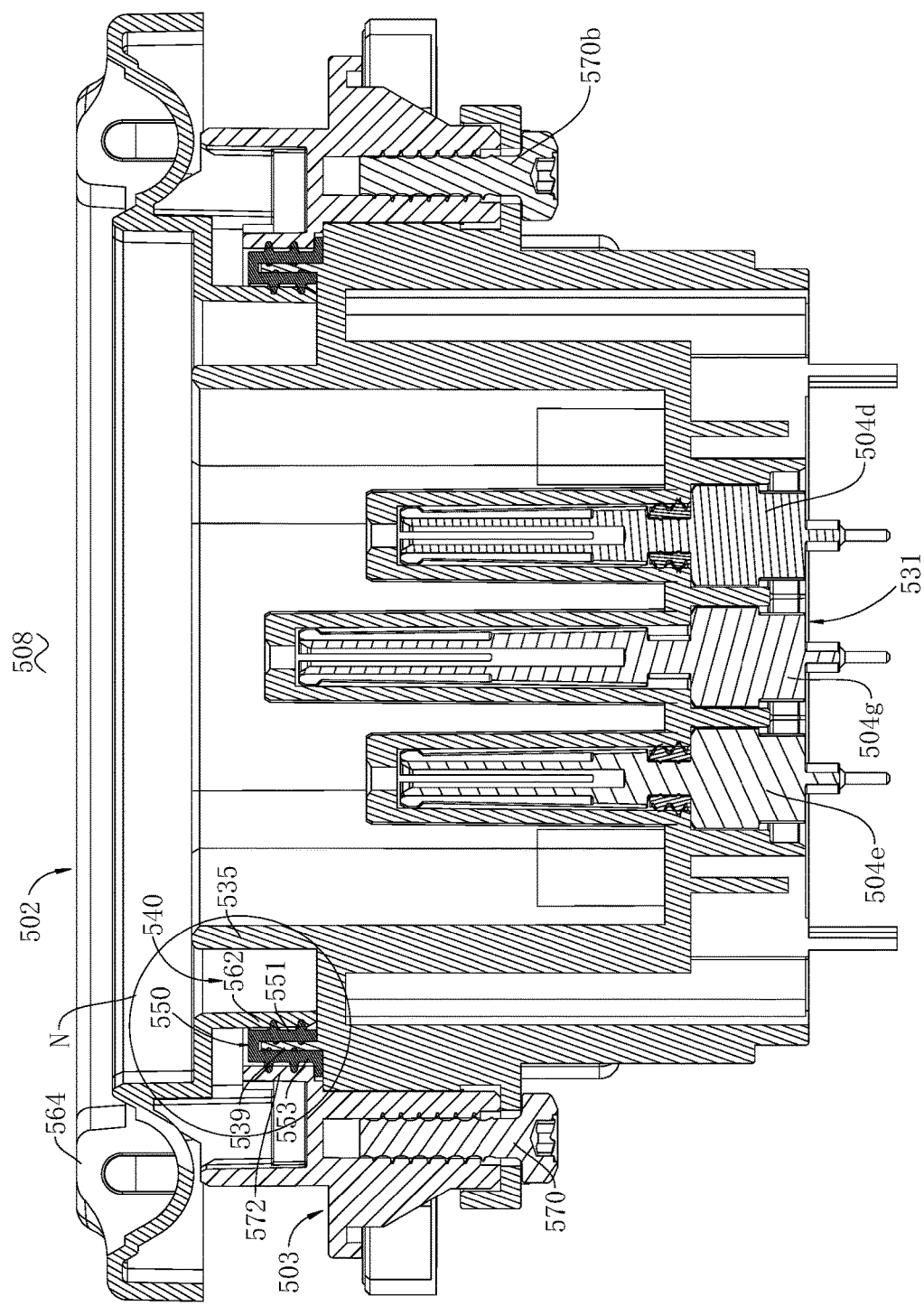
FIG. 49 is a sectional view of the receptacle of FIG. 48 along line B-B.
Figure 50:
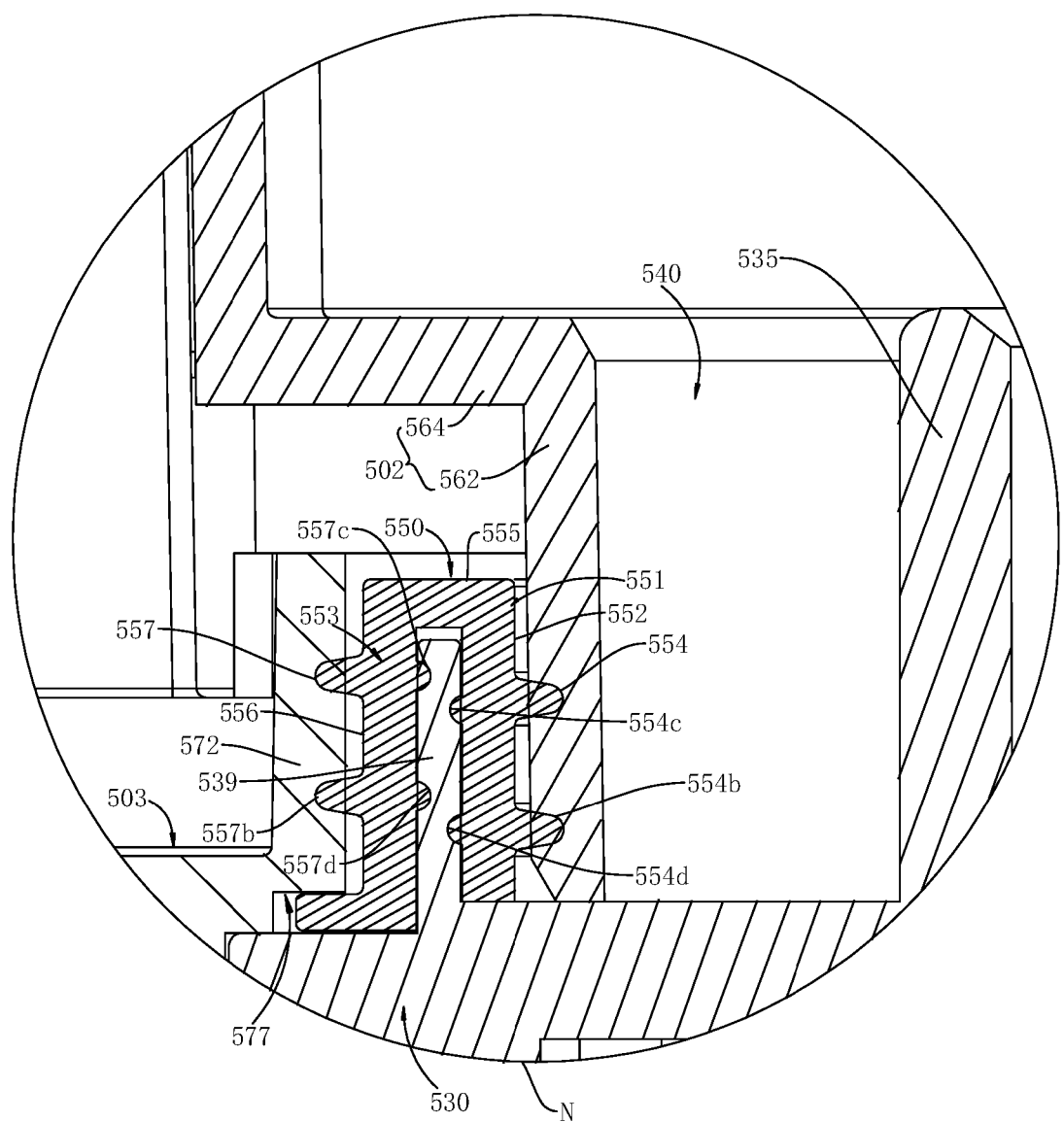
FIG. 50 is a partial enlarged schematic view of the receptacle of FIG. 49 at N.

With reference to FIGS. 48 to 50, a receptacle 508 is also provided according to the present disclosure. The receptacle 508 comprises one of the seal assemblies 501, 505, 506, 507 as described in the foregoing embodiments, and a connecting terminal 504. As shown in the figures, the receptacle 508 comprises the seal assembly 507 as described in the foregoing embodiments. The connecting terminal 504 is arranged on the mounting seat 530.

The specification and number of the connecting terminal 504 are only required to meet corresponding electrical connection needs. In this embodiment, 9 connecting terminals 504, 504b, 504c, 504d, 504e, 504f, 504j, 504h, 504i are arranged on the mounting seat 530, and specifically arranged in the mounting holes 533, 533b, 533c, 533d, 533e, 533f, 533j, 533h, 533i of the seat body 531, so as to meet corresponding Chinese national standards. Correspondingly, the receptacle 507 is a receptacle useful for charging electric vehicles such that it may be in mating electrical connection with a charging gun.

Figure 43:
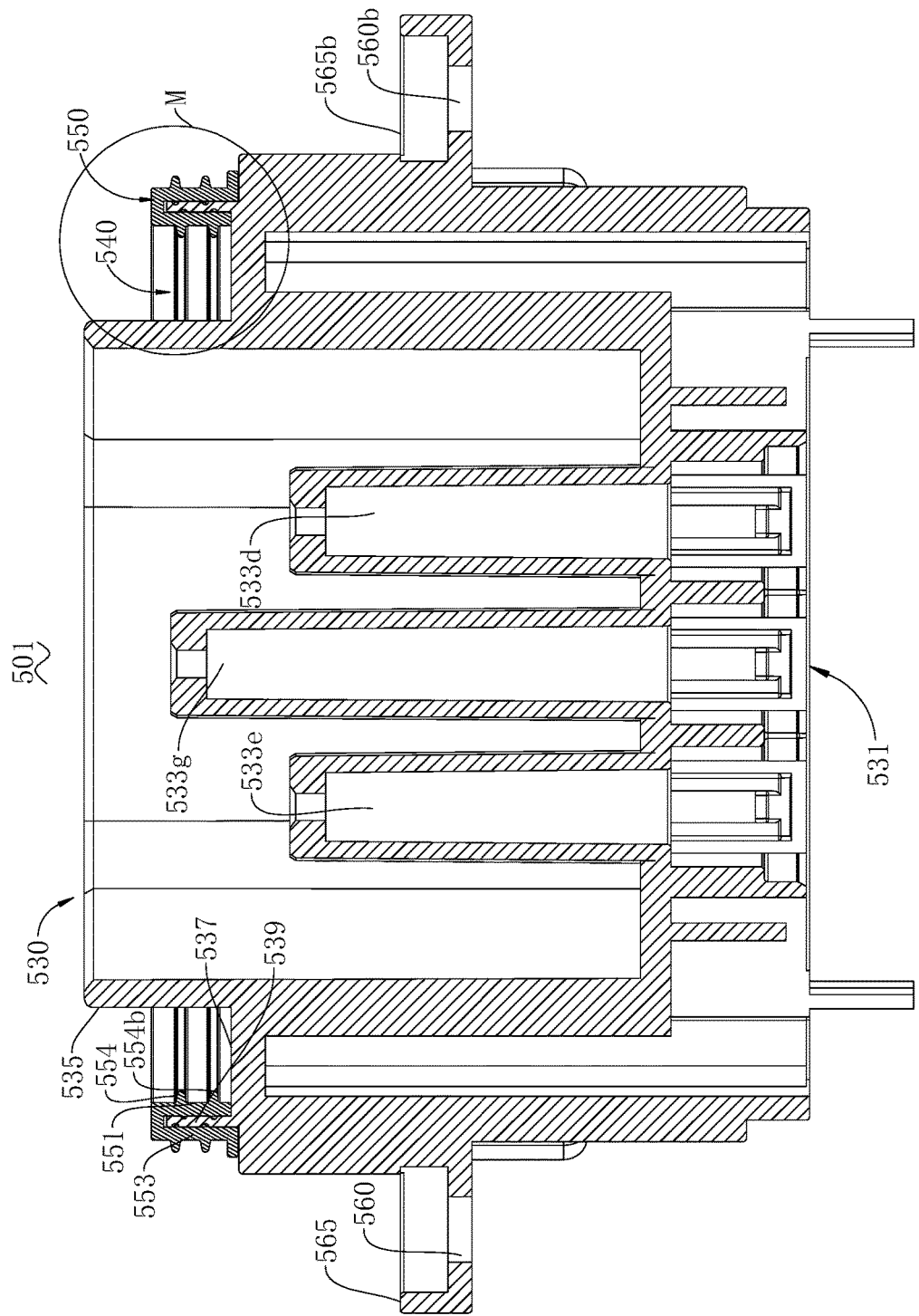
FIG. 43 is a sectional view of the sealing assembly of FIG. 41 along line A-A.
Figure 44:
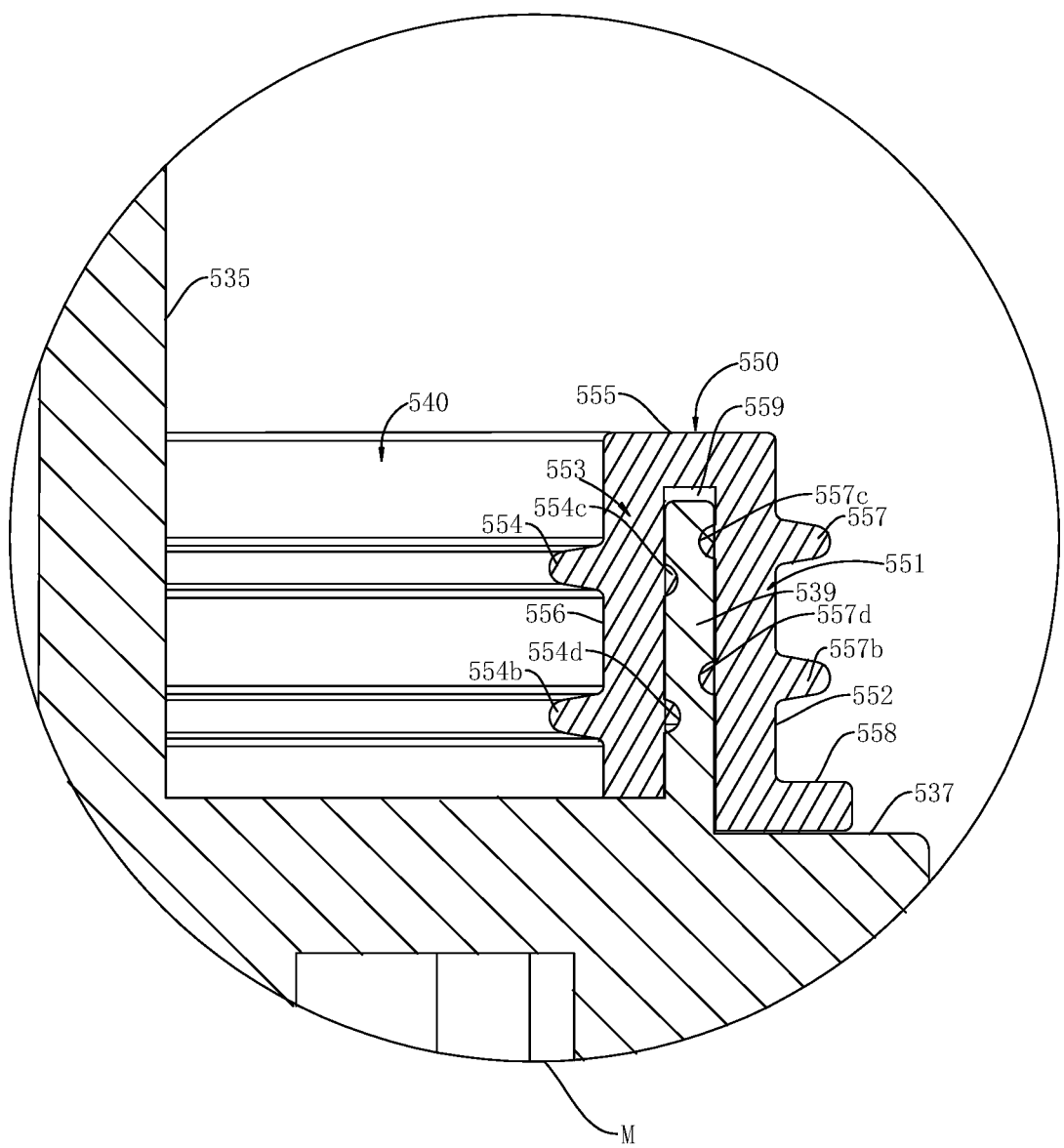
FIG. 44 is a partial enlarged schematic view of the sealing assembly of FIG. 43 at M.

It needs to be noted that unless otherwise indicated, the terms "upper, lower," "left, right," "top, bottom," "one side, the other side," and "inner, outer," as mentioned in the contents regarding the seal ring 550, seal assemblies 501, 505, 506, 507, and the receptacle 508 in the present disclosure, are all relative concepts. FIG. 43 and FIG. 44 show a top-down direction. Particularly, the direction from the top down is a mounting direction of the connecting terminal 504. Particularly, a first seal surface 552 on the first seal sidewall 551 is seal-fitted with the first support 502; the second seal surface 556 on the second seal sidewall 553 is seal-fitted with the second support 506.

Compared with the prior art, the seal assembly 501 of the present disclosure may enable a waterproof seal between the three components of the mounting seat 530, the first support 502, and the second support 503 via a seal ring 550, and has a simplified structure and is convenient to assemble, thereby enhancing performance and productivity. The receptacle 508 may enhance waterproof performance and reduce manufacturing costs by adopting the seal assembly 505.

Figure 51:
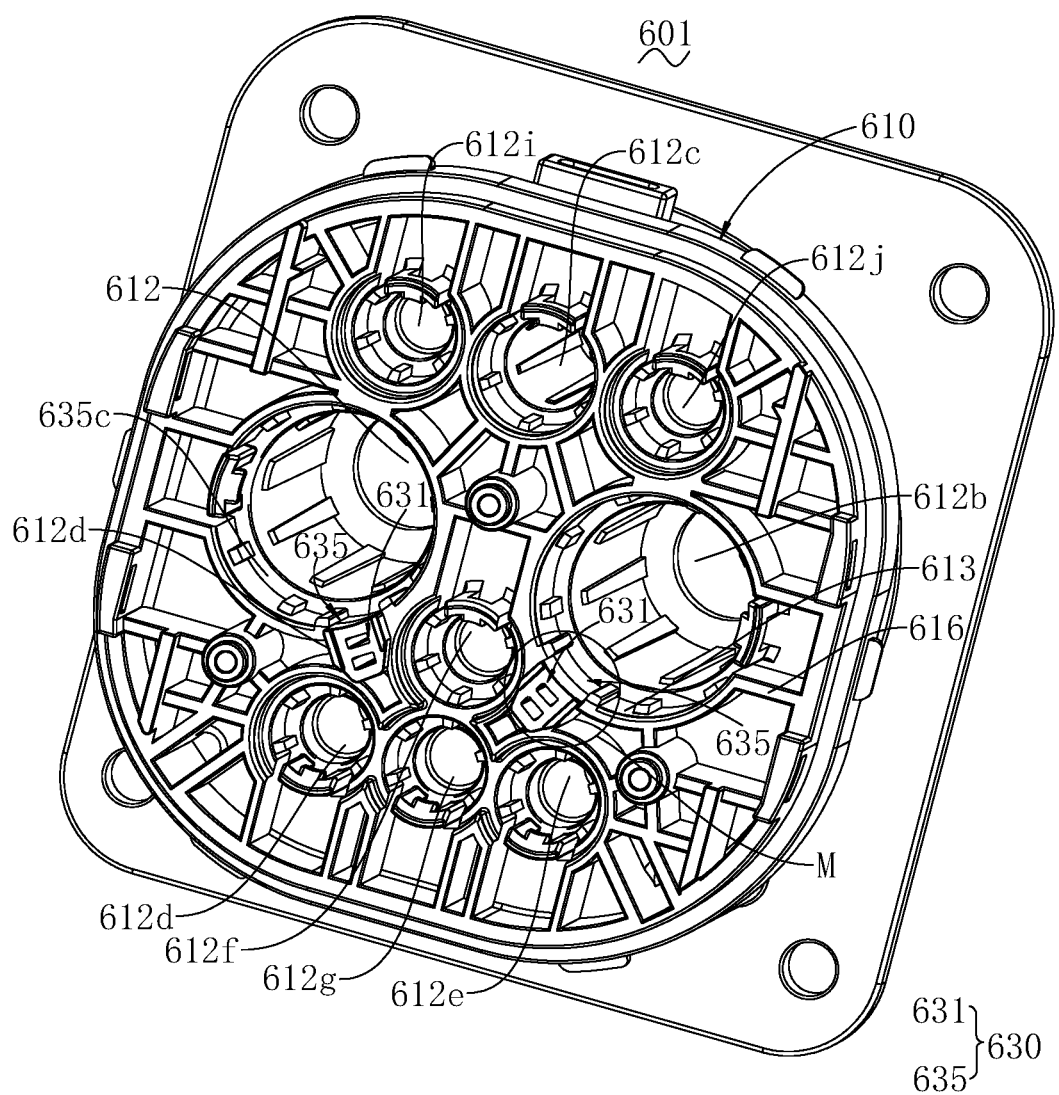
FIG. 51 is a stereoscopic structural schematic view of a receptacle housing provided according to the present disclosure.
Figure 52:
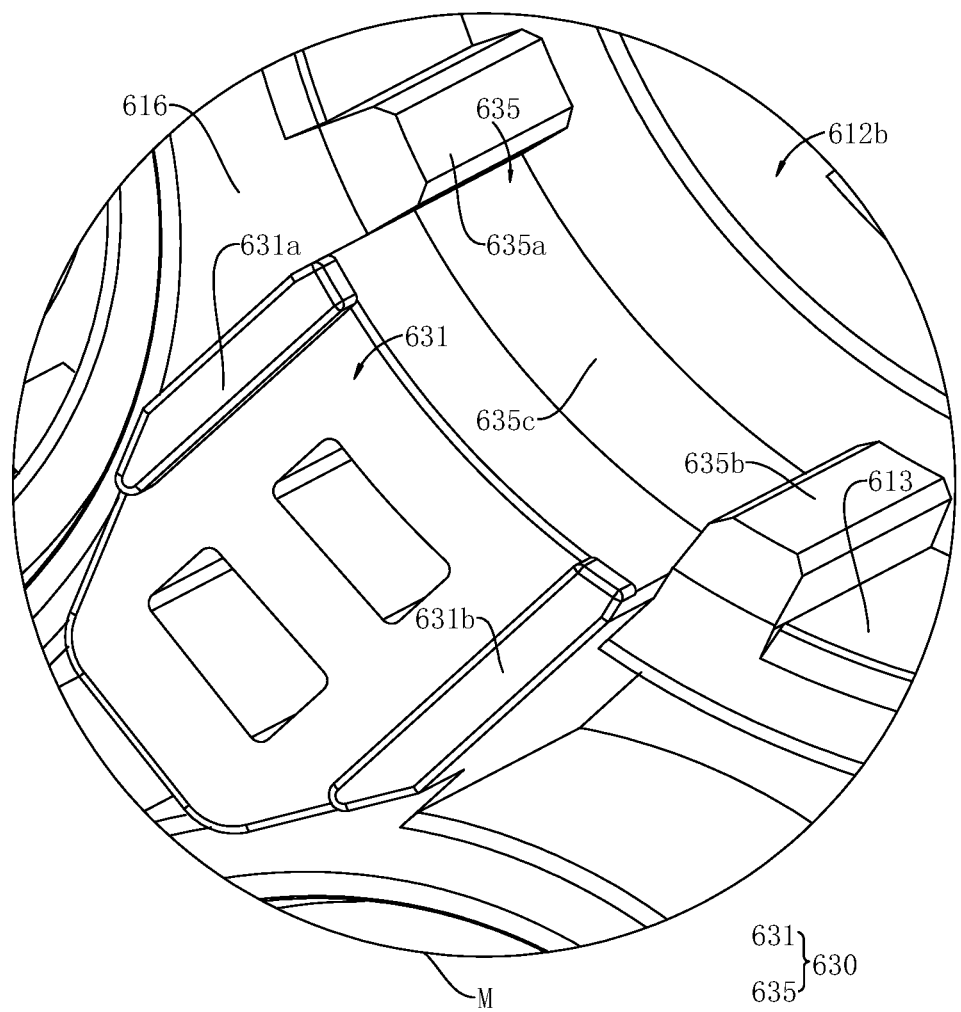
FIG. 52 is a partial enlarged schematic view of the receptacle housing of FIG. 51 at M.
Figure 53:
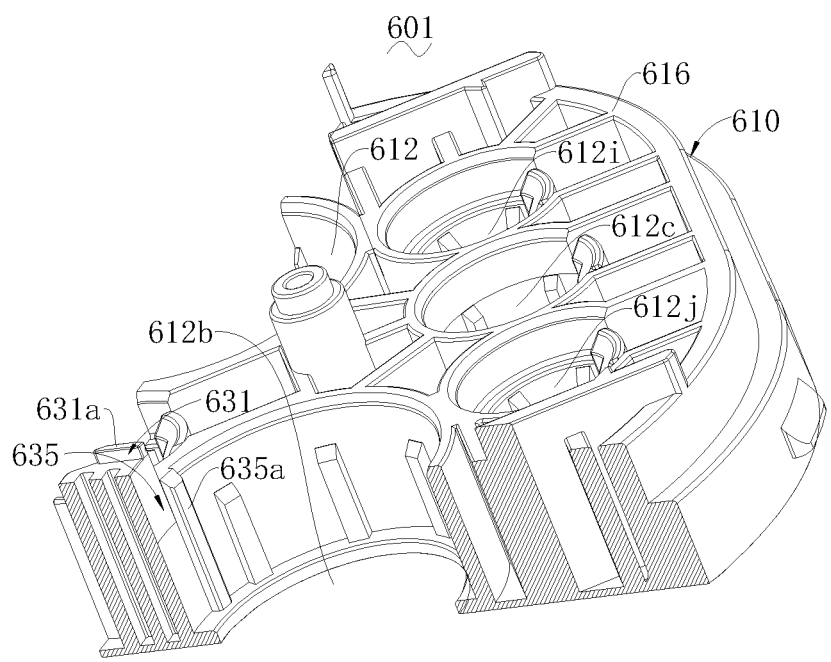
FIG. 53 is a partial stereoscopic sectional view of the receptacle housing of FIG. 51.

With reference to FIGS. 51 to 53, a receptacle housing 601 provided according to the present disclosure is shown. The receptacle housing 601 comprises a housing body 610 and a retaining portion 630 disposed on the housing body 610. The retaining portion 630 is configured for supporting and retaining a heat conducting element 650.

The housing body 610 may be configured for supporting a connecting terminal 603 under temperature measurement, as well as other components and structures. The specific shape and configuration of the housing body 610 are only required to be suitable for the above supporting function. In this embodiment, the housing body 610 is substantially block-shaped. The housing body 610 has an axial direction along the mounting direction of the connecting terminal 603. To facilitate firmly retaining a corresponding connecting terminal 603, a mounting hole 612 is provided on the housing body 610. The mounting hole 612 is configured for accommodating a corresponding connecting terminal 603. The size, number and distribution of the mounting holes 612 may be selected according to needs. Correspondingly, the mounting hole 612 is enclosed by a hole wall 613. That is, the hole wall 613 extends circumferentially and encloses the mounting hole 612 that may retain the corresponding connecting terminal 603. To facilitate implementing the corresponding electrical connection, the mounting hole 612 is a through-hole provided to run through along an axial direction of the housing body 610. In this embodiment, 9 mounting holes 612, 612b, 612c, 612d, 612e, 612f, 612g, 612h, 612i are configured for mounting and retaining the following 9 connecting terminals 603, 603b, 603c, 603d, 603e, 603f, 603g, 603h, 603i. Further, the housing body 610 has a supporting end face 616. The supporting end face 616 is configured for supporting a circuit board 680 (as will be described infra). The supporting end face 680 is a surface at an axial end of the housing body 610.

The specific structure of the retaining portion 630 is only required to be capable of supporting and retaining the corresponding heat conducting element 650, and, for example, may be a snap-joint. In this embodiment, to further facilitate supporting and retaining the heat conducting element 650, the retaining portion 630 comprises a first retaining portion 631 and a second retaining portion 635. The first retaining portion 631 and the second retaining portion 635 may be arranged to be continuous or spaced apart. That the first retaining portion 631 and the second retaining portion 635 are arranged to be continuous means they contact with each other, or they may also be connected as an integrated structure. In this embodiment, the first retaining portion 631 may communicate with the second retaining portion 635 to form a groove body. The first retaining portion 631 is provided on the housing body 610, for retaining a first heat conducting portion 651 of the heat conducting element 650. The shape and configuration of the first retaining portion 631 are only required to support and retain the corresponding first heat conducting portion 651, so that the first heat conducting portion 651 is arranged in a corresponding preset position. For example, the first retaining portion 631 may be a snap-joint, a cantilever, or a through-hole wall, etc. In this embodiment, to facilitate mounting and to facilitate heat conduction, the first retaining portion 631 is a limiting groove. The specific shape and configuration of the limiting groove 631 are only required to the capable of limiting and retaining the first heat conducting portion 651 of the heat conducting element 650 in a preset position. In this embodiment, the first retaining portion 631 is a through-groove enclosed by a pair of limiting walls 631a, 631b that are arranged to face each other and be spaced apart. That is, one end of the limiting groove of the first retaining portion 631 extends to communicate with the corresponding mounting hole 612. The limiting groove of the first retaining portion 631 is a rectangular groove with a width equivalent to that of the first heat conducting portion 651. More specifically, the pair of limiting walls 631a, 631b are axially and protrudingly provided on the supporting end face 616 of the housing body 610. That is, the retaining portion 631 is disposed on the supporting end face 616.

With continuous reference to FIG. 52, more specifically, the first retaining portion 631 comprises a pair of limiting walls 631a, 631b. The pair of the limiting walls 631a, 631b are arranged to face and be spaced apart from each other. The pair of the limiting walls 631a, 631b enclose a limiting groove such that the first heat conducting portion 651 may be retained in a preset position. In this embodiment, the pair of the first retaining portions 631 are arranged to face each other in a character "A" shape.

The second retaining portion 635 is provided on the housing body 610. The second retaining portion 635 is configured for retaining a second heat conducting portion 655. The specific structure and configuration of the second retaining portion are only required to be capable of retaining the corresponding second heat conducting portion 655. The second retaining portion 635 may adopt the same or different structure from that of the first retaining portion 631. To facilitate achieving a stable heat conduction with the corresponding connecting terminal 603, the second retaining portion 635 extends into the mounting hole 612 for accommodating the connecting terminal 603. In this embodiment, the second retaining portion 635 is a guide groove. Correspondingly, the second retaining portion 635 is provided on a hole wall 613 of the mounting hole 612. Specifically, the second retaining portion 635 is a guide groove provided on the hole wall 613. That is, the second retaining portion 635 is arranged to extend along the axial direction of the housing body 610. The specific shape of the guide groove is only required to be capable of retaining the corresponding second heat conducting portion 655. In this embodiment, the guide groove is a rectangular groove having the same shape as that of the second heat conducting portion 655.

With continuous reference to FIG. 52 and FIG. 53, the second retaining portion 635 comprises a pair of retaining walls 635a, 635b. The pair of retaining walls 635a, 635b are provided on the hole wall 613 and arranged in the mounting hole 612 to protrude radially. The pair of retaining walls 635a, 635b are arranged to extend along the axial direction of the mounting hole 612. Further, to enhance the performance in supporting the heat conducting element 650, the second retaining portion 635 further comprises a supporting bottom wall 635*c*. The supporting bottom wall 635*c* is provided at the bottom end of the pair of retaining walls 635*a*, 635*b*, so as to support the bottom end 655*b* of the second heat conducting portion 655. In this embodiment, the supporting bottom wall 635*c* and the hole wall 613 enclose a step shape.

The relative position of the first retaining portion 631 and the second retaining portion 635 is arranged so that they may enable the first heat conducting portion 651 and the second heat conduction portion 655 of the heat conducting element 650 to be correspondingly retained, respectively. The first retaining portion 631 may be arranged to be spaced apart from or connected with the second retaining portion 635. In this embodiment, to further facilitate assembly and save space occupied by the heat conducting element 650, the second retaining portion 635 extends to the top end of the hole wall 613 of the mounting hole 612, thereby being connected to the first retaining portion 631. That is, the first retaining portion 631 and the second retaining portion 635 extend continuously to be an integrated shape. In this embodiment, it is the case that the guide groove as the second retaining portion 635 communicates with the limiting groove of the first retaining portion 631.

Any two of the first retaining portion 631, the second retaining portion 635, and the housing body 610 may be formed independently of each other. In this embodiment, the receptacle housing 601 is an integrated unit for facilitating the formation of a stable structure. Further, to facilitate achieving electrical insulation performance, the receptacle housing 601 is an injection-molded unit. The above structural configurations of the receptacle housing 601 are particularly suitable for a housing of an electric vehicle charging receptacle.

Figure 54:
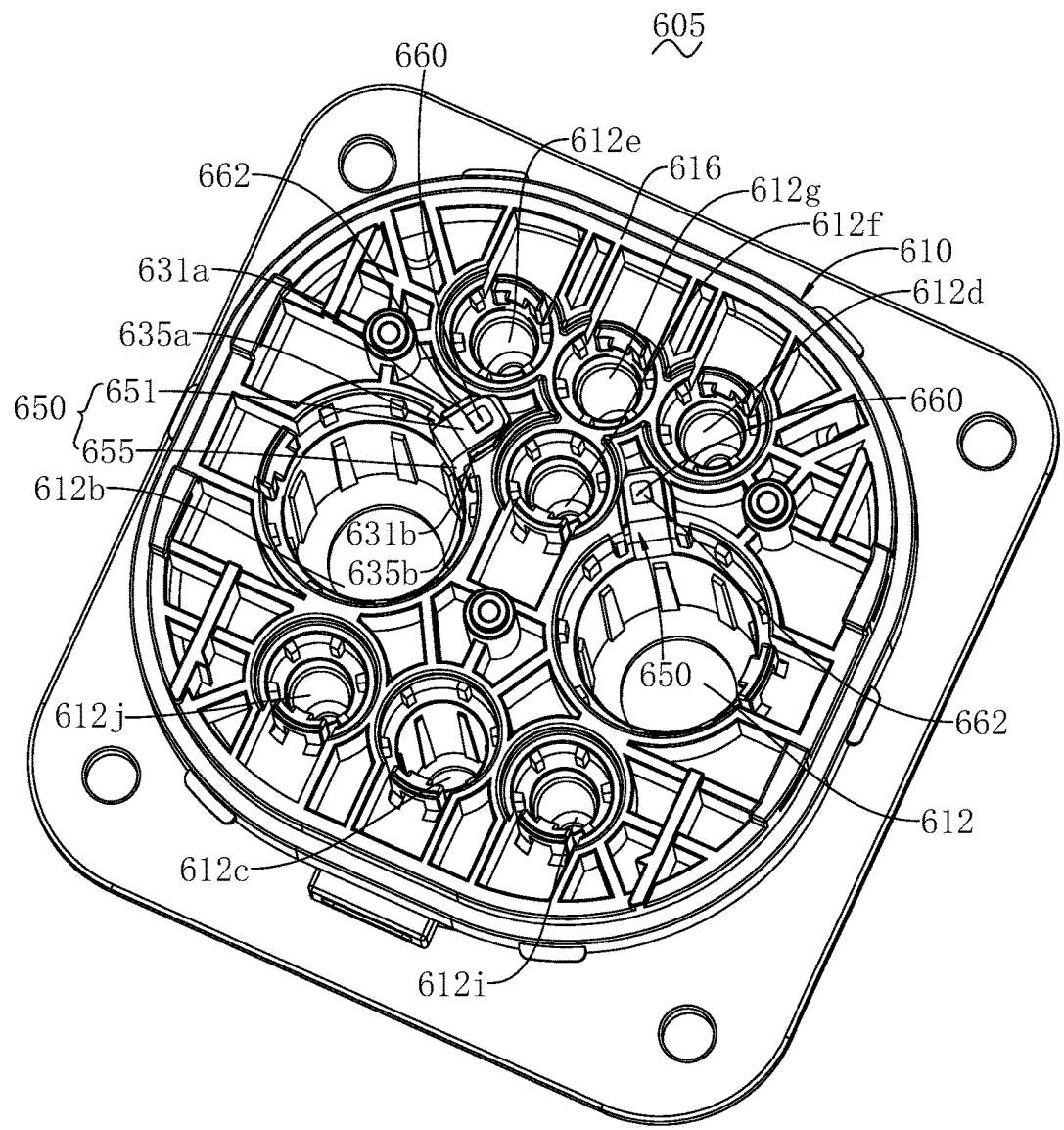
FIG. 54 is a stereoscopic structural schematic view of a receptacle housing assembly provided according to the present disclosure.

With reference to FIG. 54, the present disclosure further provides a receptacle housing assembly 605. The receptacle housing assembly 605 comprises a heat conducting element 650 and the receptacle housing 601 disclosed in the foregoing embodiment.

Figure 55:
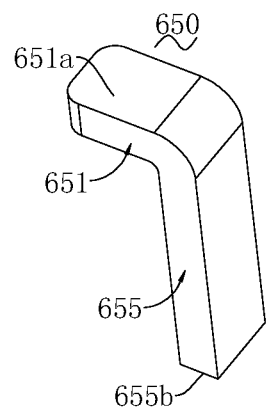
FIG. 55 is a stereoscopic structural schematic view of a heat conducting element shown in the receptacle housing assembly of FIG. 54.

With reference to FIG. 55 together, the specific material and configuration of the heat conducting element 650 are only required to be capable of satisfying corresponding heat conducting needs. To improve mounting convenience and enhance heat conducting efficiency, the heat conducting element 650 is an elastic element, so as to be arranged to contact and abut against the corresponding connecting terminal 603 and be bent to adapt to needs of different mounting paths. To enhance the heat conducting performance and mounting convenience, in the embodiment, the heat conducting element 650 is a silicone pad.

The heat conducting element 650 comprises a first heat conducting portion 651 and a second heat conducting portion 655 that are integrally connected with each other. The heat conducting portion 651 is disposed at the first retaining portion 631 and may be configured to conduct heat from the connecting terminal 603 under temperature measurement to the second heat conducting portion 655. In this embodiment, the first heat conducting portion 651 is substantially a rectangular plate shape. The second heat conducting portion 655 is correspondingly also a rectangular plate shape. The first heat conducting portion 651 is perpendicularly and integrally connected with the second heat conducting portion 655 to form the heat conducting element 650 substantially L-shaped. The second heat conducting portion 655 is disposed at the second retaining portion 635 and may conduct heat to a temperature measuring element 660. The first heat conducting portion 651 and the second heat conducting portion 655 are only required to be supported by the corresponding first retaining portion 631 and the second retaining portion 635 and be retained in preset positions. In this embodiment, the first heat conducting portion 651 is accommodated and limited in a limiting groove which functions as the first retaining portion 631 and arranged to axially protrude out of the limiting groove. The second heat conducting portion 655 is accommodated and limited in the guide groove which functions as the second retaining portion 635 and radially protrudes out of the guide groove so as to axially abut against the connecting terminal 603. A bottom end 655*b* of the second heat conducting portion 655 is disposed on the supporting bottom wall 635*c* of the second retaining portion 635.

One of the innovations of the present disclosure is that the structural configurations described above may enable the heat of the connecting terminal 603 to be conducted out conveniently, thereby facilitating measurement. With continuous reference to FIG. 55, in this embodiment, the receptacle housing assembly 605 further comprises a temperature-measuring element 660. The temperature-measuring element 660 may be arranged to be in heat conductive contact with the second heat conducting portion 655. The temperature-measuring element 660 is configured for measuring the temperature of the connecting terminal 603 and then transmitting the temperature to the circuit board 680. The specific specification and type of the temperature-measuring element 660 may be selected as needed. In this embodiment, the temperature-measuring element 660 is a thermistor. More specifically, the temperature-measuring element 660 is a negative temperature coefficient thermistor. Of course, the temperature-measuring element 660 may also adopt other temperature sensors to implement temperature measurement. The specific position arrangement of the temperature-measuring element 660 is only required to be capable of implementing corresponding temperature measurement. To shorten the heat conducting distance and improve corresponding temperature-measurement speed, a bottom end (not shown) of the temperature-measuring element 660 is provided at an upper surface 651*a* of the first heat conducting portion 651. Further, a top end 662 of the temperature-measuring element 660 is arranged to be opposite to and be electrically connected with a lower surface of the circuit board 680. The temperature-measuring element 660 is embedded on the heat conducting element 650. In this embodiment, the bottom end of the temperature-measuring element 660 abuts against and is embedded in the heat conducting element 650 in the form of a silicone pad.

Figure 56:
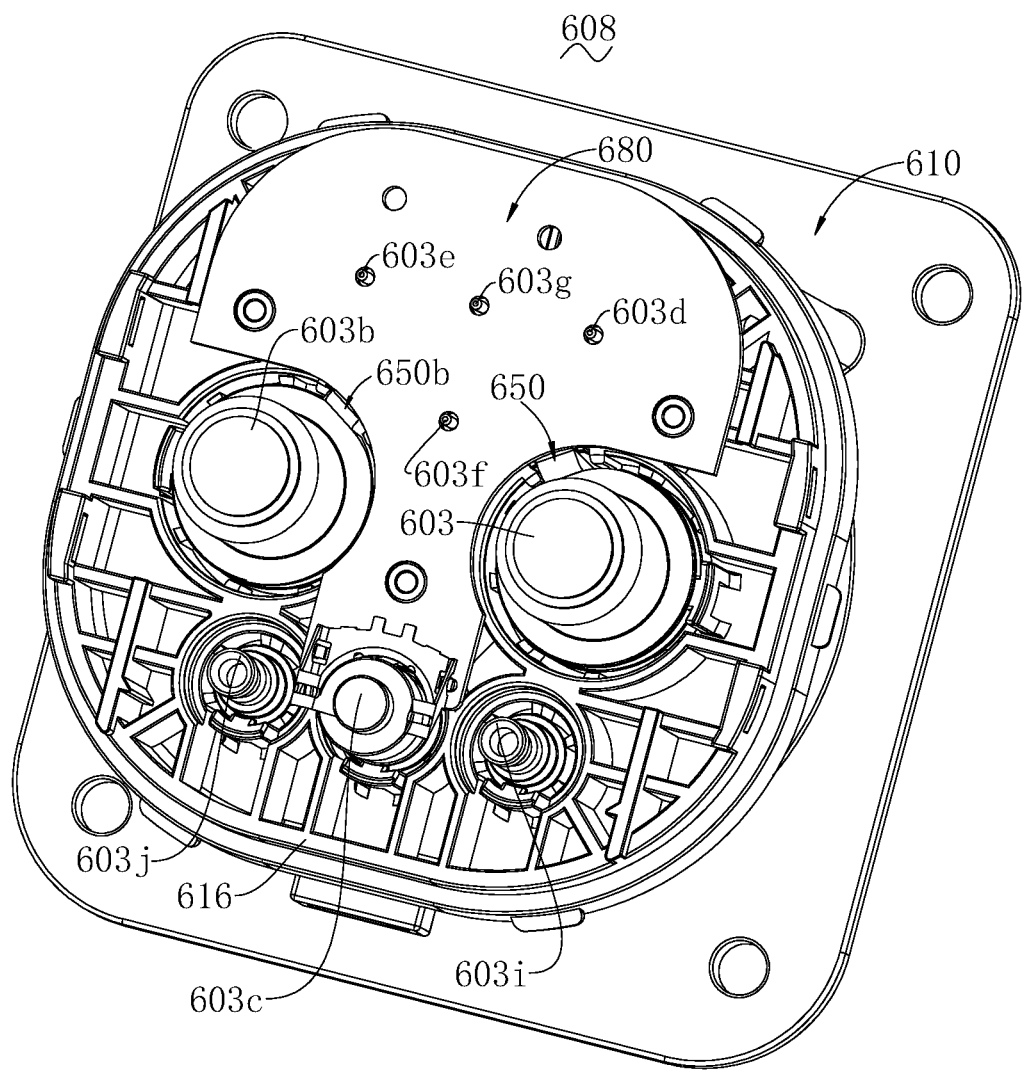
FIG. 56 is a stereoscopic structural schematic view of a receptacle provided according to the present disclosure.
Figure 57:
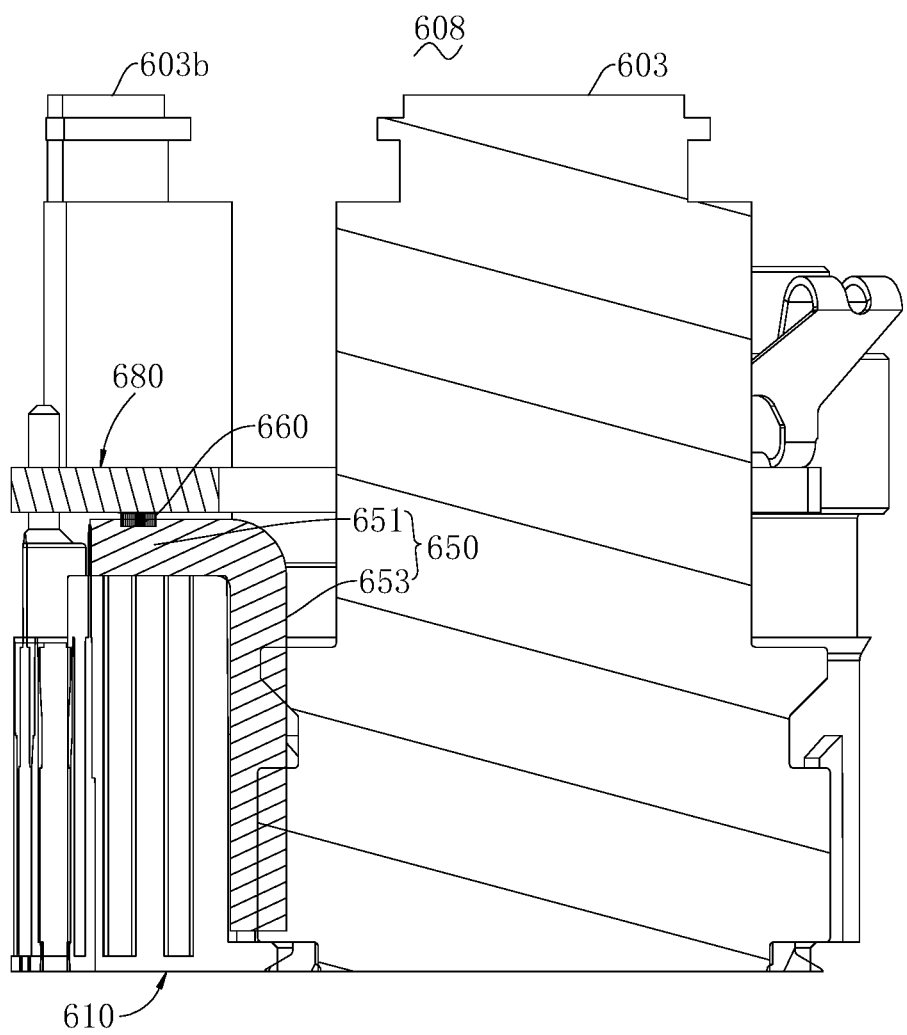
FIG. 57 is a partial stereoscopic sectional view of the receptacle of FIG. 56.

With reference to FIGS. 56 and 57, a first receptacle 608 is provided according to the present disclosure. The receptacle 608 comprises the receptacle housing assembly 605 and the connecting terminal 603 and the circuit board 680 as described in the foregoing embodiments. Preferably, the receptacle 608 is an electric vehicle charging receptacle.

The connecting terminal 603 is arranged on the housing body 610. In this embodiment, the structures of 9 connecting terminals 603, 603*b*, 603*c*, 603*d*, 603*e*, 603*f*, 603*g*, 603*h*, 603*i* are at least partially accommodated, in one-to-one correspondence, in 9 mounting holes 612, 612*b*, 612*c*, 612*d*, 612*e*, 612*f*, 612*g*, 612*h*, 612*i*. Some connecting terminals 603, 603*b* need to undergo temperature measurement as required. In this embodiment, two connecting terminals 603, 603*b*, which conduct a relatively large current and have relatively large heat generation, need to undergo temperature measurement.

The circuit board 680 (i.e., PCB, Printed Circuit Board) is configured for transferring corresponding electric signals, current, etc. In this embodiment, the circuit board 680 is electrically connected to the temperature-measuring element 660 to receive a corresponding temperature signal and may transfer the temperature signal to other processing devices for processing. A lower surface of the circuit board 680 is arranged to face an upper surface of the temperature-measuring element 660.

It needs to be noted that unless otherwise specified, the terms "upper, lower," "left, right," and "top, bottom" mentioned in the context regarding the receptacle housing 601, the receptacle housing assembly 605, and the receptacle 608 as described herein are all relative concepts. The term of "axial" refers to the axial direction of the connecting terminal 603 after the mounting hole 612, i.e., the mounting direction of the connecting terminal 603.

Compared with the prior art, the receptacle housing assembly 605 of the present disclosure can enable the heat conducting element 650 to be supported and sustained by providing the retaining portion 630. Further, the retaining portion 630 comprises a first retaining portion 631 and a second retaining portion 635, which may retain the first heat conducting portion 651 and the second heat conducting portion 635 of the heat conducting element, respectively, thereby retaining the heat conducting element 650 in a preset position, which not only facilitates conducting out the heat of the connecting terminal 603, but also may implement a stable heat conduction, thereby improving the accuracy of temperature measurement and enhancing the response speed of the temperature-measuring element 660. Particularly, when the connecting terminal 603 is arranged in a narrow space inside the mounting hole, the heat conducting element 650 may greatly facilitate heat conduction and thus facilitate temperature measurement.

What have been described above are only preferred embodiments of the present disclosure, which are not intended to limit the protection scope of the present disclosure. Any modifications, equivalent substitutions or improvements within the spirit of the present disclosure shall be covered within the scope of the claims of the present disclosure.

What is claimed is:

1. An electric protective cover for a receptacle, comprising:
    a cover body that extends along a radial direction of the receptacle and is configured for covering a circuit board, wherein an accommodating hole enclosed by an accommodating hole wall is disposed on the cover body to accommodate a connecting terminal; and
    a mounting portion disposed on the cover body to be mounted onto a receptacle housing;
    wherein a wire retaining part is provided on the cover body; and
    wherein the wire retaining part is configure for retaining a wire.

2. The electric protective cover according to claim 1, wherein
    the wire retaining part comprises a retaining arm disposed on the cover body; and
    the retaining arm is arranged above the lead through-hole and forms an arched shape to guide the wire.

3. The electric protective cover according to claim 1, wherein the wire retaining part comprises a guide groove disposed on the cover body, and the guiding groove is configured for guiding the wire.

4. The electric protective cover according to claim 1, wherein
    a limiting arm is provided on the cover body; and
    the limiting arm is arranged to be contactable with a seal ring on the housing.

5. The electric protective cover according to claim 1, further comprising:
    an isolating wall that protrudes and extends from the cover body along an axial direction of the accommodating hole and is arranged to surround the corresponding connecting terminal.

6. The electric protective cover according to claim 5, wherein, when the electric protective cover covers the circuit board, the isolating wall is at least partially disposed between the corresponding connecting terminal and the circuit board to isolate the corresponding connecting terminal from the circuit board, so as to prevent a current flowing through the connecting terminal from affecting an electronic element on the circuit board.

7. A receptacle, comprising:
    a housing;
    a circuit board disposed on the housing;
    a seal ring disposed on the housing to seal interstices between the housing and a mating housing; and
    an electric protective cover comprising:
        a cover body that extends along a radial direction of the receptacle and is configured for covering the circuit board, wherein the cover body is formed with an accommodating hole enclosed by an accommodating hole wall disposed on the cover body to accommodate a connecting terminal;
        a mounting portion disposed on the cover body for mounting onto the housing; and
        a limiting arm provided on the cover body;
    wherein the limiting arm is arranged to be contactable with the seal ring along a mounting direction of the electric protective cover;
    wherein the mounting portion of the electric protective cover is arranged on the housing; and
    wherein the cover body covers the circuit board.

8. The receptacle according to claim 7, wherein
    a limiting plate is provided at a bottom end of the limiting arm;
    the limiting plate is arranged to protrude outwards relative to the limiting arm; and
    the limiting plate is arranged to be contactable with the seal ring along a mounting direction of the electric protective cover.

9. The receptacle according to claim 7, wherein
    the mounting portion is a snap-fit joint;
    a snap-fitting hole or a snap-fitting cavity is disposed on the housing; and
    the snap-fit joint is arranged to be snap-fitted with the snap-fitting hole or the snap-fitting cavity.

10. The receptacle according to claim 7, wherein
    a support cantilever is provided on the cover body;
    the support cantilever is arranged to protrude and extend along the mounting direction of the electric protective cover; and
    the mounting portion is provided on a bottom end of the support cantilever.

11. The receptacle according to claim 7, wherein the cover body is arranged to be spaced apart from an upper surface of the circuit board.

12. The receptacle according to claim 7, wherein
the accommodating hole is enclosed by a hole wall;
an isolating wall is provided on the hole wall;
the isolating wall is arranged to protrude along an axial direction of the accommodating hole; and
the isolating wall is at least partially arranged to face the circuit board along a transverse and/or longitudinal direction of the cover body.

13. The receptacle according to claim 12, wherein
a lower surface of the circuit board is arranged on the housing; and
the isolating wall is protrudingly arranged relative to a lower surface of the circuit board along an axial direction of the accommodating hole.

14. An electric protective cover for a receptacle, comprising:
a cover body that extends along a radial direction of the receptacle and is configured for covering a circuit board, wherein an accommodating hole enclosed by an accommodating hole wall is disposed on the cover body to accommodate a connecting terminal;
a mounting portion disposed on the cover body to be mounted onto a receptacle housing; and
a limiting arm provided on the cover body;
wherein the limiting arm is arranged to be contactable with a seal ring on the housing.

15. The electric protective cover according to claim 14, further comprising:
an isolating wall that protrudes and extends from the cover body along an axial direction of the accommodating hole and is arranged to surround the corresponding connecting terminal.

16. A receptacle, comprising:
a housing;
a circuit board disposed on the housing; and
an electric protective cover comprising:
a cover body that extends along a radial direction of the receptacle and is configured for covering the circuit board, wherein the cover body covers the circuit board, and wherein the cover body is formed with an accommodating hole enclosed by an accommodating hole wall disposed on the cover body to accommodate a connecting terminal; and
a mounting portion disposed on the cover body to be mounted onto a receptacle housing, wherein the mounting portion of the electric protective cover is arranged on the housing;
wherein an isolating wall is provided on the hole wall;
wherein the isolating wall is arranged to protrude along an axial direction of the accommodating hole; and
wherein the isolating wall is at least partially arranged to face the circuit board along a transverse and/or longitudinal direction of the cover body.

17. The receptacle according to claim 16, wherein
a lower surface of the circuit board is arranged on the housing; and
the isolating wall is protrudingly arranged relative to a lower surface of the circuit board along an axial direction of the accommodating hole.

18. The receptacle according to claim 16, wherein
a wire retaining part is provided on the cover body; and
the wire retaining part is configured for retaining a wire.

19. The receptacle according to claim 18, wherein
a limiting arm is provided on the cover body; and
the limiting arm is arranged to be contactable with a seal ring on the housing.

20. The receptacle according to claim 16, wherein
a limiting arm is provided on the cover body; and
the limiting arm is arranged to be contactable with a seal ring on the housing.

* * * * *